(12) United States Patent
Marx et al.

(10) Patent No.: US 8,754,426 B2
(45) Date of Patent: Jun. 17, 2014

(54) LIGHTING DEVICE UTILIZING LIGHT ACTIVE SHEET MATERIAL WITH INTEGRATED LIGHT EMITTING DIODE, DISPOSED IN SEAM AND/OR IN LOW PROFILE APPLICATION

(75) Inventors: Martin J. Marx, Madison, IN (US);
Richard C. Bozich, Canton, MI (US);
Stanley D. Robbins, Deputy, IN (US);
James E. Roberts, Madison, IN (US);
Jennifer M. Ehlers, Madison, IN (US)

(73) Assignee: Grote Industries, LLC, Madison, IN (US)

( * ) Notice: Subject to any disclaimer, the term of this patent is extended or adjusted under 35 U.S.C. 154(b) by 0 days.

(21) Appl. No.: 13/560,758

(22) Filed: Jul. 27, 2012

(65) Prior Publication Data

US 2013/0026504 A1 Jan. 31, 2013

Related U.S. Application Data

(60) Provisional application No. 61/512,272, filed on Jul. 27, 2011.

(51) Int. Cl.
*H01L 33/00* (2010.01)
*H01L 21/00* (2006.01)

(52) U.S. Cl.
USPC ............ 257/88; 257/E27.12; 257/E33.064; 438/27

(58) Field of Classification Search
USPC .............. 257/88, E27.12, E33.064; 438/27
See application file for complete search history.

(56) References Cited

U.S. PATENT DOCUMENTS

| | | | |
|---|---|---|---|
| 5,907,160 A | 5/1999 | Wilson et al. | |
| 7,217,956 B2 | 5/2007 | Daniels et al. | |
| 7,374,315 B2 | 5/2008 | Dorsey et al. | |
| 7,682,034 B2 | 3/2010 | Asvadi et al. | |
| 7,798,548 B2 | 9/2010 | Embach et al. | |
| 7,915,604 B2 | 3/2011 | Shields | |
| 8,162,519 B2 | 4/2012 | Salter et al. | |
| 2008/0079012 A1 | 4/2008 | Grote et al. | |
| 2010/0127636 A1 | 5/2010 | Chang | |

OTHER PUBLICATIONS

The International Search Report and Written Opinion of the International Searching Authority issued Oct. 10, 2012 in corresponding international application No. PCT/US2012/048584.
The International Preliminary Report on Patentability issued by the International Preliminary Examining Authority on Jun. 10, 2013 in the corresponding international application No. PCT/US2012/048584.

*Primary Examiner* — David S Blum
(74) *Attorney, Agent, or Firm* — Posz Law Group, PLC

(57) ABSTRACT

A light source includes a substrate arranged into at least two facing surfaces which form a seam therebetween; and a lighting device with light emitting diode (LED) chips embedded therein in a linear arrangement. The LED chips generate light photons. The lighting device has a first edge and a second edge opposite to the first edge, the light photons within the lighting device that are emitted by the LED chips from a top surface of the LED chips being output from the lighting device at the second edge of the device. The lighting device is sandwiched in the seam between the two facing surfaces, the second edge of the lighting device being exposed when the seam is in an opened position.

23 Claims, 41 Drawing Sheets

LIGHTING DEVICE UTILIZING LIGHT ACTIVE SHEET MATERIAL WITH INTEGRATED LIGHT EMITTING DIODE, DISPOSED IN SEAM AND/OR IN LOW PROFILE APPLICATION

CROSS-REFERENCE TO RELATED APPLICATIONS

This application claims the benefit of U.S. Provisional Application No. 61/512,272 filed Jul. 27, 2011, which is expressly incorporated herein by reference.

TECHNICAL FIELD

The technical field relates in general to light sources, and more specifically to light sources utilizing a transparent and non-transparent light active sheet material, optionally for conveyances.

BACKGROUND

In the vehicle lighting industry, illumination can be achieved through the use of various light sources, all of which require a housing, a substrate, or a body composed of a material through which light can pass. Therefore, conventional lamps for illumination must be mounted in areas that do not restrict vision or light.

This disclosure assumes that the reader has familiarity with U.S. Pat. No. 7,217,956, titled "LIGHT ACTIVE SHEET MATERIAL" sometimes referred to herein as "light sheet" or "light sheet technology," and with US 2008/0079012, titled "ILLUMINATED DEVICES UTILIZING TRANSPARENT LIGHT ACTIVE SHEET MATERIAL WITH INTEGRATED LIGHT EMITTING DIODE (LED), METHODS AND KIT THEREFOR". Each of these is hereby expressly incorporated by reference.

Alternative solutions for a flexible thin light product that can be used as either an edge or flat light product that presently exist include:
- Light pipe—one disadvantage is its non-uniformity around corners
- EL lighting—one disadvantage is EMI concerns created with DC/DC converter
- OLED—one disadvantage is that it can degrade when exposed to humidity and can be difficult to seal from exterior environment.

SUMMARY

Preliminarily, it may be noted that features of various embodiments discussed herein may be combined with other features and/or with other embodiments discussed herein.

First Embodiment

Accordingly, one or more embodiments is a method of providing edge lighting. A lighting device is provided; the lighting device has at least one light emitting diode (LED) chip embedded therein, wherein the at least one LED chip generates light photons. A path of the light photons within the lighting device that are emitted by the at least one LED chip from a top surface of said at least one LED chip, is redirected from a first edge of the lighting device back through the lighting device to a second edge of the lighting device opposite to the first edge, the first edge and the second edge being perpendicular to the top surface of said at least one LED chip. The photons which were redirected from the first edge of the lighting device are transmitted in a path through the second edge of the device and then being output from the lighting device at the second edge of the device.

In one or more embodiments, the lighting device comprises a unitary structure of at least two substrates sandwiching the at least one LED chip.

In another embodiment, a metalized film is provided on the first edge of the lighting device, wherein the metalized film redirects the path of the light photons back emitted from the at least one LED chip back through the lighting device toward the second edge.

In yet another embodiment, a laser cut finish is provided on the first edge of the lighting device, wherein the laser cut finish redirects the path of the light photons emitted from the at least one LED chip back through the lighting device toward the second edge.

In still another embodiment, a laser etch mark is provided on a surface of a substrate forming the lighting device, the laser etch mark being positioned to intercept the light photons emitted from the at least one LED chip toward the surface of the substrate and to couple the intercepted light photons to the second edge of the lighting device. In a further embodiment, a metalized film is provided on a surface of a substrate forming the lighting device, the metalized film being positioned to intercept the light photons emitted from the at least one LED chip toward the surface of the substrate and to couple the intercepted light photons to the second edge of the lighting device.

In yet a further embodiment, a plurality of the lighting devices are provided in one single assembly in a sandwich structure, at least one of the lighting device emitting light in a color different from light emitted by others of the plurality of the lighting devices, each of the lighting devices being individually selectable to provide selectable colored lighting. In still a further embodiment, the second edge of the lighting device has a width of 5 mm or less, wherein light which is output at the second edge and which includes the light photons which were redirected from the first edge of the lighting device provides an appearance of a substantially continuous ribbon of light having a width of 5 mm or less along the second edge. In another embodiment, the lighting device comprises at least one optically transparent electrically conductive substrate that sandwiches the at least one LED chip, the first and second edges being formed on the transparent electrically conductive substrate, the light photons being emitted from the at least one LED chip through the optically transparent electrically conductive substrate.

In still another embodiment, the lighting device includes a transparent light active sheet material, the transparent light active sheet material comprises top and bottom electrically conductive transparent substrates, a pattern of LED chips sandwiched between the electrically conductive transparent substrates, and a non-conductive transparent adhesive material disposed between the top and bottom electrically conductive transparent substrates and the LED chips. The LED chips are preformed before being patterned in the light active sheet material as an unpackaged discrete semiconductor device having an anode p-junction side and a cathode n-junction side. Either of the anode and the cathode side is in electrical communication with one of the electrically conductive transparent substrates, and the other of the anode and the cathode side is in electrical communication with the other of the electrically conductive transparent substrates.

In still a further embodiment, the at least one LED chip is disposed in the lighting device and the second edge to be separated by a predetermined distance, to provide a predetermined brightness and diffused appearance on the second edge.

In another embodiment, the at least one LED chip is a plurality of LED chips that generate the light photons, the plurality of LED chips being linearly disposed in the lighting device parallel to at least one of the first and second edges.

Also, an embodiment is a method of providing a conveyance with edge lighting. Edge lighting is provided. The edge lighting is mounted on the conveyance. The edge lighting is electrically connected to an electrical wiring harness of the conveyance.

In another embodiment, the edge lighting is arranged within a designed gap between trim pieces of the conveyance.

In yet another embodiment, the edge lighting is arranged to bend the second edge of the lighting device to have a radius.

According to another embodiment, there is an edge lighting apparatus. The edge lighting apparatus includes a lighting device with at least one light emitting diode (LED) chip embedded therein, wherein the at least one LED chip generates light photons. A path of the light photons within the lighting device that are emitted by the at least one LED chip from a top surface of said at least one LED chip, being redirected from a first edge of the lighting device back through the lighting device to a second edge of the lighting device opposite to the first edge, the first edge and the second edge being perpendicular to the top surface of said at least one LED chip, the photons which were redirected from the first edge of the lighting device being transmitted in a path through the second edge of the device and then being output from the lighting device at the second edge of the device.

Yet another embodiment is a method of making an edge lighting apparatus. The method includes providing a lighting device with at least one light emitting diode (LED) chip embedded therein, wherein the at least one LED chip generates light photons when powered, the lighting device having a first edge and a second edge which is opposite to the first edge. The method also includes treating at least one of the first edge and the second edge, so that the second edge is more transmissive of the light photons than the first edge, and the first edge redirects a path of the light photons within the lighting device that are emitted by the at least one LED chip from a top surface of said at least one LED chip, from the first edge of the lighting device back through the lighting device to a second edge of the lighting device opposite to the first edge, the first edge and the second edge being perpendicular to the top surface of said at least one LED chip, the photons which were redirected from the first edge of the lighting device being transmitted in a path through the second edge of the device and then being output from the lighting device at the second edge of the device.

Second Embodiment

One or more embodiments provides a dual lighting apparatus. The dual lighting apparatus includes a principal substrate; a first lighting device integrated into a first plane of the principal substrate, the first lighting device having at least one first light emitting diode (LED) chip embedded therein; and a second lighting device integrated into a second plane of the principal substrate, the second lighting device having at least one second light emitting diode (LED) chip embedded therein. The at least one first LED chip emits light photons having a different wavelength than light photons emitted from the at least one second LED chip.

In another embodiment, each of the first and second lighting devices comprises a unitary structure of at least two substrates sandwiching the at least one first or second LED chip.

In still another embodiment, each of the first and second lighting devices comprises at least one optically transparent electrically conductive substrate that sandwiches the at least one first or second LED chip, the light photons being emitted from the at least one first or second LED chip through the optically transparent electrically conductive substrate.

In yet another embodiment, at least one of the first and second lighting devices is a transparent light active sheet material; the transparent light active sheet material comprises top and bottom electrically conductive transparent substrates, a pattern of LED chips sandwiched between the electrically conductive transparent substrates, and a non-conductive transparent adhesive material disposed between the top and bottom electrically conductive transparent substrates and the LED chips; the LED chips are preformed before being patterned in the light active sheet material as an unpackaged discrete semiconductor device having an anode p-junction side and a cathode n-junction side; and either of the anode and the cathode side is in electrical communication with one of the electrically conductive transparent substrates and the other of the anode and the cathode side is in electrical communication with the other of the electrically conductive transparent substrates.

In a further embodiment, the first and second planes of the principal substrate are disposed on opposite sides of the principal substrate.

In still another embodiment, the first and second lighting devices are disposed on different surfaces of a same plane of the principal substrate.

In yet another embodiment, the first and second planes of the principal substrate are disposed on different planes of the principal substrate.

In another embodiment, the first and second lighting devices are configured to be individually selectable to be powered on or off Another embodiment further incorporates a flexible electronic circuit.

Another embodiment is a conveyance with dual lighting, and a method for providing same. The conveyance with dual lighting includes the dual lighting apparatus mounted on the conveyance, the dual lighting apparatus being electrically connected to an electrical wiring harness of the conveyance.

Yet a further embodiment is window with incorporated lighting device. The window includes a lighting apparatus, having: a principal substrate; a lighting device integrated into a plane of the principal substrate, the lighting device having at least one light emitting diode (LED) chip embedded therein; and plural glass substrates that form the window. The lighting apparatus is sandwiched between plural glass substrates that form the window and laminated therebetween.

A method of providing dual lighting is also disclosed. The method includes providing a principal substrate; integrating a first lighting device into a first plane of the principal substrate, the first lighting device having at least one first light emitting diode (LED) chip embedded therein; and integrating a second lighting device integrated into a second plane of the principal substrate, the second lighting device having at least one second light emitting diode (LED) chip embedded therein. The at least one first LED chip emits light photons having a different wavelength than light photons emitted from the at least one second LED chip.

Furthermore, a method of providing a window with incorporated lighting device includes laminating the lighting apparatus, sandwiched between plural glass substrates that form the window.

According to another embodiment, a method of providing a conveyance with low profile integrated lighting includes providing a lighting apparatus, the lighting apparatus comprising a substrate and a lighting device integrated into the substrate, the lighting device having at least one light emitting diode (LED) chip embedded therein, the lighting device further comprising an integrated flexible electronic circuit integrated into the lighting device. The lighting apparatus is mounted on a portion of an interior or exterior surface of the conveyance so that the substrate is substantially parallel to and in continuous contact with the interior or exterior surface of the conveyance, an electrical connection powering the lighting apparatus extending along the interior or exterior surface, and a profile of the lighting apparatus being less than 1 inch.

According to an embodiment, the profile of the lighting apparatus is less than 0.2 inch.

Third Embodiment

According to an embodiment, a light source includes a substrate arranged into at least two facing surfaces which form a seam therebetween; and a lighting device with a plurality of light emitting diode (LED) chips embedded therein in a linear arrangement, wherein the plurality of LED chips generates light photons; the lighting device has a first edge and a second edge opposite to the first edge, the light photons within the lighting device that are emitted by the plurality of LED chips from a top surface of said LED chips being output from the lighting device at the second edge of the device; the lighting device being sandwiched in the seam between the two facing surfaces, the second edge of the lighting device being exposed when the seam is in an opened position. Also provided is a method of making the same.

In another embodiment, the lighting device comprises at least one optically transparent electrically conductive substrate that sandwiches the plurality of LED chips, the second edge being formed on the transparent electrically conductive substrate, the light photons being emitted from the plurality of LED chips through the optically transparent electrically conductive substrate.

In another embodiment, the substrate is a fabric material.

In yet another embodiment, there are included stitches through the lighting device and the substrate that attach the two facing surfaces to form the seam.

In still another embodiment, the substrate is arranged to cover an interior surface of a passenger compartment of a conveyance, the lighting device being disposed to be electrically connected to an electrical wiring harness of the conveyance.

In still another embodiment, the second edge of the lighting device has a width of 5 mm or less, and light which is output at the second edge provides an appearance of a substantially continuous ribbon of light having a width of 5 mm or less along the second edge.

In another embodiment, the plurality of LED chips in the lighting device and the second edge as disposed to be separated by a predetermined distance, to provide a predetermined brightness and diffused appearance on the second edge.

In yet another embodiment, the second edge of the lighting device is disposed linearly along and parallel to the seam.

In still another embodiment, a path of the light photons within the lighting device that are emitted by the plurality of LED chips from the top surface of said LED chips, is redirected from the first edge of the lighting device back through the lighting device to the second edge of the lighting device, the first edge and the second edge being perpendicular to the top surface of said LED chips, the photons which were redirected from the first edge of the lighting device being transmitted in a path through the second edge of the device and then being output from the lighting device at the second edge of the device.

According to an embodiment, the lighting device is a transparent light active sheet material; the transparent light active sheet material comprises top and bottom electrically conductive transparent substrates, a pattern of the plurality of LED chips sandwiched between the electrically conductive transparent substrates, and a non-conductive transparent adhesive material disposed between the top and bottom electrically conductive transparent substrates and the plurality of LED chips; the plurality of LED chips are preformed before being patterned in the light active sheet material as an unpackaged discrete semiconductor device having an anode p-junction side and a cathode n-junction side; and either of the anode and the cathode side is in electrical communication with one of the electrically conductive transparent substrates and the other of the anode and the cathode side is in electrical communication with the other of the electrically conductive transparent substrates.

Another embodiment provides a light source for use in an interior surface of a passenger compartment of a conveyance. The light source includes a lighting device, the lighting device has a plurality of light emitting diode (LED) chips embedded therein, the lighting device further includes an integrated flexible electronic circuit integrated into the lighting device, the lighting device is configured to be mounted on the interior surface of the conveyance, a profile of the lighting device is less than 1 inch, the lighting device comprises a unitary structure of at least first and second substrates sandwiching the plurality of LED chips; and a third substrate, the third substrate is arranged to cover the lighting device on the interior surface of the passenger compartment of the conveyance. The lighting device is disposed to be electrically connected to an electrical wiring harness of the conveyance.

In an embodiment, the third substrate is a fabric material with interwoven conductors.

In another embodiment, the interior surface of the passenger compartment is on a passenger seat of the conveyance.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

BRIEF DESCRIPTION OF THE DRAWINGS

The accompanying figures, drawings and/or photographs, where like reference numerals refer to identical or functionally similar elements and which together with the detailed description below are incorporated in and form part of the specification, serve to further illustrate various exemplary embodiments and to explain various principles and advantages in accordance with the embodiments.

DETAILED DESCRIPTION

Figure 1:
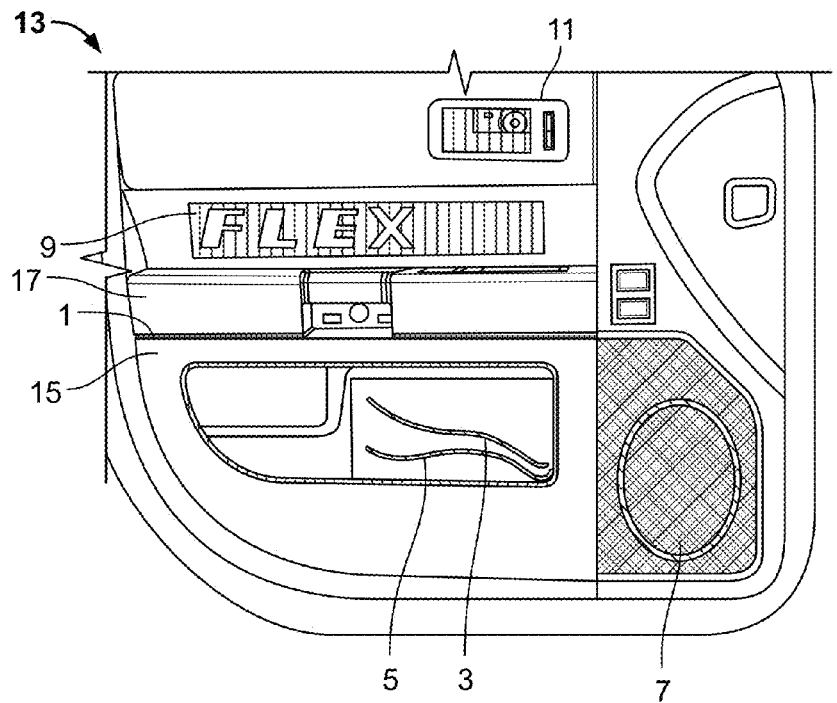
FIG. 1 is a view of edge lighting devices in a vehicle door.

In overview, the present disclosure concerns illuminated devices, homogenous lighting and/or edge lighting utilizing light active sheet material with an integrated light emitting diode (LED), in which light photos emitted from the LED chip(s) are redirected so as to be optically coupled to one edge of the light active sheet material. In the light active sheet material, LED chips are physically and electrically integral to the light active sheet material. Such light active sheet material, sometimes referred to as "light sheet", can be illuminated, thin, flat, flexible, and light weight. The thin characteristic and flexibility of the light sheet can be exploited to provide illuminated devices in various forms for accent, safety, or cosmetic purposes, including without limitation lighting on windows, and other common substrates used in the transportation industry.

More particularly, various inventive concepts and principles are embodied in systems, devices, and methods therein for providing light active sheet material with integrated LED chips, and devices utilizing the same, in connection with a treatment to increase coupling of photons from the LED chips to an edge of the light sheet.

The conveyances of particular interest include automobiles, trucks, motorized vehicles, trains, trailers, air craft, water craft, heavy machinery used for regulated or non-regulated industries such as agricultural, lawn care, mining, snow blowing, and the like, and variants or evolutions thereof.

Non-limiting examples of illuminated devices include interior illumination and exterior illumination such as back-lighting, high mount stop lamp (HMSL), center high mount stop lamp (CHMSL), headlamps, fog lamps, stop/tail/turn (STT) lights, front/park/turn (FPT) lights, dome light, architectural lighting, variants, and the like, optionally used in connection with conveyances, which can optionally be placed on a window.

The present disclosure discusses how to use the unique direct or indirect properties of a transmissive material as a light waveguide to control photons to any side of the device such as, for example the edge. Also discussed is how an edge light or uniform/homogenous light appearance can be generated using a spacer to create a focal length in conjunction with light scattering film on the flat surface of the part.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Overview

A known transparent light active sheet material includes top and bottom electrically conductive substrates in which at least one is transparent, a pattern of light emitting diode (LED) chips sandwiched between the electrically conductive substrates, and a non-conductive transparent adhesive material disposed between the top and bottom electrically conductive substrates and the LED chips. The LED chips are pre-formed before being patterned in the light active sheet material as an unpackaged discrete semiconductor device having an anode p-junction side and a cathode n-junction side. Either of the anode and the cathode side is in electrical communication with one of the electrically conductive substrates and the other of the anode and the cathode side is in electrical communication with the other of the electrically conductive substrates.

A conspicuity solution can be provided with the light sheet technology, as discussed herein, to control photons generated by the LEDs in the light sheet to a predetermined edge of the device, and/or to create a uniform/homogenous appearance such as by controlling focal length.

Referring now to FIG. 1, a view of edge lighting devices in a vehicle door will be discussed and described. A vehicle door 13 is provided with edge lighting devices 1, 3, 5. The vehicle door can be provided with lighting devices 7, 9, 11 including light sheet homogenous properties 7, 9, 11. Edge lighting is looking at the lighting on the edge. The light is emitted in and refracts within an adhesive within the light sheet, and is redirected to be coupled to the edge of the lightsheet in a manner which can provide a thin ribbon of light from the edge of the light sheet.

In FIG. 1, color is indicated by hatching in elements 3, 5, 7, 9 and 11.

The lighting device can be thin, for example <0.02" in thickness, which enables light to be installed in areas never realized before. In addition, the lighting device can be installed in pre-determined gaps that conventionally exist, thus avoiding additional tooling costs that would be required to install a competitive product. As an example, the edge lighting device 1 can be placed within the designed gap between first and second door trim pieces 15, 17, illustrated for example in FIG. 1, so that the edge lighting device 1 is sandwiched between the door trim pieces 15, 17, with an edge from which the light is output being exposed. In this case, the designed gap in the door is created according to specifications for a gap formed between first and second door trim pieces 15, 17 for manufacturing the door.

Similarly, edge lighting devices 3, 5 can be sandwiched in gaps within trim pieces such as the illustrated door pocket.

The edge lighting device 1, 3, 5 can provide additional interior lighting.

Figure 2:
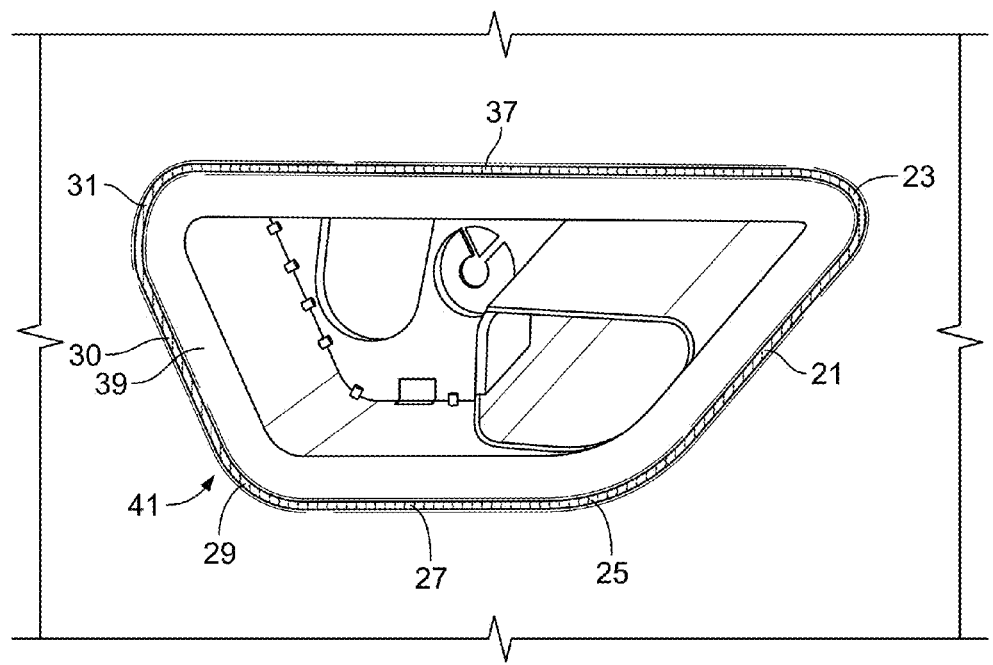
FIG. 2 is a view of a further edge lighting device in a vehicle door.

The edge lighting device can be flexible, and thus can be installed around corners with a radius as low as 1". For instance, the edge lighting device can be installed around the perimeter of a door pocket, such as the "door handle" illustrated for example in FIG. 2 or FIG. 30B. The product can provide a uniform light from the edge or top or bottom surface. Light intensity will not dim around corners compared to other competitive product. FIG. 2 and FIG. 30B are discussed later in more detail.

Figure 37:
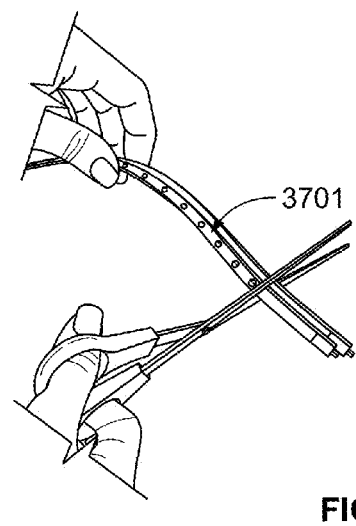
FIG. 37 illustrates cut-to-fit features.

The product can be cut to fit with a pair of scissors, illustrated for example in FIG. 37, or other conventional cutting tool. This allows for easy installation in the field. Referring now to FIG. 37, cut-to-fit features will be discussed and described. As illustrated, an edge lighting device 3701 can be cut to the desired length/shape. This can be done using, for example, standard scissors, automated cutting tool, or the like. The components of the edge lighting device 3701 can be cut by a conventional cutting device.

Edge Lighting Device

Figure 11A:
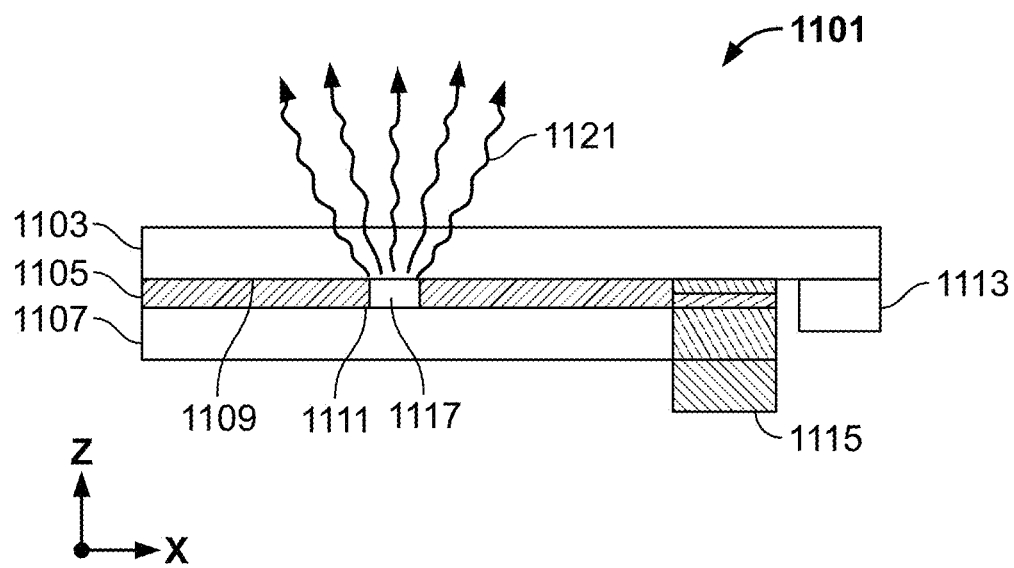
FIG. 11A is a cross sectional view of a light sheet.

An edge lighting device will now be discussed with reference to FIG. 11A showing a basic cross section of a light sheet, and FIG. 11B which shows an edge lighting device to illustrate some distinctions over the configuration of FIG. 11A.

In this description, the following x-y-z directions are utilized for ease of describing relationships of components. A light sheet can generally have a width from edge-to-edge (or a front-back direction) along direction x, a length from left side to right side (or a left-right direction) along direction y, and a top-bottom direction along direction z.

FIG. 11A illustrates construction of relevant portions of a light sheet itself 1101 in more detail. The light sheet 1101 can include a first substrate 1103, a second substrate 1107, an adhesive layer 1105 sandwiched between the first and second substrates, an LED 1117 embedded in the adhesive 1105, first and second ITO layers 1109, 1111 sandwiched between respective first and second substrates 1103, 1107 and the adhesive layer 1105. The first and second substrates 1103, 1107 can be transparent or clear substrates. The first and second substrates 1103, 1107 can be PEN, PET, and/or Polycarbonate. The first and second ITO layers 1109, 1111 can be provided as a coating on the respective first and second substrates 1103, 1107. The first and second substrates 1103, 1107 in combination with the first and second ITO layers 1109, 1111 form top and bottom electrically conductive transparent substrates. The adhesive layer can be a non-conductive transparent adhesive material. The LED 1117 can be one of plural LEDS. The second substrate 1107 does not need to be transparent or clear.

The LED 1117 has a top surface which is perpendicular to a planar surface of the first substrate 1103. When powered, the LED 1117 emits photons 1121 principally from the top surface (sometimes referred to as a "light emitting surface"); because the top surface of the LED 1117 is perpendicular to a planar surface of the first substrate 1103, the light photons 1121 are emitted generally up and through the first substrate 1103 from the LED 1117. The LED 1117 is illustrated with photons being emitted. Also illustrated in FIG. 11A is a first copper bus (+) 1113 and a second copper bus (−) 1115 which power the ITO layers 1109, 1111 and thus power the LED 1117. The LED 1117 is representative of plural LEDs disposed along a left-right direction. The layered structure of the light sheet typically is extended along a front-back direction to include plural LEDs. A total thickness of the light active sheet material 1101 from a top of the first substrate 1103 to a bottom of the second copper bus 1115 can be as small as 0.016 to 0.020 inches. The basic structure of a light active sheet material is disclosed, for example, in U.S. Pat. No. 7,217,956, which is expressly incorporated herein by reference in its entirety.

Figure 11B:
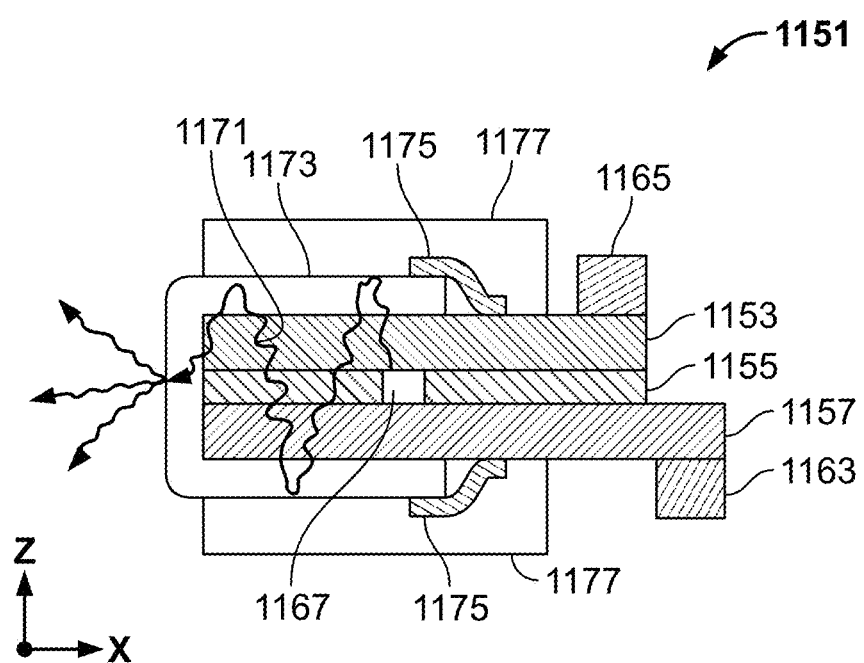
FIG. 11B is a cross sectional view of an edge lighting device.

Reference is now made to FIG. 11B, a cross sectional view of an edge lighting device 1151. The lighting device 1151 can incorporate a first substrate 1153, a second substrate 1157, an adhesive layer 1155 sandwiched between the first and second substrates 1153, 1157, an LED 1167 embedded in the adhesive 1155, first and second ITO layers (not illustrated) sandwiched between respective first and second substrates 1153, 1157 and the adhesive layer 1155. First and second busses 1163, 1165 are connected to a voltage source to power the ITO layers. The first and second substrates 1153, 1157, first and second ITO layers (not illustrated), the LED 1167, and the first and second busses 1163, 1165 can be as discussed in connection with FIG. 11A. The materials 1151, 1153, 1155, 1157 used in the edge lighting device 1151 can be flexible, so that the edge lighting device 1151 is flexible.

When the ITO layers are powered, the LED 1167 emits light photons 1171 from a top surface of the LED chip (sometimes referred to as the "light emitting surface"), the light emitting surface of the LED being parallel to a planar top surface of the first substrate 1153, so that the light photons 1171 are emitted generally toward and through the first substrate 1153 from the LED 1167.

In comparison to FIG. 11A, in this embodiment there are a translucent diffusion film 1173 and a metalized film 1177 layered on the top of the first substrate 1153 and on the bottom of the second substrate 1157 so as to sandwich the first and second substrates 1153, 1157. A top portion of the translucent diffusion film is sandwiched between the metalized film 1177 and the first substrate; a front edge portion of the translucent diffusion film extends around a front edge of the first and second substrates 1153, 1157 with adhesive layer between; and a bottom portion of the translucent diffusion film is sandwiched between the metalized film 1177 and the second substrate 1157. In this illustration, there is provided an adhesive tape 1175 that provides mechanical connection of the translucent diffusion film 1173 to the first and second substrates 1153, 1157. Metalized film 1117 is opaque and the metal surface reflects light back into film 1173 and substrates 1153 and 1157. The metalized film 1117 is formed in top and bottom portions spaced apart so as to expose the front edge (second edge) of the light sheet, so that light photons 1171 can be emitted through the front edge of the light sheet.

In this illustrated embodiment, a right side of FIG. 11B is a first edge (or a back edge), and a left side of FIG. 11B is a second edge (or front edge). The first edge and the second edge can be created by cutting from top to bottom of the sandwiched layers of the first and second substrates 1153 and 1157 and adhesive 1155.

The path of the light photons 1171 emitted from the top surface of the LED chip that have traveled through the first substrate 1153 and the translucent diffusion film 1173 is reflected from the metalized film 1177 so that the path of the light photons 1171 is re-directed back into the first substrate 1153 (through the translucent diffusion film 1173). The path of the light photons then travels in this order, through the first ITO layer (not illustrated), the adhesive 1155, the second ITO layer (not illustrated), the second substrate 1157, and the translucent diffusion film 1173 on the second substrate. The path of the light photons 1171 that traveled through the second substrate 1157 is reflected by the metalized film 1177 on the second substrate 1157, so that the path of the light photons 1171 is re-directed back into the second substrate 1157 (through the translucent diffusion film 1173), and travels through the second ITO layer, the adhesive 1155, the first ITO layer, the first substrate 1153, the translucent diffusion film 1173, and is reflected by the metalized film 1171. This redirection of the path of the photons continues until the light photons are transmitted from a second edge of the lighting device 1151.

The first edge can be treated to reflect light photons back into the first and second substrates and the adhesive 1153, 1155, 1157. The reflection of light photons from the first edge can increase the photons which are emitted from the second edge.

Figure 45:
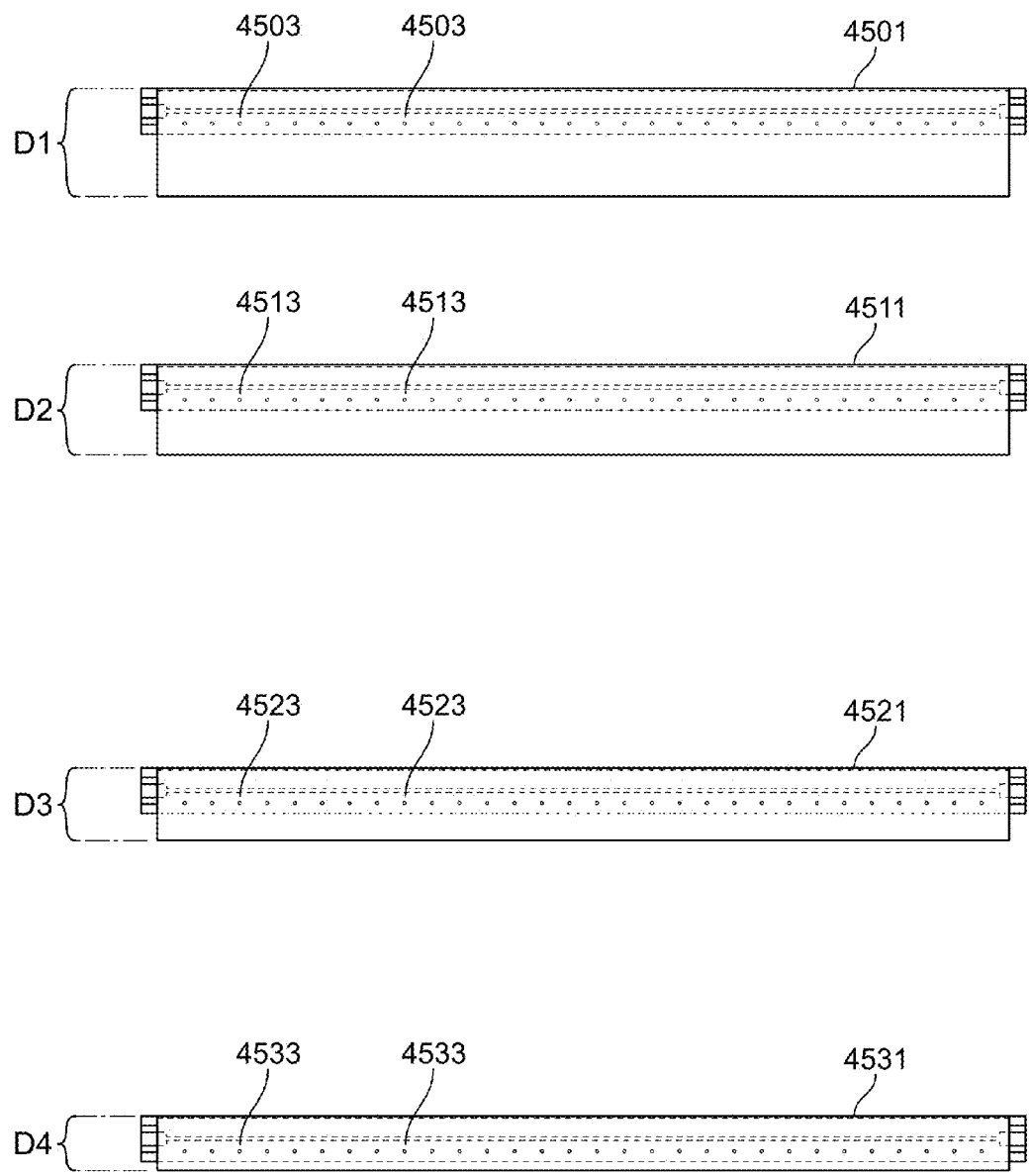
FIG. 45 illustrates varying widths of lighting devices.

The stacked layers of the first and second substrates, adhesive with LEDs embedded therein, first and second ITO layers, translucent diffusion film and metalized film 1153, 1155, 1157, 1173, 1177 extend lengthwise, shown for example in FIG. 45. When the edge lighting device 1151 is powered, the second edge provides a ribbon of light appearance, created by the photons which are emitted from the second edge after being bounced around within the first and second substrates, ITO layers, etc. as described herein.

Because the metalized film 1177 is used as in this illustrated embodiment of FIG. 11B, there is significantly more light emitted from the second edge in comparison to an edge lighting device without the metalized film. The metalized film increases the coupling of the light to the second edge from which the light is emitted.

Method for Creating Edge Lighting Device

To create an edge lighting strip, the following steps can be performed:

1. Provide a light sheet comprising first and second substrates 1153, 1157, ITO layers, adhesive 1155, and LED(s) 1167 embedded in the adhesive.

2. Wrap the translucent diffusion film 1173 around the first edge of light sheet.

3. Adhere the translucent diffusion film 1173 to the light sheet, for example using tape.

4. Peel a backing off the metalized film 1177 and place the metalized film 1177 to be adhered on the top and bottom of the light sheet strip, leaving the second edge without the metalized film so that the second edge of the light sheet strip is exposed and light photons can be emitted from the second edge.

The edge light strip created thereby can be electrically powered in accordance with known techniques or as discussed herein, to provide an edge lighting device.

The benefits include that the light is focused out through the diffusion film 1173 only at the second edge; and the edge lighting device 1151 can flex naturally along top and bottom, along its length.

Edge Conditioning for Edge Lighting Device

A process for providing edge conditioning of the edge lighting device will now be discussed in connection with FIG. 12 to FIG. 15. The nature and quality of a cut performed on the first edge and/or second edge of the light sheet changes the homogenous quality of the light which is emitted from the second edge of the lighting device. Also, the edge conditioning can determine the amount of light extracted from the edge lighting device. In general, a rough cut edge interrupts more light in the transparent material, whereas a smooth cut edge provides a more uniform, lighted appearance. Consequently, a laser cut, smooth edge provides a more uniform appearance while the rough cut edge interrupts normal "light-piping" to increase the opposite edge lighting intensity. A conventional light sheet in an untreated state naturally emits some light out on all sides (edges) when powered on, although the substantial majority of the light is emitted through the top substrate that faces the light emitting top surface of the LED chip. An edge conditioning treatment on the front and/or back edges can enhance light output from one of the edges. For example, one of the edges can be left with the original edge provided when the light sheet is originally manufactured, such as the mechanical cut (left edge 1515 in FIG. 15), for light output; the other edge can be treated to redirect light back into the edge lighting device (right edge 1513 in FIG. 15).

An embodiment can provide the edge conditioning of the substrates in the light sheet which are light transmitting. Options for edge condition include a mechanical shear or a laser cut performed in a top-bottom direction so to cut the edge. A mechanical shear can be included as part of the initial device creation as the substrate is cut from the rolls. The mechanical cut can be a conventional mechanism, such as scissors, rotary cutter, or guillotine cutter; and low operator skills can be required. A laser cut can be performed in a top-bottom direction using known techniques to provide a clean cut through the substrates with a clear finish.

Figure 12:
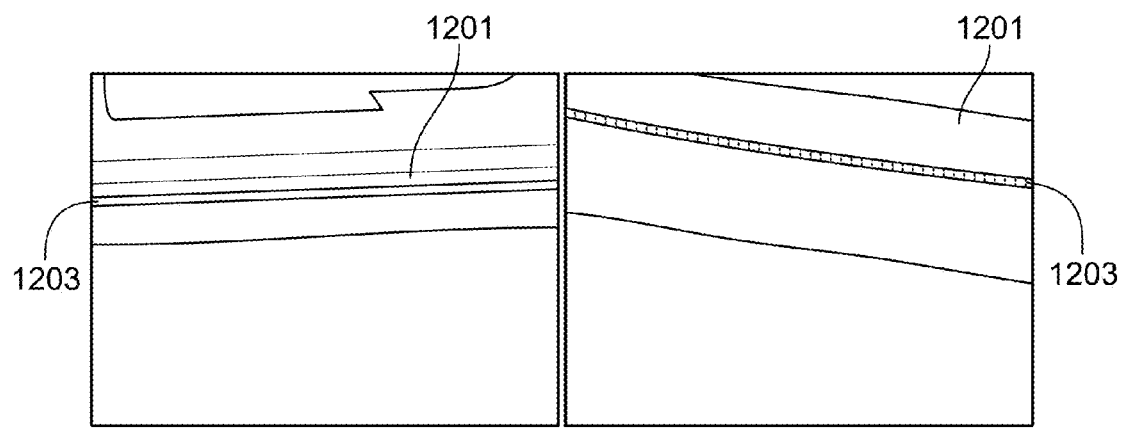
FIG. 12 illustrates a mechanical cut edge (unlit and lit)

In summary, on the second edge through which the light is emitted, a mechanical cut provides more diffusion but less light, whereas a laser cut provides good light transmission but the light is more uniform and not as diffused. FIG. 12 illustrates a mechanical cut edge unlit (left) and lit (right), FIG. 13 illustrates a laser cut edge unlit (left) and lit (right), and FIG. 14 illustrates a comparison between a mechanical vs. laser cut edges, where both are lit.

Referring now to FIG. 12, a mechanical cut edge (unlit and lit) will be discussed and described. FIG. 12 illustrates an edge lighting device 1201 with a mechanical cut edge 1203 which provides the lighting. In the left and right sides of the illustration, the edge lighting device is unlit and lit, respectively.

Figure 13:
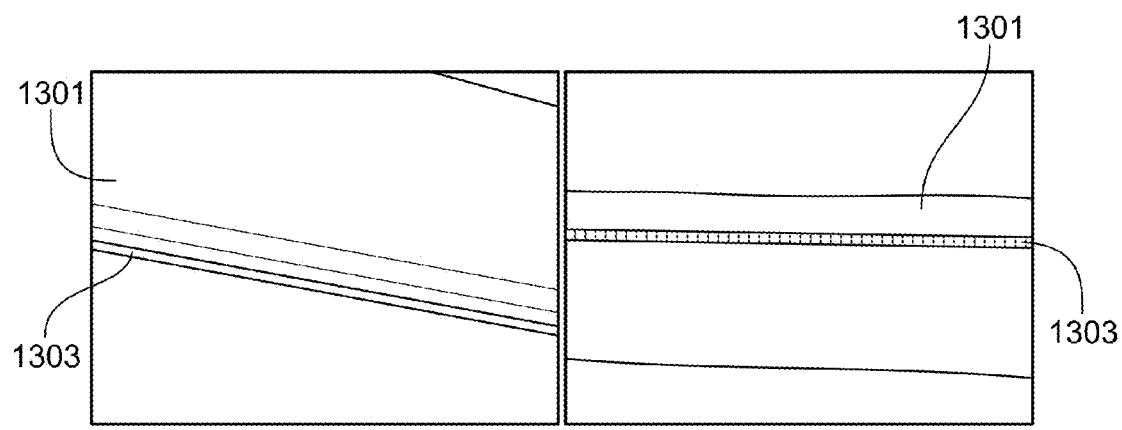
FIG. 13 illustrates a laser cut edge (unlit and lit)

Referring now to FIG. 13, a laser cut edge (unlit and lit) will be discussed and described. FIG. 13 illustrates an edge lighting device 1301 with a laser cut edge 1303 which provides the lighting. In the left and right sides of the illustration, the edge lighting device is unlit and lit, respectively.

Figure 14:
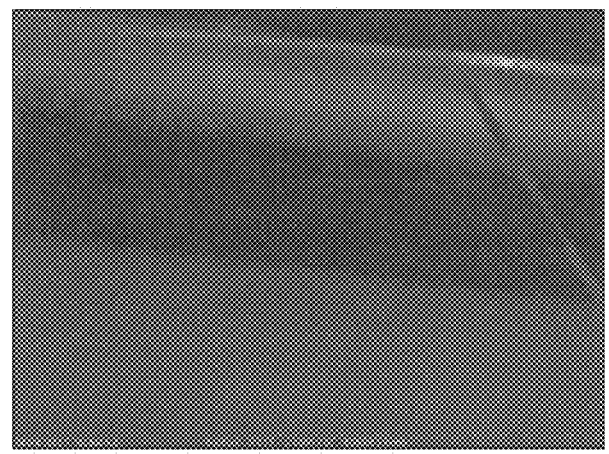
FIG. 14 is a composite illustration comparing a mechanical vs. laser cut edge (lit)

Referring now to FIG. 14, a composite photograph comparing a mechanical vs. laser cut edge (lit) will be discussed and described. The edge which is lit is at the top of the photograph, with the left and rights sides showing a mechanical cut and a laser cut, respectively. With the exception of the edge treatment, the edge lighting device in both cases is the same. The mechanical cut edge (left) shows a more diffuse appearance with less brightness than the laser cut edge (right). In the laser cut edge (right) the brightness can tend to concentrate at a point on the edge which is closer to an LED, thus providing a less diffuse appearance than the mechanical cut edge.

Surface Treatment to Re-Direct Photons

Figure 15:
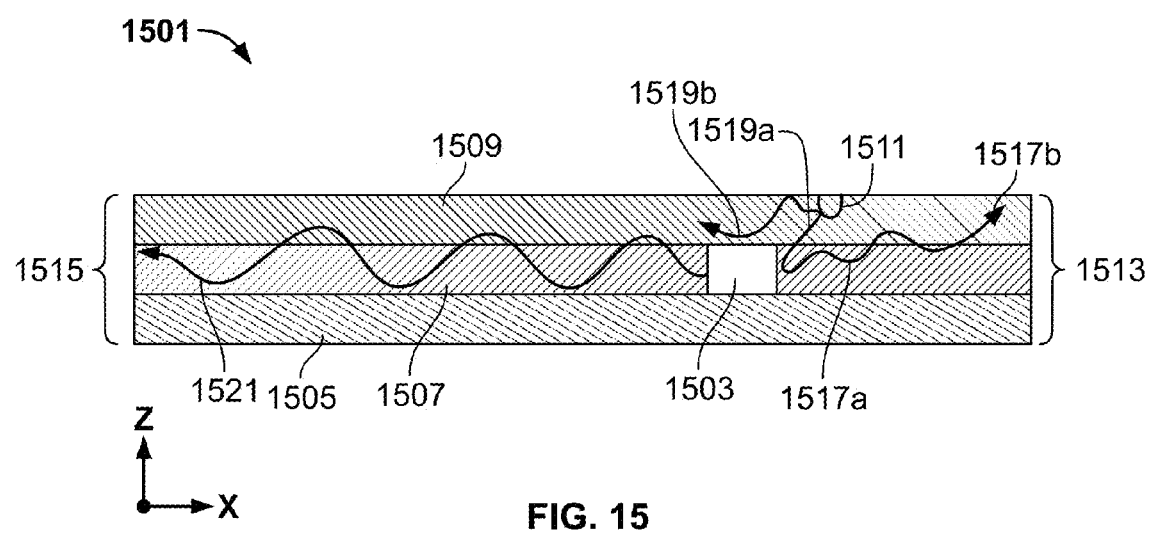
FIG. 15 is a cross sectional view of a laser etch edge.

Referring now to FIG. 15, a cross sectional view of an edge with a laser etch edge conditioning will be discussed and described. In a variation, the photons emitted from the LED can be controlled and directed to various areas within and outside of a lighting device 1501. For instance, an edge light can be provided by an edge lighting device to create a very thin ribbon of light as discussed herein. As illustrated in FIG. 15, in an edge lighting device 1501 discussed herein, using the light sheet top substrate transparent conductor as a light guide, the light can be reflected to redirect the light away from a first edge 1513 to a second edge 1515 of the light sheet strip, and the light is emitted from the second edge 1515. In overview, the edge lighting device 1501 can include a first substrate 1509, a second substrate 1505, an adhesive layer 1507 sandwiched between the first and second substrates 1505, 1509, an LED 1503 embedded in the adhesive layer 1507, first and second ITO layers (not illustrated) sandwiched between respective first and second substrates 1509, 1505 and the adhesive layer 1507. First and second buses (not illustrated) can power the ITO layers. The first and second substrates, first and second ITO layers, the LED, and the first and second buses can be as discussed in connection with FIG. 11A. In a variation, the second substrate 1505 and/or the first substrate 1509 can be a non-transparent (and reflective) conductive layer that reflects the photons emitted from the LED 1503. The reflective substrates contains more photons for the edge lighting creating a more effective light-pipe In this example, a first edge 1513 is left in an untreated natural state or treated in accordance with known techniques to be in a photon reflective state, and a second edge 1515 of the edge lighting edge 1501 is treated with a laser cut edge,. Consequently, the photons emitted from the LED 1503 on a first path 1517A to the first edge 1513 are redirected onto a second path 1517B back through the lighting device toward the second edge 1515. Photons emitted from the LED 1503 on a second path 1521 to the second edge 1515 are emitted from the second edge 1515.

An objective can be to increase the amount of light emitted through the edge of the light sheet strip. A method is as follows. Using a laser, a mark 1511 can be engraved, for example a line or indentation behind the LED 1503 to reflect the light emitted from the LED 1503 back toward the second edge 1515 on the front of the lighting device 1501 which is in the form of a strip. As a result, photons on a third path 1519A from the LED chip 1503 obliquely toward a surface of the first substrate 1509 are intercepted by and reflected off the mark 1511 which was laser etched, on a fourth path 1519B back through the lighting device toward the second edge 1515. It is anticipated that the mark 1511 increases the light being emitted out of the second edge 1515 of the strip. Instead of a laser, another tool appropriate to engrave the substrate can be used to engrave a line behind the die.

In FIG. 15, the left-hand surface (that is, the front edge) is lit, the right hand surface (that is, the back edge) is laser cut. If the first and second edges are left in an untreated state, the light sheet emits light from both edges. The laser etch mark 1511 can enhance the light output on only one edge (in this illustration, the left hand side) and decreases the light output on the opposite edge (in this illustration, the right hand side) by reflecting the photons back into the edge lighting device. The laser etch mark 1511 can also output photons so that the laser etch mark 1511 has an illuminated appearance.

In one variation, the second edge 1515 can be formed as an existing mechanical cut which emits light, which is formed when the sheet of light sheet is mechanically cut to be separated into individual light sheet strips.

In addition to, or as an alternative to, the laser etch mark 1511, one edge can be treated (cut) to allow the light to pass through; the other edge is treated to redirect the light back into the product.

Method of Surface Treatment to Enhance Light Properties

Referring now to FIG. 16A to 16D, cross sectional views of a method to produce an edge lighting device will be discussed and described. In connection with FIG. 16A to 16D, articles and processing methods used to produce various properties will now be discussed relating to applying a film layer on top of the edge lighting device to couple additional light generated by the LED to the second edge, which is the part of the lighting device that is illuminated.

The edge lighting, such as for a door panel, in this example can include the following properties. Examples of color can include white, blue, green, red, and/or amber. For blue, a blue ILED can be used, in some embodiments with a ¼" spacer, die height of 4 mil (0.004 inches), a 3 mil hot melt adhesive, 5 mil PET for bottom and top substrates, optic film and/or a hi reflective metalized film like chrome. An optic film can be, e.g., ¼" in width and 6" in length.

Figure 16A:
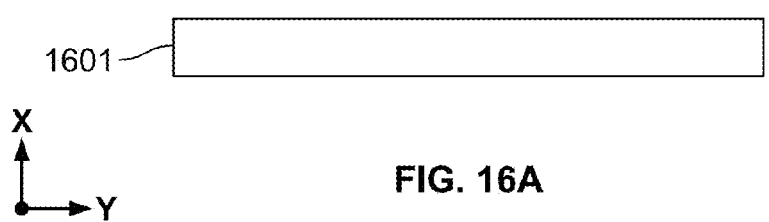
FIG. 16A to 16D are cross sectional views of a method to produce edge lighting.

The outline in FIG. 11B can be further illustrated in FIG. 16A, processing steps for preparing an optic film 1601 (an example of which is a translucent diffusion film) as discussed herein before adding to the lighting device can include (1) providing the optic film in raw form, (2) folding the film length wise in half, and (3) using a laminator to obtain a good crease across the center.

Figure 16B:
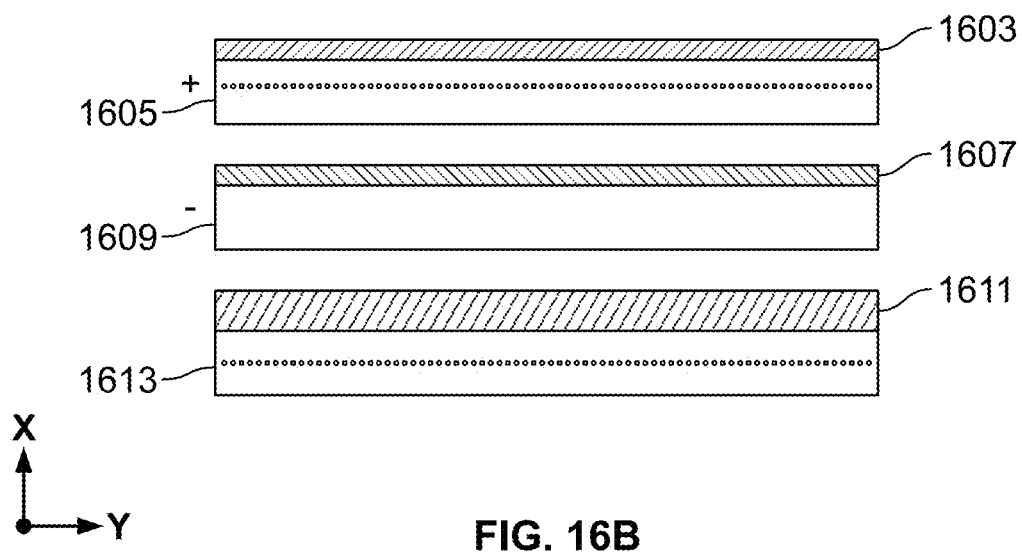

Then, as illustrated in FIG. 16B, (1) a light sheet is prepared to be manufactured for use in the edge lighting device. For example, the light sheet before manufacture is formed in a strip to include a single linear strip of LEDs, spaced apart, for example, 40 LEDs provided on a 10"×0.5" strip. The light sheet prior to manufacture can include bottom substrate 1605 with LEDs embedded therein and a bus tape 1603, and a top substrate 1609 with a bus tape 1607. (2) Then, the top and bottom substrates are laminated together in accordance with known techniques to form a light sheet 1613 with buses 1611 that can be powered on.

Figure 16C:
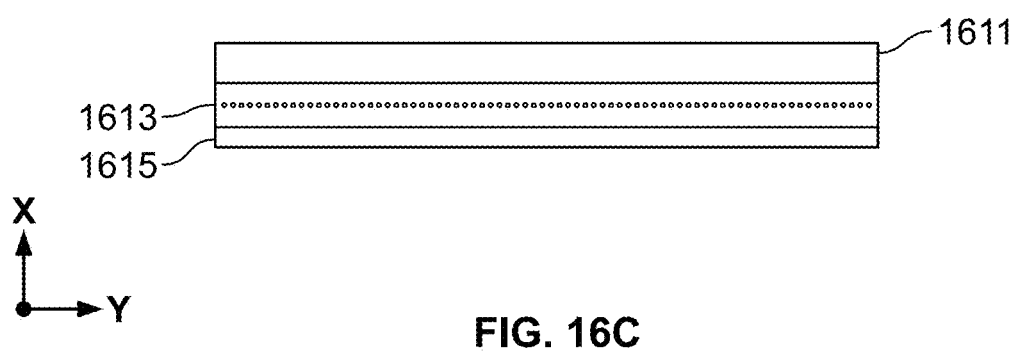

Referring now to FIG. 16C, the prepared optic film is placed along a front edge of the manufactured light sheet, with the creased area adjacent to the buses 1611 edge of the manufactured light sheet 1613, with a flap area of the prepared optic film 1615 each on the top and bottom of the manufactured light sheet.

Figure 16D:
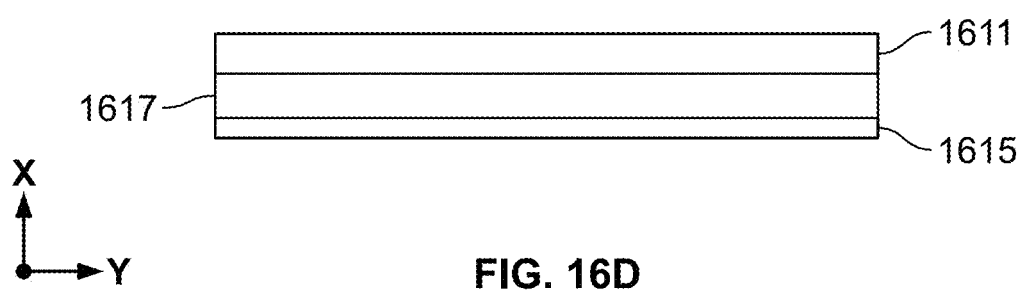

As shown in FIG. 16D, a metalized chrome tape 1617 is then placed on the top and bottom of the light strip. Photons generated by the LEDs in the manufactured light sheet 1613 are reflected off the metalized chrome tape 1617 (which is representative of a metalized film), back into the light sheet 1613, to eventually be directed towards the second edge of the edge lighting device from which the photons are allowed to be emitted.

Such a method as outlined herein can yield a product suited for applications where concealed lighting is required or desired.

Metalized Treatment

Figure 26:
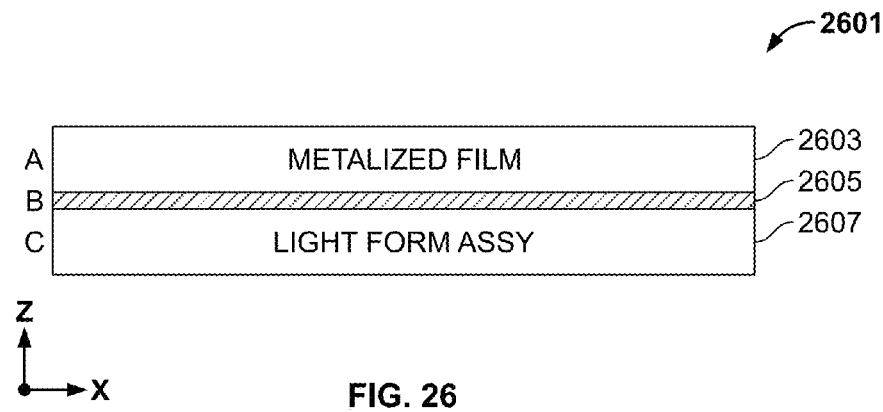
FIG. 26 is a cross sectional view of a concealed lighting example.

FIG. 26 illustrates a cross section of an edge lighting device 2601, suitable, for example, for use in a concealed lighting application. Referring now to FIG. 26, a cross sectional view of a concealed lighting example will be discussed and described. Layer A, layer B, and layer C 2603, 2605, 2607 are sandwiched in this order, and collectively comprise an edge lighting device 2601. Layer A 2603 can be a translucent material such as ink or a metalized film such as chrome that can be applied to a top of Layer C 2607. Layer C is an edge lighting device or uniform lighting device as further discussed herein. Layer A and Layer C 2603, 2607 sandwich Layer B 2605. Layer B is an adhesive film which adheres the metalized film 2603 to Layer C 2607.

As a daytime mode of operation, the light sheet assembly layer C in the lighting device can be un-powered. In the daytime mode, the edge lighting device or uniform lighting device with a metalized film of FIG. 16D has a chrome appearance, with the light concealed by the translucent material. As a night time mode of operation, the light sheet assembly in the lighting device can be powered for a dramatic illuminated appearance. In the night time mode, the uniform lighting device has a lit appearance per the light sheet die pattern. As an example, refer to the FLEX logo 3105, 3135 illustrated in FIG. 31A and FIG. 31B for a day and night time picture of a concealed light with pre-patterned LEDs in the light sheet.

Color Variations

Figure 17:
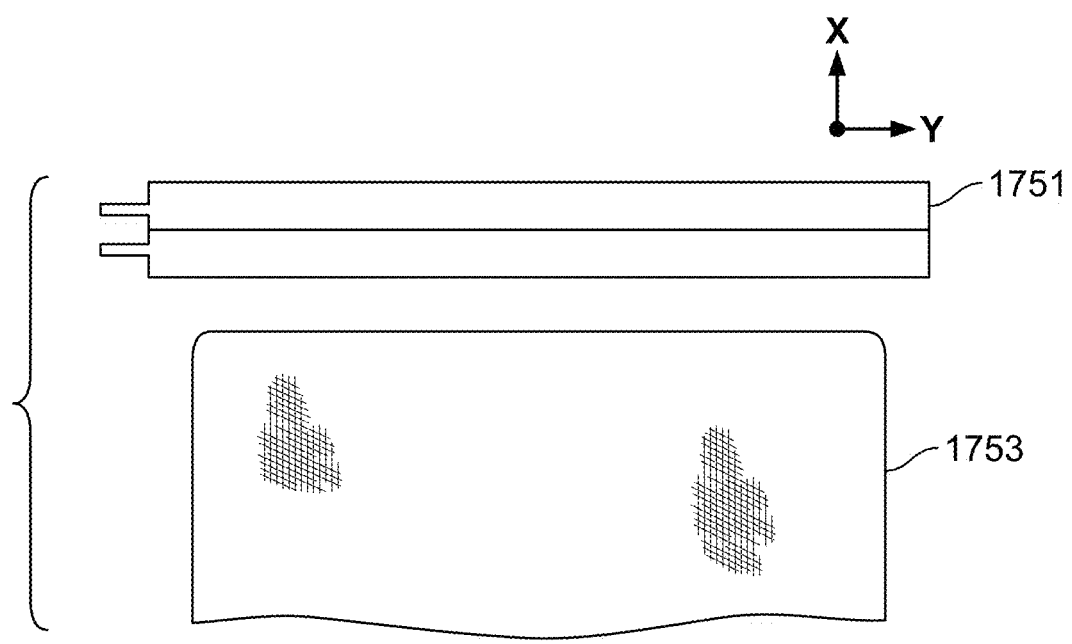
FIG. 17 is an illustration of properties of edge lighting.

Referring now to FIG. 17, illustrations of properties of edge lighting will be discussed and described. Using techniques known to one trained in the art, more than one color of LED can be included where select LEDs in different discrete colors or different color LEDs in combination, can create unique colors. This illustration shows an upper lighting device 1701 and a lower lighting device 1721. In the upper lighting device 1701, there is provided a color mixing amber (A) on a top trace 1703 and a red (R) on a bottom trace 1705. Power can be provided to the lighting device 1701 via power lines 1711, 1709, 1707. When powered, the amber and red colors mix to create orange light output from the lighting device. The lighting device 1701 of this embodiment can have a top substrate width >1.0".

In the lower lighting device 1721, there is provided a color mixing amber (A) on a top trace 1723 and a red (R) on a bottom trace 1725. Power can be provided to the lighting device 1721 via power lines 1731, 1729, 1727. When the top trace and bottom trace 1723, 1725 are powered simultaneously, the amber and red colors mix to create orange light output from the lighting device.

Also, the upper and lower lighting devices 1701, 1721 show the impact which die spacing has on the uniformity and mixing. Hot spots can be reduced when the die are spaced closer together than when the die are spaced further apart.

Fabric Embodiment

Sewing through the lighting device allows for easy attachment to fabric and will not interrupt performance for edge or back lighting. Penetrating the upper and lower layers of the lighting device does not break circuit connections allowing the full function to continue. Also, because of the adhesive used between these two layers, when a puncture occurs, the sealant maintains adhesion and keeps the lighting device environmentally sealed.

Reference is now made to FIG. 17, illustrating that a lighting device 1751 can be sewn on to fabric 1753. The fabric 1753 can be a conventional material. The lighting device 1751 can be stitched to or woven into the fabric using known techniques for attaching fabric, for example, stitching or gluing along a seam, as edging, as decorative treatment, and the like. The die portion of the lighting device 1751 can be positioned away from the stitches so that the LED is not punctured. The lighting device can be very robust to stress/twisting/bending where the fabric is sewn. Potential applications include: seats, headliners, and various clothing type products.

Further discussion is provided herein with regard to various embodiments involving fabric.

Comparative Example—Metalized Film

Figure 18A:
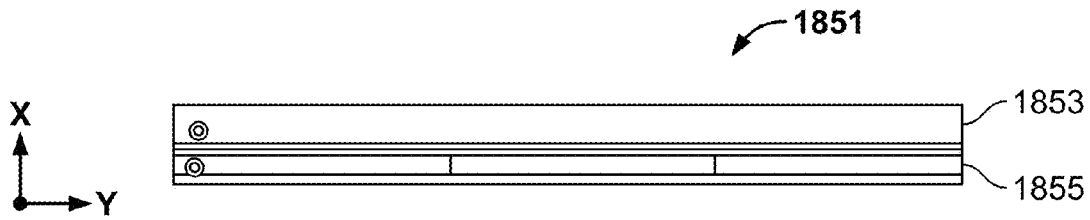
FIG. 18A is an illustration of edge lighting devices of different widths.
Figure 18B:
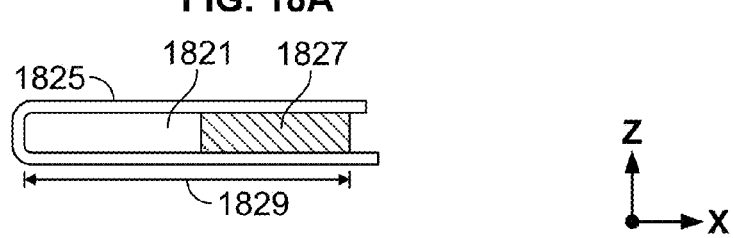
FIG. 18B is comparative illustration with cross sections of edge lighting devices of different widths.

Reference is now made to FIG. 18A and 18B.

Light sheet strips were built on PolyCu, with 0.5" ILED spacing, and top substrate with widths of 1" and 1.5" evaluated for light emitted to the edge. FIG. 18A illustrates samples of the raw product. In FIG. 18A, an edge lighting device 1851 is illustrated from a top-view. The edge lighting device can include a first portion 1853 which is covered by a translucent metalized film, and a second portion 1855 which is covered by a translucent diffusion film. The edge lighting device 1851 can be prepared as discussed in connection with FIG. 11B, for example.

Referring now to FIG. 18B, a comparative illustration of cross sections of edge lighting devices of different widths will be discussed and described. FIG. 18B illustrates putting the chrome film on top and bottom of a wide lighting device and a narrow lighting device. The chrome film 1803, 1825 increases the intensity of the light which is output from the lighting devices. The chrome film 1803 on the wide lighting device has a width 1809 of 1.5 inches. The chrome film 1825 on the narrow lighting device has a width 1829 of 1 inch. In these examples, part of the light sheet 1801, 1821 is covered with the film and at least one edge is not covered. This comparison illustrates that the chrome film 1803, 1825 increases the light intensity, and that the width of the chrome film changes the appearance of the light output from the edge lighting devices. It was observed that the wide lighting device with the wide chrome film 1803, 1805 having a width 1809 of 1.5" provides a more uniform light, whereas in comparison the narrow lighting device with the chrome film 1825 having a width of 1" is more intense but less uniform. In the edge lighting devices, the chrome film 1203, 1825 is folded over a light sheet strip 1801, 1821 to sandwich the chrome film 1803, 1825. In these examples, the light sheet strip 1801, 1821 abuts a fold in the chrome film 1803, 1825. The chrome film 1803, 1825 can be attached to light sheet strips 1801, 1821 utilizing, for example, an adhesive tape (not illustrated). Opposite sides of the chrome film 1803, 1825 which face each other can be adhered using an adhesive 1807, 1829. The adhesive 1807, 1809 can be translucent or transparent.

The wide and narrow edge lighting devices were evaluated and compared using chrome film 1803, 1825 folded over on top and bottom substrates of the light sheet 1801, 1821. The highly reflective chrome film will increase the intensity of light seen at the edge of the edge lighting device. See FIG. 18B. The LED light source (within the light sheet) was more noticeable as a point light source in the narrow lighting device than in the wide lighting device. The edge lighting device with the chrome film was compared to a lighting device without the chrome film; a uniform light was achieved on the edge of the lighting device without the chrome film on top and bottom substrates.

Spacer Variation and/or Angle to Control Intensity and Width

Figure 19A:
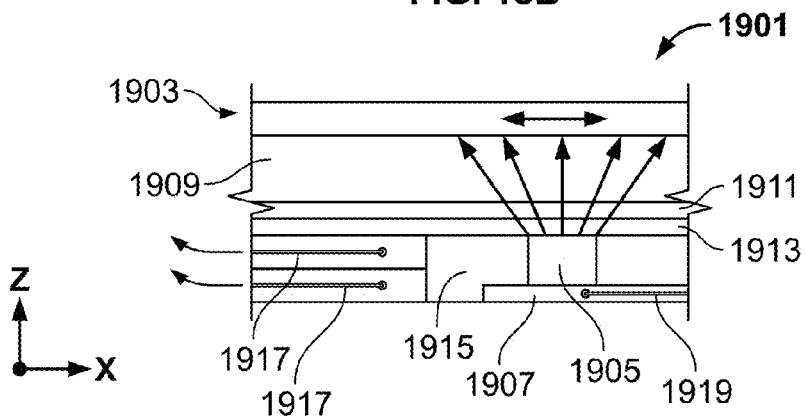
FIG. 19A is a cross sectional view of a portion of an edge lighting device.
Figure 19B:
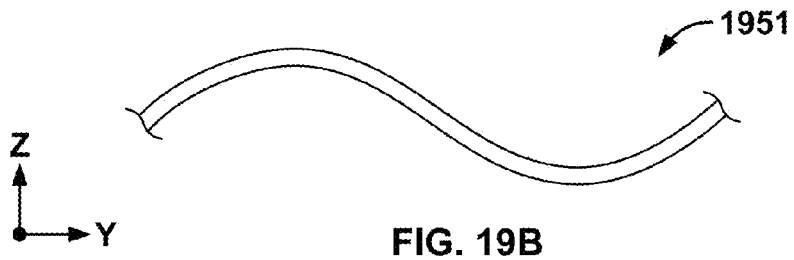
FIG. 19B is a top view of an edge lighting device.

Reference is now made to FIG. 19A and FIG. 19B, in order to explain another method for creating an edge light using a flat edge lighting device 1951. FIG. 19A is a cross section, and FIG. 19B is a top view thereof. This variation is similar to the previously discussed edge lighting device illustrated for example in connection with FIG. 11B, and discussion of similar portions is omitted. In the present embodiment, however, a spacer can be utilized to control a top-to-bottom depth of the edge lighting (when viewed, how thick or narrow the edge lighting appears) and/or a diffusion/intensity of the light emitted from the edge lighting device. Some elements which are discussed elsewhere herein are omitted from the present discussion. Without the spacer, an edge lighting device can provide a very narrow ribbon of light; the spacer can be used to increase the apparent thickness of the ribbon of light.

Figure 5:
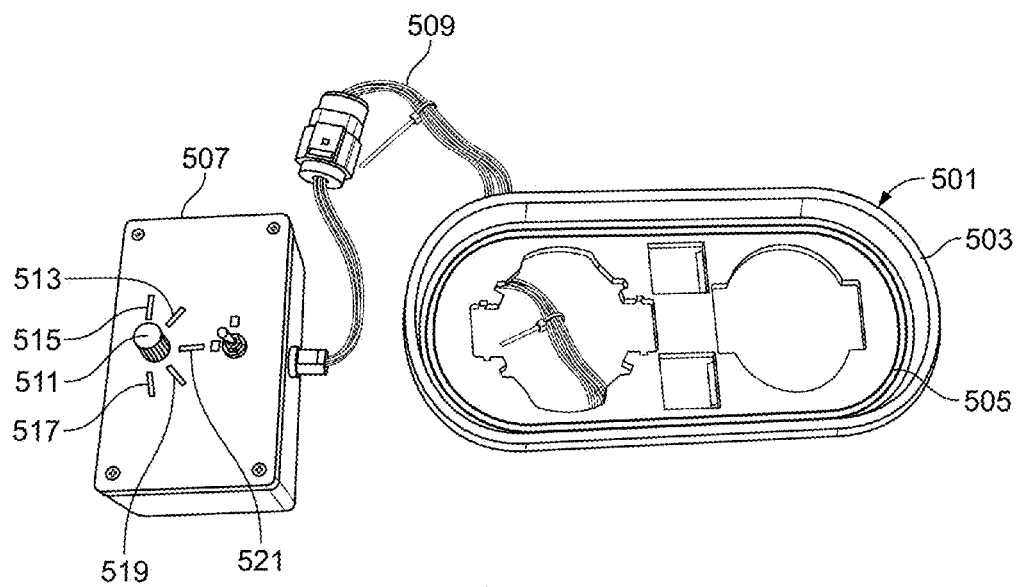
FIG. 5 is a view of an edge lighting device in connection with a charge ring.
Figure 6:
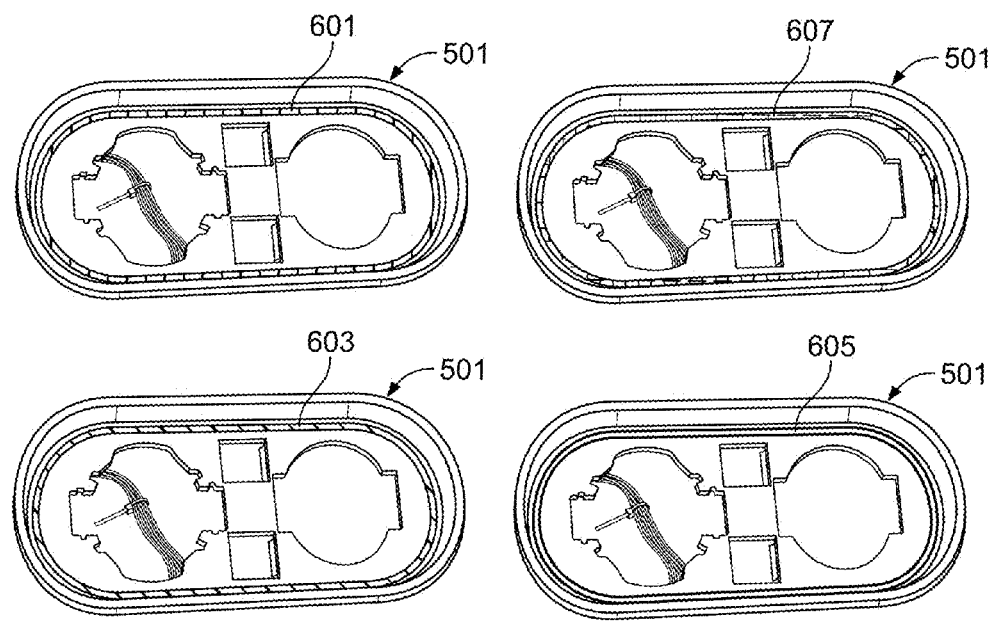
FIG. 6 is another view of an edge lighting device in connection with a charge ring.

Referring to FIG. 19A, a cross section view of an edge lighting device will be discussed and described. An edge lighting device 1901 can include an enhancement film 1903, plural LEDs (here represented by LED 1905), a first conductive trace 1907, a spacer 1909, a top diffusion film 1911, a top electronically conductive substrate 1913, an adhesive 1915 into which the LED 1905 is embedded, and second conductive traces 1917. The spacer 1909 can provide a uniform intensity and a thicker edge light in comparison to a lighting device without a spacer. The spacer 1909 can be formed of an acrylic film. If the acrylic film, as well as other layers in the edge lighting device 1901, is flexible, the edge lighting device has a flexible property. By using an acrylic film spacer between a light sheet and the enhancement film, a thicker edge light is provided. An example use of the device of FIG. 19A is illustrated in FIG. 5 and FIG. 6, in which the desired width of the edge lighting device has been achieved by use of a spacer to expand a width of the edge light.

n a variation, the light output can be at an angle so that the edge lighting device does not have to be on edge. That is, the edge may be cut at an angle other than at a right angle to the top or bottom of the transparent surface to increase width of the "ribbon of light".

Referring now to FIG. 19B, a top view of the edge lighting device will be discussed and described. The edge light which is produced from the edge lighting device 1951 can be thin, for example, less than 0.025 in width. Furthermore, the light which is produced from the edge lighting device 1951 can have a uniform light around the corners, because the light is produced from the LEDs which are uniformly spaced apart from a nearest portion of the surface of the front edge (i.e. the edge which is illuminated), regardless of the bending of the edge lighting device. The edge lighting device 1951 can be formed of flexible or semi-flexible materials if desired, instead of being formed of rigid. The thickness of appearance of different edge lighting devices can be varied as desired, based on focal length, die pattern, and enhancement film used.

Lighting Applications

The lighting devices discussed herein can be used in connection with various applications. The principles of the lighting devices for various lighting applications can be ascertained with reference to the following examples of applications in which the edge lighting technology or the uniform lighting device using the light sheet can be used: Car Door (FIG. 1, FIG. 2), Console (FIG. 3), Cup Holder Edge Lighting (FIG. 4), and charge ring with edge light (FIG. 5, FIG. 6). FIG. 1 was discussed in more detail above. FIG. 2 to FIG. 6 are now discussed in more detail below.

Referring now to FIG. 2, a view of an edge lighting device in a vehicle door will be discussed and described. FIG. 2 illustrates an edge lighting device with some sharp corners. Here, the edge lighting device has a generally polygonal shape, in which rounded corners 23, 25, 29, 31 are spaced apart by straight portions 21, 27, 30, 37. Here, two of the corners 23, 31 are generally at an acute angle, and two other corners 25, 29 are generally at an obtuse angle. The illumination of the edge lighting device is distributed evenly throughout the light edge. The edge lighting device is disposed to be sandwiched in a gap which is normally formed between two or more pre-formed pieces of automotive molding 39, 41 in a car door.

In FIG. 2, color is indicated by hatching in element 41.

Figure 3:
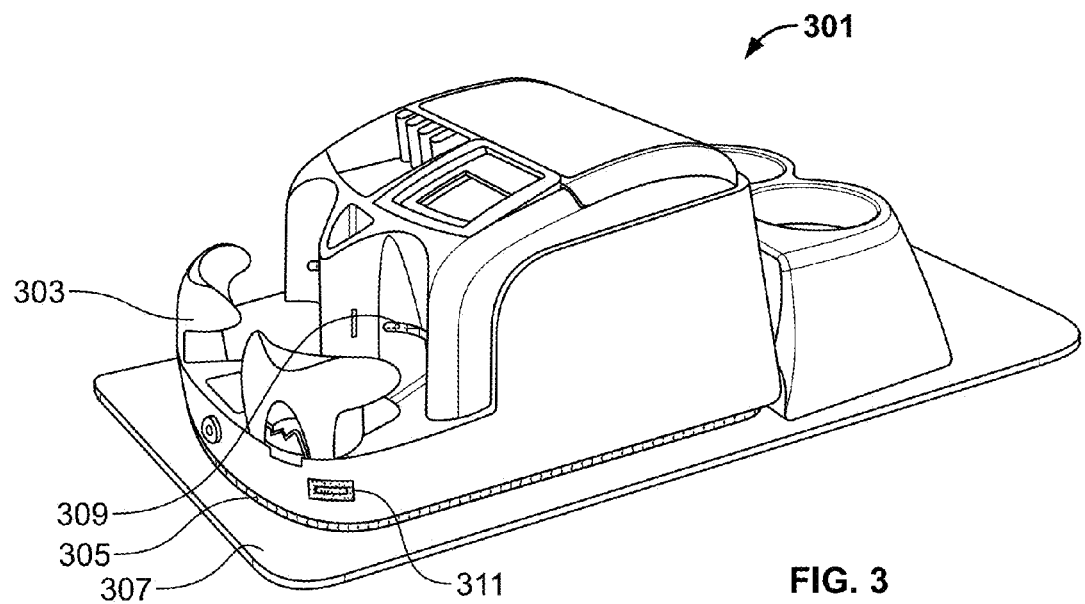
FIG. 3 is a view of an edge lighting device in connection with a console.

Referring now to FIG. 3, a view of an edge lighting device in connection with a console will be discussed and described. A console 301 for use in an automotive device is arranged to include edge lighting devices sandwiched within various gaps molded into the console 301. In this example, the edge lighting devices include first and second edge lighting devices 303, 309 disposed in an interior of cup holders in the console 301; a console base edge lighting device 305 disposed along an edge at the base of the console 301, at a preformed gap between the console 301 and a base 307 on which the console sits.

A lighting device 311 can also be positioned at a corner of the console 301 to provide additional lighting within the automobile.

In FIG. 3, color is indicated by hatching in element 403.

Figure 4:
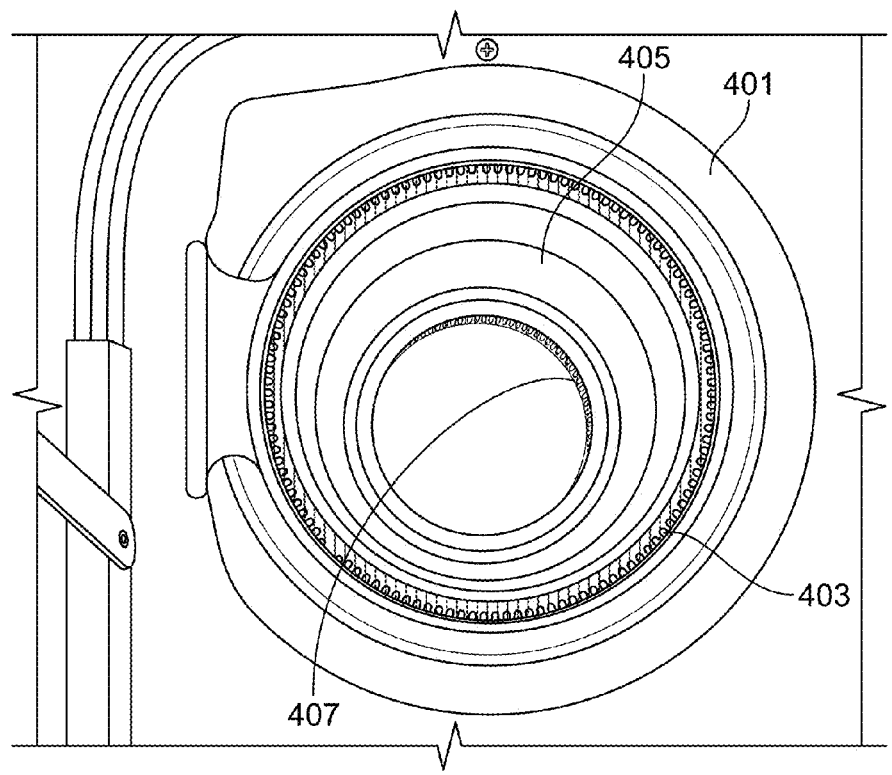
FIG. 4 is view of an edge lighting device in connection with a cup holder.

Referring now to FIG. 4, a view of an edge lighting device in connection with a cup holder will be discussed and described. A first edge lighting device 403 is disposed in the gap between a pre-formed cup holder insert 405 and a body of a cup holder 401. Optionally, a second edge lighting device 407 can be disposed in a gap formed between the cup holder insert 405 and bottom of the cup holder insert.

FIGS. 5 and 6 are an example of a stacked edge lighting, in which edge lighting of different colors is stacked to achieve different selectable colors. FIG. 5 illustrates a device with a single discrete light sheet formed from stacked light sheets which each have a different color from each other, and FIG. 6 illustrate the selective lighting of one sheet of the stacked sheets in the lighting device.

Referring now to FIG. 5, a view of an edge lighting device in connection with a charge ring will be discussed and described. A composite lighting device 501 comprises a lighting body 503 and an edge lighting device 505 disposed within a gap formed in the lighting body 503 and positioned so that the edge light is displayed to a user. In this composite lighting device 501, the edge lighting device 505 comprises plural light sheets. Each of the light sheets within the edge lighting device 505 includes LEDs of respective different colors. In this example, the four light sheets are stacked, one with white LEDs, one with yellow LEDs, one with red LEDs and one with green LED. White is obtained by using high energy blue LEDs behind a yellow phosphor overlay. The energy of the blue LEDs excite the phosphor producing photons and the color combination of blue & yellow phosphor produces the white light. The edge lighting can be stacked to achieve selectable different colors. Alternatively, a discrete light sheet of a combination of colors, e.g., yellow and red, can be put together. FIG. 5 illustrates a selection device 507 which provides individually selectable power on/off to each of the light sheets in the edge lighting device 503. The selection device 507 can include a selection control 511 for each respective color 513, 515, 517, 519 or power all on 521. It should be noted in this embodiment that the composite lighting device 501 is configured as a charge port.

Referring now to FIG. 6, another view of an edge lighting device in connection with a charge ring will be discussed and described. In FIG. 6, the same composite lighting device 501 is shown with each different light sheet separately illuminated. By selectively powering on or off a light sheet with color LEDs, an edge lighting device can be switched between modes in which it appears as a red color edge lighting device 601, a green color edge lighting device 603, a white color edge lighting device 605, and a yellow color edge lighting device 607. The color is indicated by hatching in the respective designs. The composite lighting device 501 can be powered off, in which case there is no illumination.

Features and Benefits

Although features and possible benefits have been discussed elsewhere in this document, the following can be noted.

Thickness: the edge lighting device can have an overall thickness from top to bottom which can be less than 0.02", which enables the emitted light to be of comparable thickness. The edge lighting device can be installed into spaces/gaps that were designed to account for tolerances in the mounting product.

Flexible: a sample edge lighting device was mounted as a straight or curved styling feature at radiuses at least down to 1".

Light weight: a sample size of 10"×0.5"×0.025" was created with a weight of <10 grams Customized Single and Multi-color: An edge lighting device can have stacked light sheets to create individually controlled lighting or on the same substrate to enable color mixing.

Uniform lighting: Even lighting with a uniform and homogenous appearance on the lit surface around corners and straight edges was achieved System Flexible design:
DC Voltage Drive
No EMI concerns
Dimmable with simple constant current or analog control
No ballast or high frequency waveform required
No IR or UV radiation for products emitting light in the visible spectrum
Reliability:
No wire bond. Wire bond can lead to electrical over stress (EOS) type failure modes in packaged ILEDs
No organic material degradation concerns as seen with OLEDs
Can be sealed from water penetration or from exterior environment via potting or overlays.
One solid part with no moving parts—eliminate squeak and rattle issues
Opaque/Transparency Variation—Finding #1
The edge lighting device or uniform lighting device can be transparent on one of the top and bottoms sides, and the other of the top and bottoms sides can be opaque or transparent. An example of a product that is opaque when un-powered is a Center High Mount Stop Lamp (CHMSL).

The light sheet device/method used to make it can have at least one optically transparent electrically conductive film, as used herein.

Ambient Condition Variation—Finding #2

Figure 20A:
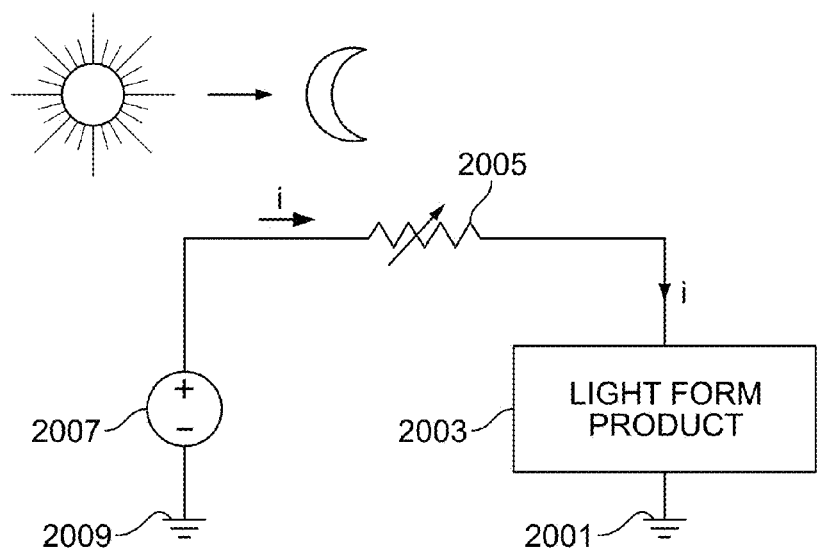
FIG. 20A illustrates features of a smart CHMSL (center high mount stop lamp)

The device/method can provide an ability to have a smart light based on ambient conditions. This can be realized by selecting different pattern die or reducing the intensity. FIG. 20A shows some features of a smart light.

Referring now to FIG. 20A, features of a smart light will be discussed and described. A light is an example of a device, based on a light sheet, which can be provided with an ambient sensor such as one in which resistance changes with incident light. Incident light i can provide a current that varies with resistance and change due to the ambient light condition. The variation in incident light directly relates to the lumens or candela output from a light sheet product 2003 in this embodiment. A light sheet product 2003 formed of a light sheet can receive a DC voltage 2007 via a variable resistor 2005 that changes resistance according to incident light, in accordance with known techniques. The output current 2001 varies according to the incident light.

Homogeneous/Uniform Lighting Device—Finding #3

A method and device for creating a homogenous/uniform light source, including uniformity of light around corners, is now discussed in particular. A homogeneous/uniform lighting device is sometimes referred to herein as a "homogeneous light source" or "homogeneous lighting device" or "uniform lighting device" or "homogenous/uniform lighting device". The homogeneous appearance is a major, desired appearance goal of many lighting product customers and is often difficult to achieve in LED lighting luminaires.

Figure 20B:
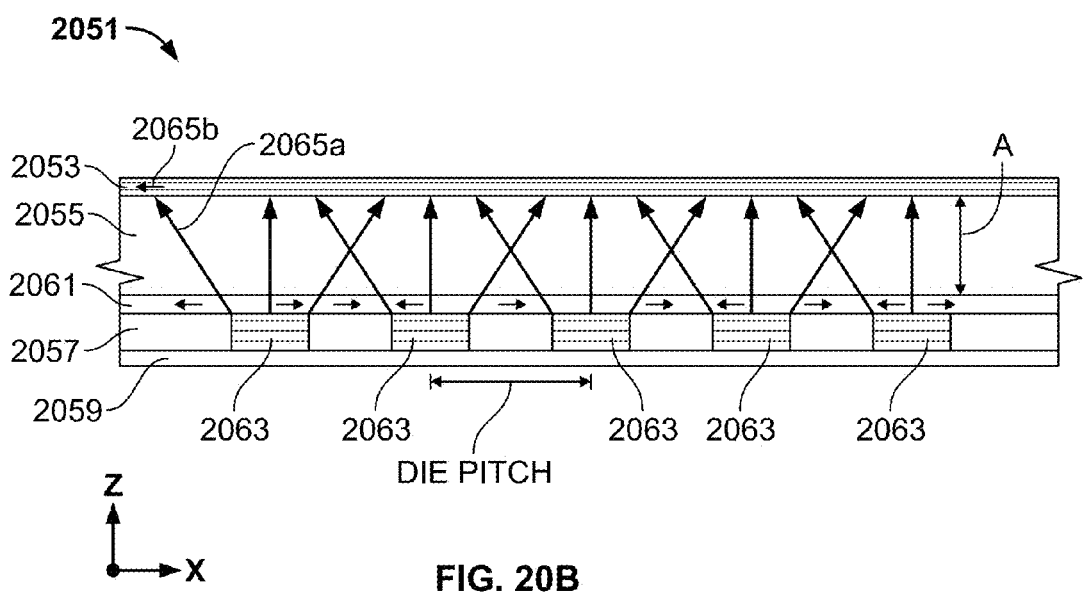
FIG. 20B is a cross section of a homogenous light source.

Referring now to FIG. 20B a cross section of a homogeneous light source will be discussed and described. A homogenous light source 2051 can include a light enhancing or diffusing film 2053, a spacer or air gap 2055, a transparent electrically conductive top substrate 2061, a plurality of LEDs 2063 embedded in an adhesive layer 2057, and an electrically conductive bottom substrate 2059. Multiple light rays such as 2065a are emitted from each of the LEDs 2063 and travel through spacer or air gap 2055 and will be controlled by the light enhancing or diffusing film. The spacer or air gap 2055 provides the "focal length" to enable the light enhancing films to function. Some of the light rays emitted from the LED are diffused into the transparent electrically conductive top substrate 2061 and are directed to the first and second edges of the top substrate 2061 as discussed previously.

A homogeneous light can be created with a die pitch as measured from center to center of adjacent LEDs 2063 is >2× spacer width A between the light enhancing or scattering diffusing film 2053 and the transparent electrically conductive top substrate 2061.

The intensity of the light can be adjusted manually or automatically. This illustration shows how a homogeneous light can be created from a device based on a light sheet.

Figure 21A:
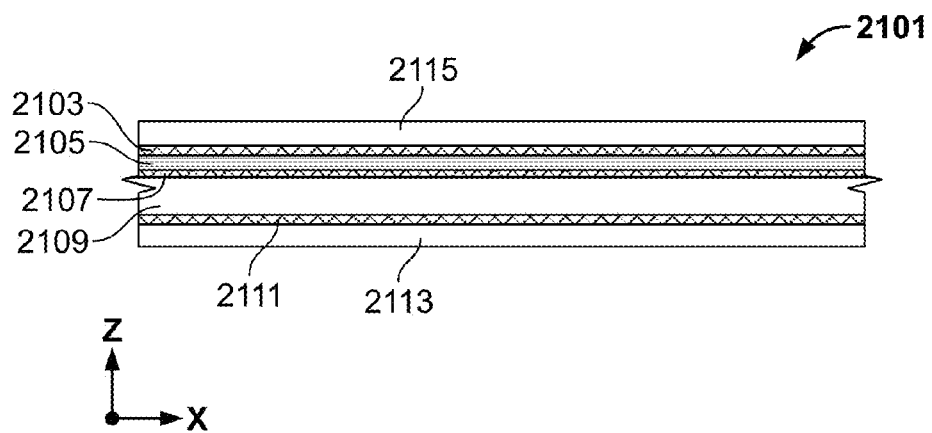
FIG. 21A is a cross section of a homogenous/uniform light source.
Figure 21B:
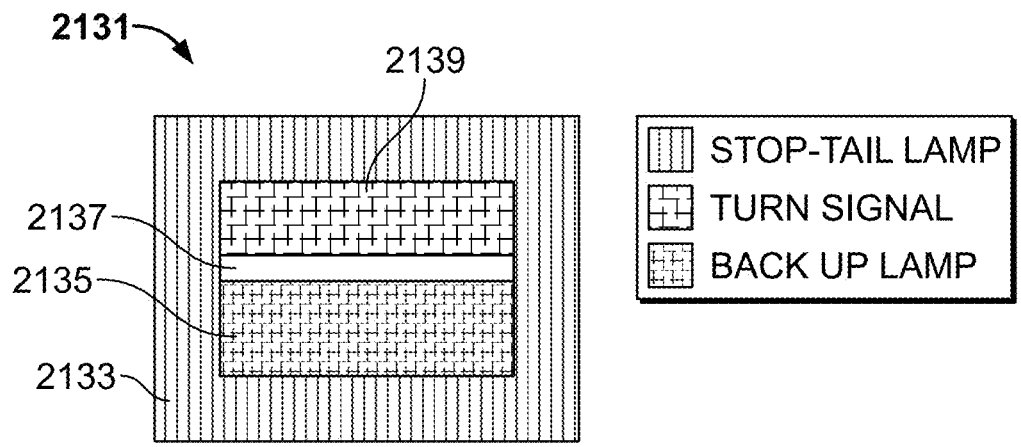
FIG. 21B is a rear view of a lamp in which the cross-section material of FIG. 21A is used.
Figure 21C:
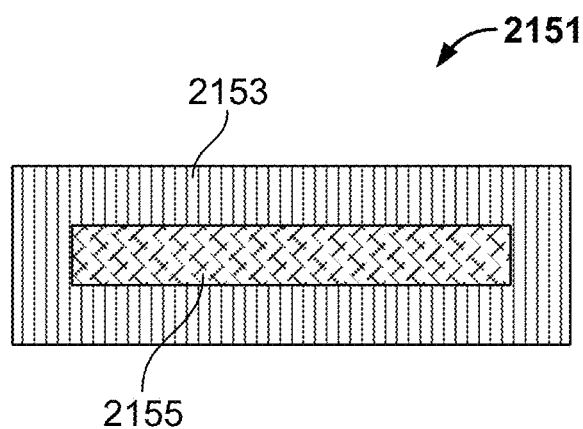
FIG. 21C is another rear view of a different lamp in which the cross-section material of FIG. 21A is used.

An example of a homogenous lighting device, and one method to create a homogenous/uniform light is illustrated in FIG. 21A, FIG. 21B, and FIG. 21C. These figures will now be discussed. Referring to FIG. 21A, the cross section shows, in order from the top down, (1) a lens (optional) such as an acrylic or polycarbonate lens 2115, (2) a first adhesive layer, such as a tape or adhesive 2103, (3) a light diffusing and/or enhancing film 2105, (4) a second adhesive layer, such as a tape or adhesive 2107, (5) a transparent spacer (such as an acrylic spacer 2109 or an airgap, adjusted to a pre-determined focal length, (6) a third adhesive layer, such as a tape or adhesive 2111, and (7) a light sheet layer 2113. Here, LEDs in combination with the materials depicted in FIG. 21A are used to create a uniform light with a very thin thickness. The "light sheet layer" can be made according to known techniques, for example, as disclosed in US 2008/0079012, and variations thereof, as the so-called "light sheet layer". The combination of these thicknesses and the type of diffusing and/or/enhancing film and the focal length provides a homogenous look, as illustrated for example in FIG. 20B. Other methods using different combinations and material thicknesses can be used to create a homogenous/uniform light as well. For instance additional layers of diffusing/enhancing films in combination with different spacer thicknesses. Furthermore, light that leaks out the sides of the clear spacer can be absorbed or re-directed back into the lighting device by using opaque or highly reflective material respectively.

Hatching is used to indicate colors in FIG. 21A-21C, for the stop-tail lamp, turn signal and back up lamp.

Reference is now made to FIG. 21B, a rear view of a tail lamp and FIG. 21C, a rear view of another tail lamp, in which the cross-section material of FIG. 21A is used. The phrase "rear view" refers to the view from a rear toward the front of an automobile in which the tail lamp may be installed. The acrylic (or other clear plastic material) spacer relates to a focal length. The depth of the spacer can be determined using known techniques to achieve the desired focal length. By adding the layers onto the light sheet, a particular visual effect can be obtained. The focal length can improve performance and appearance. If the film was directly applied to the conventional light sheet it would not be homogenous, in comparison to adding the spacer to achieve the focal length necessary for a homogenous/uniform light.

Referring now to FIG. 21B, a rear view of a lamp in which the cross-section material of FIG. 21A is used will be discussed and described. FIG. 21B is an example of an integrated lamp 2131, such as an integrated stop - tail, turn (red or amber) or back up. Amber, red, and white ILEDs were distributed in pre-formed first, second, and third different color sections 2133, 2135, 2139, and were die bonded onto the same bottom substrate to create the light sheet, for example, to meet FMVSS or other countries' equivalent regulatory requirements. The manufacture of the light sheet with the pre-formed first, second and third different color sections can be completed according to known techniques. An acrylic spacer, lens, and the like as discussed in connection with, e.g., FIG. 21A can be layered onto the light sheet with the pre-formed first, second and third different color sections to form a single unitary light in which all layers are edge-to-edge unitary substrates. This can yield a uniform tail lamp with a thickness down to ~5 mm or 0.2". The cross section (see FIG. 21A) can be applicable for all uniform light sheet products as disclosed herein.

In FIG. 21B, red, amber and white LEDs were used in conjunction with spacers and light enhancing film.

Referring now to FIG. 21C, a rear view of another lamp in which the cross-section material of FIG. 21A is used will be discussed and described. FIG. 21C is a rear view of a tail lamp 2151 in which a uniform light is achieved around the corners.

The uniform light can have a width that can vary based on the die pattern and enhancement film used. In operation, photons emitted from the die embedded in the light sheet substrate material emit light in a Lambertian pattern obtaining a half angle at ±60°. When the photons reach the surface of the enhancement film, which has a ±40° spread in both the horizontal and vertical axis, maximum performance for light output is achieved at a predetermined focal length and die pattern. In this example, the light sheet was manufactured with a pre-formed pattern of LEDs in first and second different colors 2153, 2155.

Figure 20C:
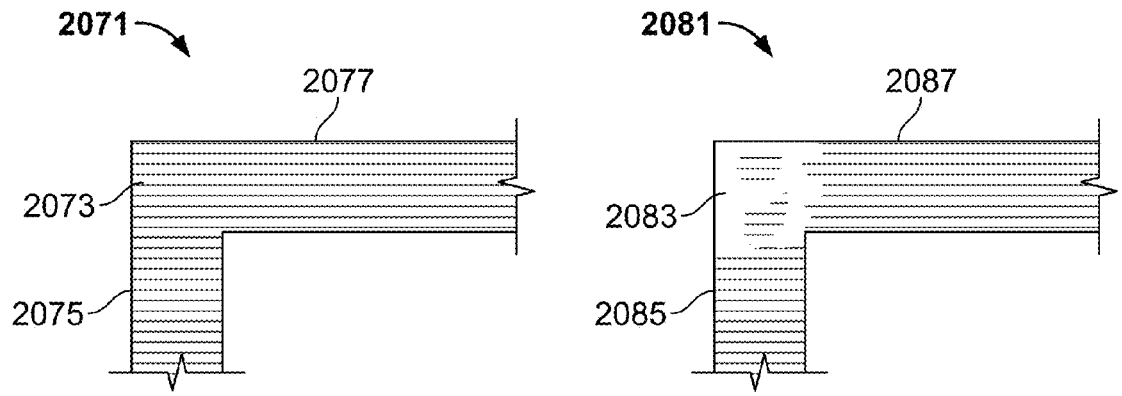
FIG. 20C is a comparative illustration comparing a uniform light around corners and a non-uniform light around corners.

Referring now to FIG. 20C, a uniform light around corners will be discussed and described. FIG. 20C illustrates that a uniform light can be realized around corners, which is not achievable using light pipe type technology. As shown, in the homogenous lighting device 2071 discussed herein (on the left side of the figure), there is a uniform light, including around the corner 2073 which has a same lighting distribution and intensity as in perpendicularly arranged legs 2075, 2077. In comparison, using conventional light pipe device 2081 (illustrated on the right of FIG. 20C), the light is not uniform and is not evenly distributed at a corner 2083 in comparison to non-corner portions such as legs 2085 and 2087 which are perpendicularly arranged.

Figure 41A:
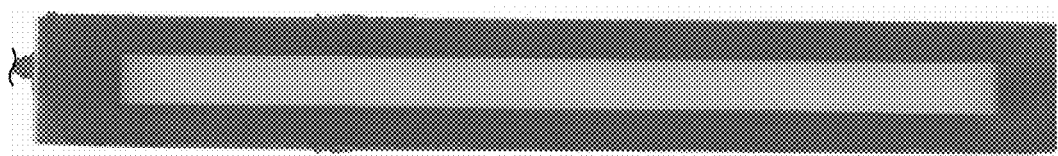
FIG. 41A to FIG. 41E illustrate homogenous lighting devices.

To illustrate what is meant by a "uniform light" or "homogenous light", reference can be made to the following figures, which are photographs of example homogenous lighting devices:

FIG. 41A, showing a Double Row CHMSL Full Mold MG unpowered (homogenous lighting device in white)

Figure 41B:

FIG. 41B, showing a Double Row CHMSL powered daytime (homogenous lighting device in red)

Figure 41C:
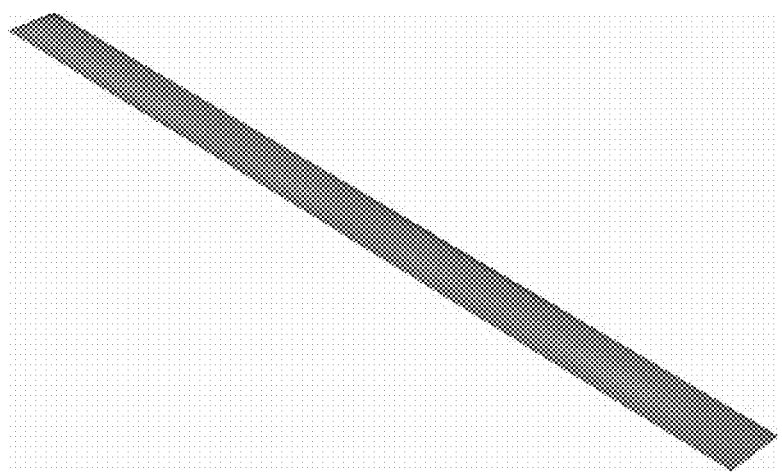
Figure 41D:
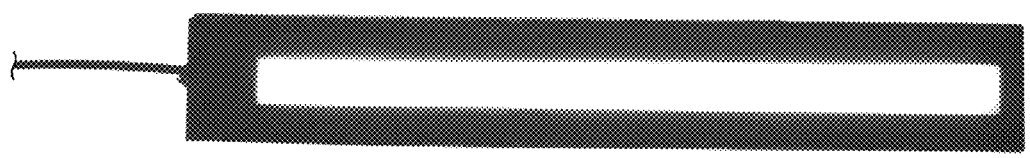

FIG. 41C, showing a Double Row CHMSL Full Mold MG 2084 powered nighttime (homogenous lighting device in red), and FIG. 41D, showing a Row Dome MG 3071 powered daytime (homogenous lighting device in white).

Figure 41E:
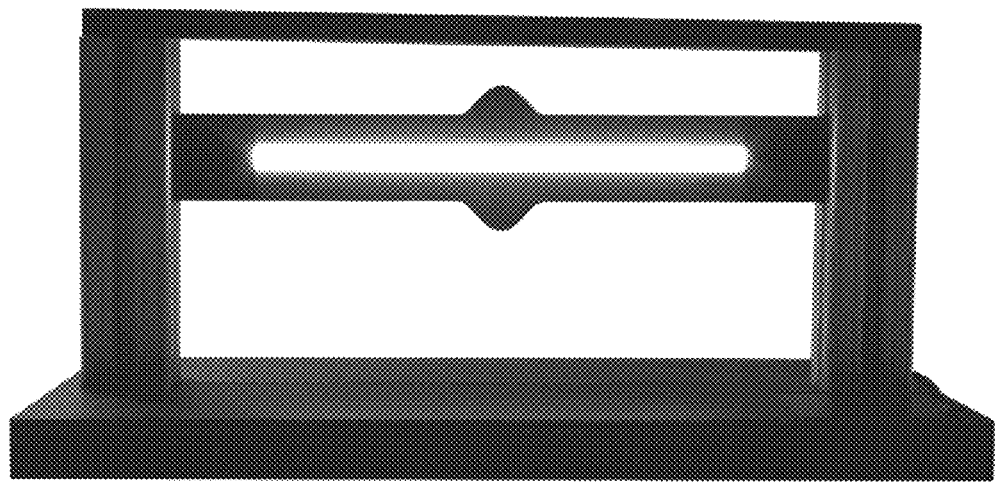

FIG. 41E, showing a mounted Signal Lamp, powered.

The photographs of the powered lighting devices illustrate the homogenous light, which is uniform throughout the light, from end-to-end, along both the horizontal and the vertical directions, as well as out to the corners.

As mentioned above, FIG. 20C illustrates light around corners. On the left figure, the uniform lighting device 2071 achieves uniform light around corners, in which the intensity and diffusion of the light at the corner and legs 2073, 2075, 2077 is the same. In comparison, the figure on the right is a conventional lighting device and the light at the corner 2083 of the conventional device 2081 is diminished in comparison to the legs 2085, 2087.

In conventional lights, a conventional air gap plus optics in the lens can be used to control the light. The light passes through the air gap, and then through a lens; the back side of the lens has optics that help direct the light. The present embodiment does not need to use the optics in the lens. For example, referring back to the cross section of FIG. 21A, the acrylic or polycarbonate or other lens does not need to use any additional optics to control the light. Thus, the homogenous lighting device does not need special molds for preparation of the lens. Also, it can be light weight, flexible, and can get to market quickly since no special molds are required.

Finding #4—Integrated Rear Combination Lamp, Light Sheet Lighting System

Reference is made back to FIG. 21B. A conventional tail lamp has multiple different parts. In the illustrated embodiment, all of the features with the different colors (tail lamp, turn signal, back-up) and uncolored parts 2133, 2135, 2139, 2137 can be a single unitary part, still maintain thickness in, e.g., 0.2 inch range, and still be individually controlled with electronic circuitry/feature external to or integrated on the single unitary part. The integrated combination lighting device can be provided as a very thin light and provide multiple functions (colors) using the same substrate. This can be a big advantage for situations where one lamp can provide multiple functions.

Integrated Flexible Circuit Variation

Figure 27:
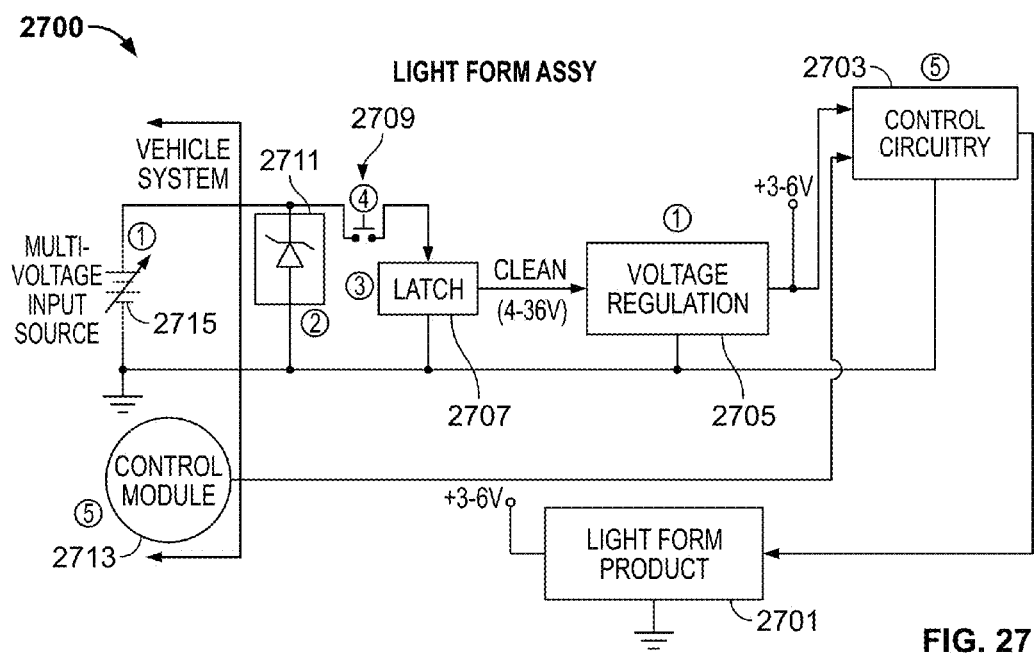
FIG. 27 is a schematic of a flex circuit.

The control part can be a flex circuit such as illustrated in FIG. 27, an electrical schematic in block diagram form of a light sheet assembly.

Referring now to FIG. 27, a schematic of a flex circuit will be discussed and described. A flex circuit 2700 can include a light sheet product 2701 receiving a signal from control circuitry 2703. Input to the control circuitry 2703 are a voltage regulation signal 2705 and a signal from a control module 2713, such as a standard in-vehicle control computer. The voltage regulation signal 2705 receives a signal from a latch 2707, which receives a latched signal 2709, which receives an inserted signal 27011 originated from a multi-voltage input source 2715.

The electronic circuitry for a courtesy light and a CHMSL respectively, such as illustrated in FIG. 27, can be incorporated for the following reasons/functions:

(1) Input voltage reduction
(2) Protection from vehicle transients
(3) Noise reduction/de-bounce from power switches
(4) Power switches like membrane type
(5) Control for addressing intensity "light", and color mixing.

All of the above functionalities (1)-(5) plus the light sheet can be assembled onto the same flexible circuit. The additional electronic circuitry can be placed using the same equipment for placing the LED die used in the light sheet product. Placement can include the conductive epoxy to mechanically and electrically attach the component to the flexible circuit and the actual electronic parts.

Figure 28:
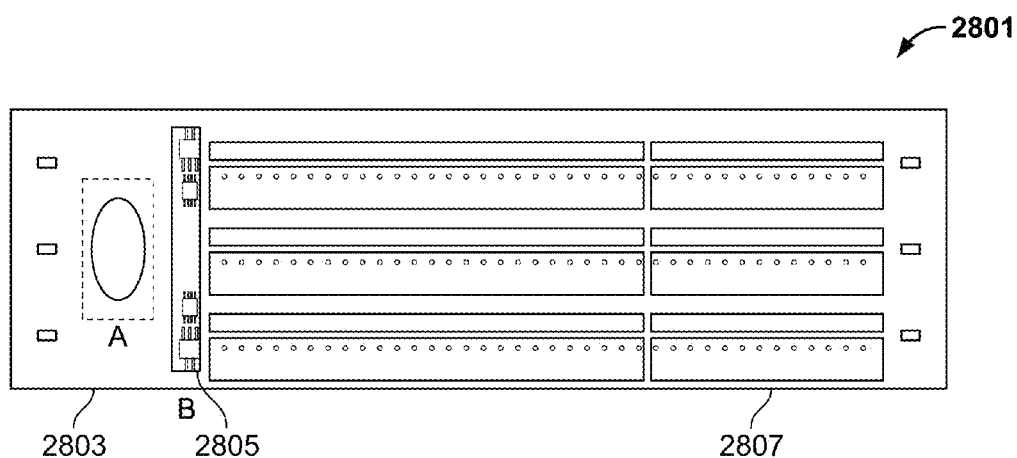
FIG. 28 is an illustration of an integrated electronic circuit.

Referring now to FIG. 28, an illustration of an integrated electronic circuit will be discussed and described. FIG. 28 illustrates an example of how the electronic circuitry can be integrated on to the same flexible circuit containing the light sheet. In FIG. 28, element A 2803 is a membrane switch, element B 2805 is an electrical circuit (e.g., protection, noise control and control circuit) and element C 2807 is a light sheet circuit. The membrane switch 2803 can be a conventional membrane switch. The electrical circuitry 2805 can be as disclosed in FIG. 27, or variations thereof. The light sheet circuit can be as disclosed in connection with FIG. 11B, FIG. 20B or FIG. 21A herein. The membrane switch 2803 generates a control signal to the electrical circuitry 2805, which is electrically connected to and controls the light sheet circuit 2807.

Figure 29:
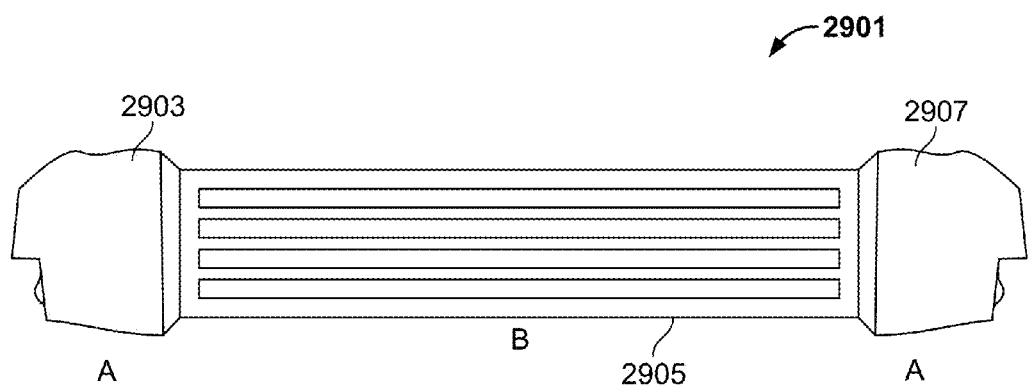
FIG. 29 is an illustration of an overmold.

Referring now to FIG. 29, an illustration of an over-mold will be discussed and described. A lighting device 2901, for example as illustrated in FIG. 27 or FIG. 28, can be further enhanced by either over-molding or laminating a decorative cover, as illustrated in FIG. 29. In FIG. 29, elements A are over-molds 2903, 2907 and element B is a light sheet circuit area 2905.

The light sheet circuit area can be a single part, as discussed above. Optionally, the light sheet circuit area can include different colors on the same substrate.

Integrated Combination Light Variation

Figure 22A:
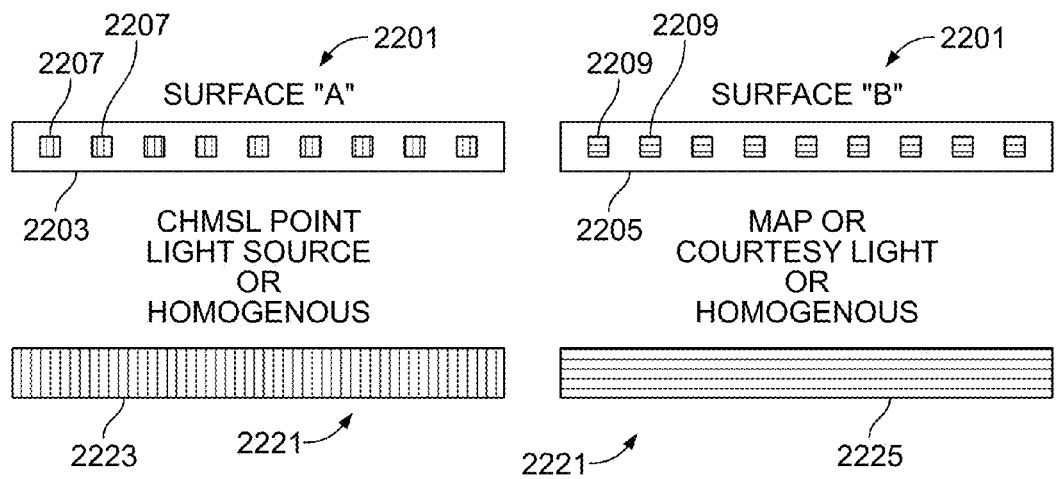
FIG. 22A is a top/bottom view of light on two different surfaces of the same substrate.
Figure 22B:
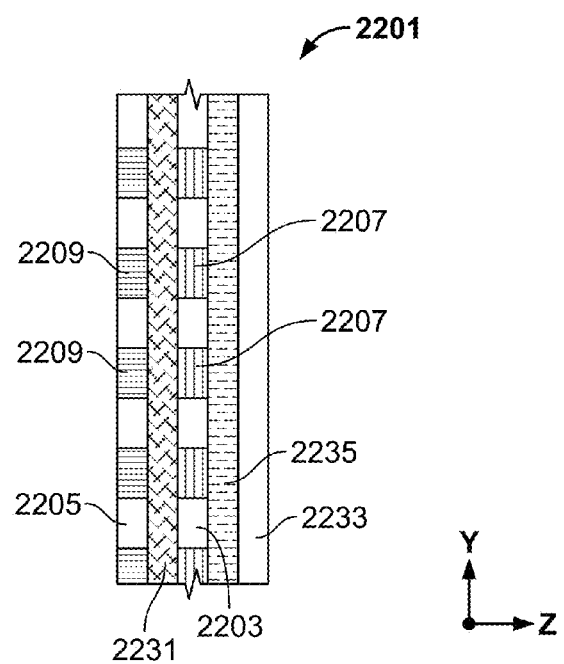
FIG. 22B is a side view of the light on two different surfaces of the same substrate.

Reference is made to FIG. 22A and FIG. 22B, which illustrate a CHMSL and map/courtesy light on two different surfaces of the same substrate 2201. FIG. 22A is the top view of surface "A" and surface "B", and FIG. 22B is the side view of the combination CHMSL and map/courtesy light. Surface "A" is a CHMSL light source, and surface "B" is a map or courtesy light source. The CHMSL will be directed to the exterior of the vehicle, and the other surface will be directed to the interior of the vehicle. Surface "A" and surface "B" are on opposite surfaces of the same substrate 2201. Hatching is used to indicate colors in FIG. 22A-22B.

Referring now to FIG. 22A, a top/bottom view of light on two different surfaces of the same substrate will be discussed and described. An integrated combination light is a combination of layered substrates 2201 and includes surface "A" 2203 and surface "B" 2205, on an opposite side of the same layered substrates 2201. Surface "A" 2203 can include point light sources 2207 or optionally can be provided as a homogenous light source 2223. Surface "B" 2205 can include point light sources 2209 or optionally can be provided as a homogenous light source 2225. The homogenous light source can be provided as a homogenous lighting device, discussed above. The point light source can be provided as a non-homogenous light source such as a light sheet. Surface "A" and surface "B" can be provided in different colors, for example, the colors appropriate to a CHMSL in surface "A" 2203 and colors appropriate for a map or courtesy light in surface "B". Surface "A" 2203 and surface "B" 2205 can be combined into the same substrate as shown in cross section, FIG. 22B.

Referring now to FIG. 22B, a side view of a light on two different surfaces of a same substrate will be discussed and described. In FIG. 22B, an integrated combination lighting device of layered substrates, 2201 includes a first substrate 2205, e.g., a courtesy light, a second substrate 2231 which is the common conductive substrate or separate substrates adhered with, e.g., tape, and a third substrate 2203 is, e.g., a CHMSL. Also illustrated is a fourth substrate 2235 is adhesive such as tape, and a fifth substrate 2233, for example an automobile's back window on which the integrated light sheet lighting device can be adhered. The first substrate 2205 incorporates LEDs 2209 in appropriate color(s) and arrangements for the first light display e.g., a courtesy light; and the second substrate 2203 incorporates LEDs 2207 in an appropriate color and arrangement for a second light display, e.g., a CHMSL.

Finding #5—Integrated Dual Light Sheet Lighting System

An integrated dual lighting system can be provided, such as a tail lamp feature with an additional lighting feature. Still referring to FIG. 22A and FIG. 22B, other examples are a reading/map light, for example in white made with stacked light sheet that is laminated or uses a common bottom substrate for an interior application, and a regulated light property on the opposite side to provide a CHMSL function for an exterior application. Other examples are a CHMSL/Cargo light on the same substrate, and a stop/tail/turn light on the same substrate.

The features can be integrated on the same plane of the same substrate, and/or integrated on opposite sides of the same substrate combination. For example, a first surface can have the CHMSL feature (facing outside), and a second of the same substrate (facing inside) can have a reading light or map light shining into the interior of the vehicle.

The integrated combination lighting device can be provided as a very thin light.

Glass Laminated Variation

Figure 46:
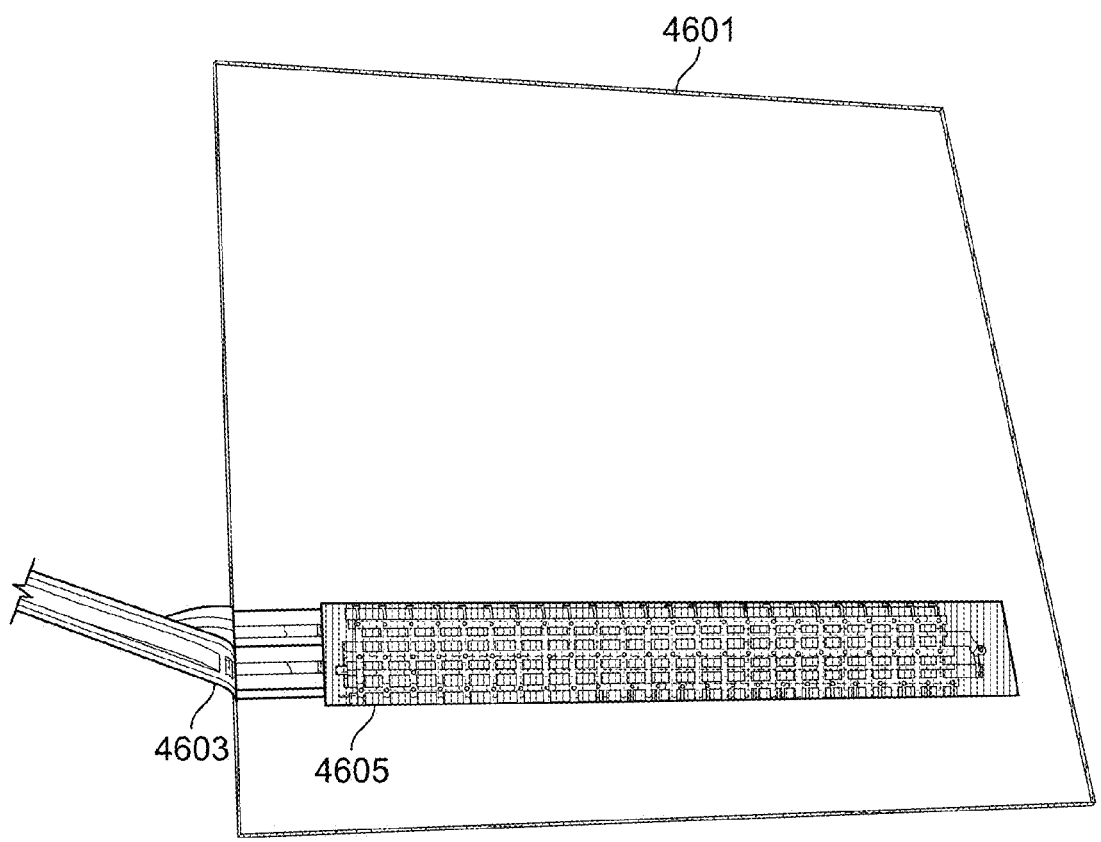
FIG. 46 illustrates a multi-strip laminated in glass.

According to another variation, the CHMSL can be laminated in glass. Referring now to FIG. 46, a multi-strip laminated in glass will be discussed and described. A CHMSL 4605 can be prepared as discussed above. The CHMSL 4605 can be sufficiently thin so as to be laminated to glass 4601, for example in accordance with known techniques. The CHMSL 4605 can be powered by an electrical connection 4603 to a conveyance.

Finding #6—Exterior Architectural Applications

Figure 23:
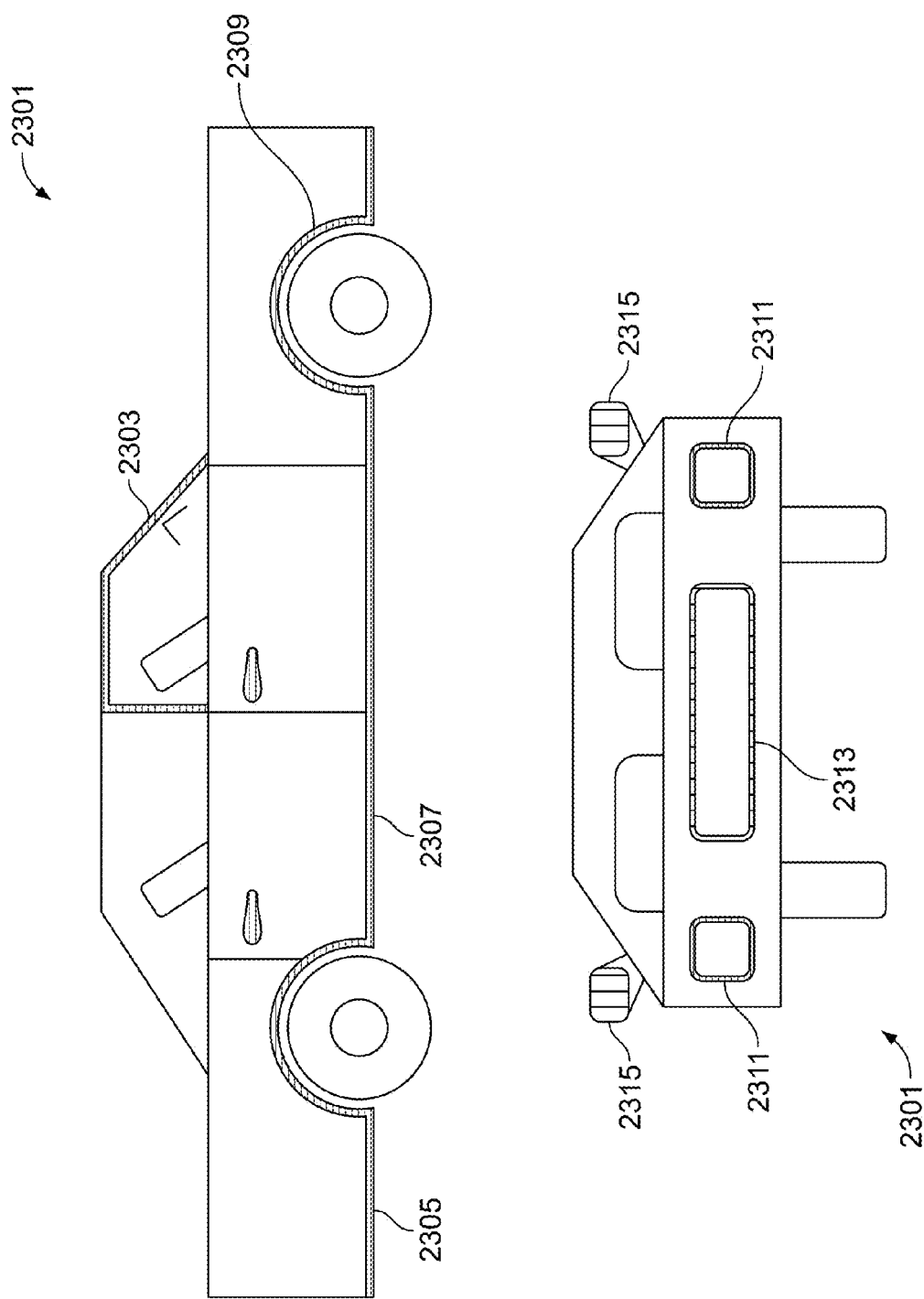
FIG. 23 is an illustration of exterior lighting applications.

Referring now to FIG. 23, an illustration of exterior lighting applications will be discussed and described. FIG. 23 provides non-exhaustive examples of exterior lighting applications in connection with a conveyance 2301, for the edge lighting device and/or the homogenous lighting device discussed herein. An embodiment can provide for architectural lighting in the exterior of a conveyance system. Lighting can be independent or integrated with another light sheet lighting device or a conventional non-light sheet lighting system. Hatching is used to indicate colors in FIG. 23.

Examples of lighting include an underbody strip light 2305 or step-up rail, a kick plate 2307, a perimeter light around a wheel well 2309, window treatment light around a window 2303, a light source on a mirror 2315, a perimeter light around a grill 2313, and a light in a headlamp 2311.

Figure 36:
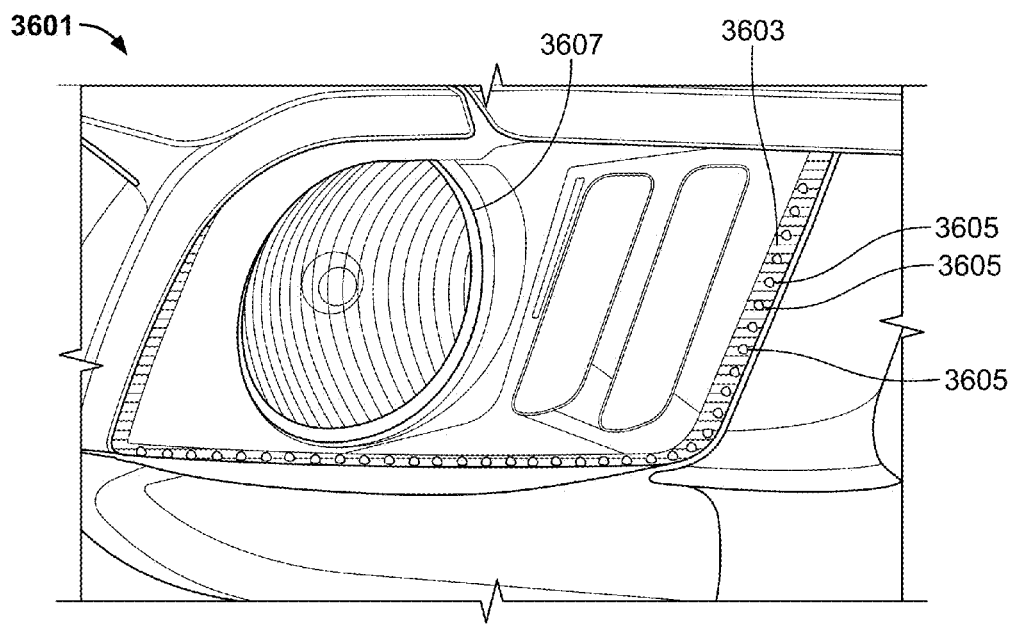
FIG. 36 illustrates an exterior application integrated in a headlamp.

For example, a, edge light in a white color can be integrated into a front headlamp, as further shown in FIG. 36.

Misc. Interior and Exterior Applications

FIG. 30A-30F, FIG. 31A-31B, FIG. 32A-32B, and FIG. 33-FIG. 36 have several examples of light sheet Interior/Exterior Applications, which are presented by way of example and not limitation. It will be appreciated that one, or all, or a combination of the example interior and exterior applications can be provided. Not all of these examples need to be provided. Hatching is used in these figures to indicate colors which are generated by the LEDs when the LEDs are powered on.

Figure 30A:
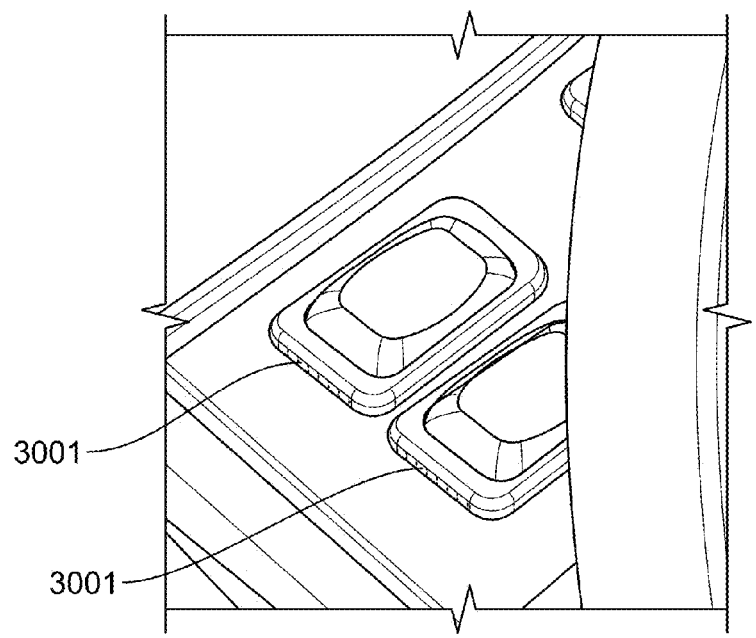
FIG. 30A to FIG. 30F are examples of interior and exterior applications of edge lighting devices and uniform lighting devices.
Figure 30B:
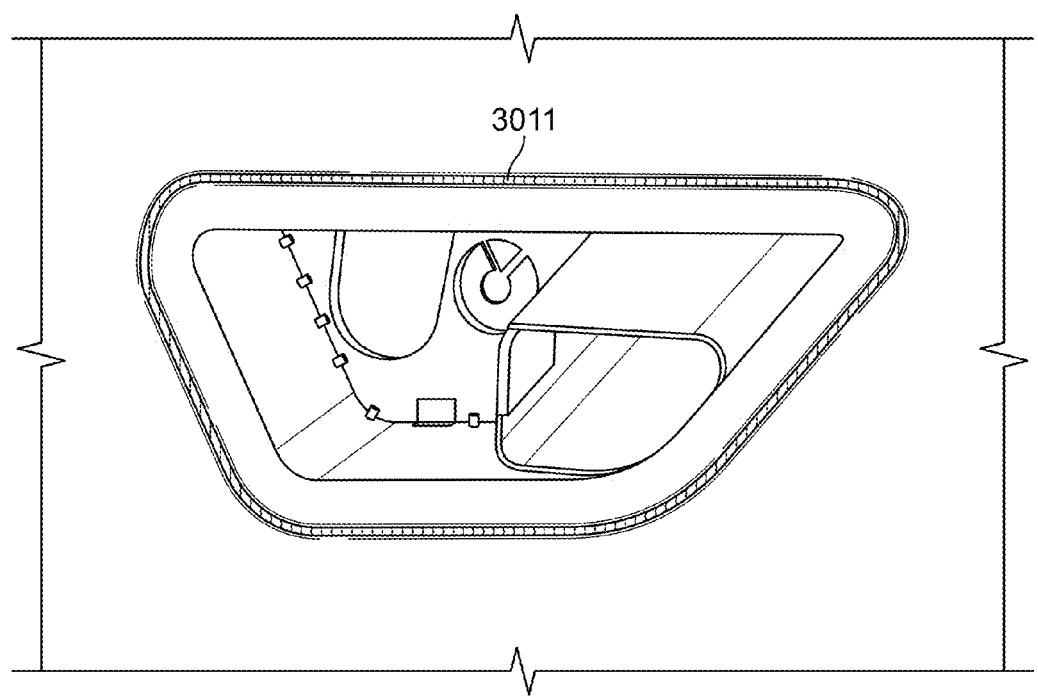
Figure 30C:
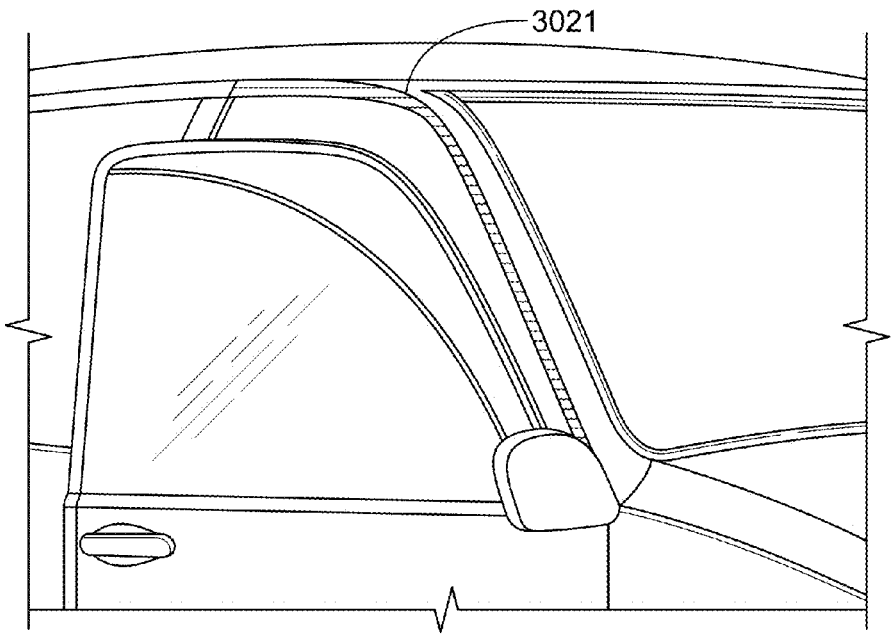
Figure 30D:
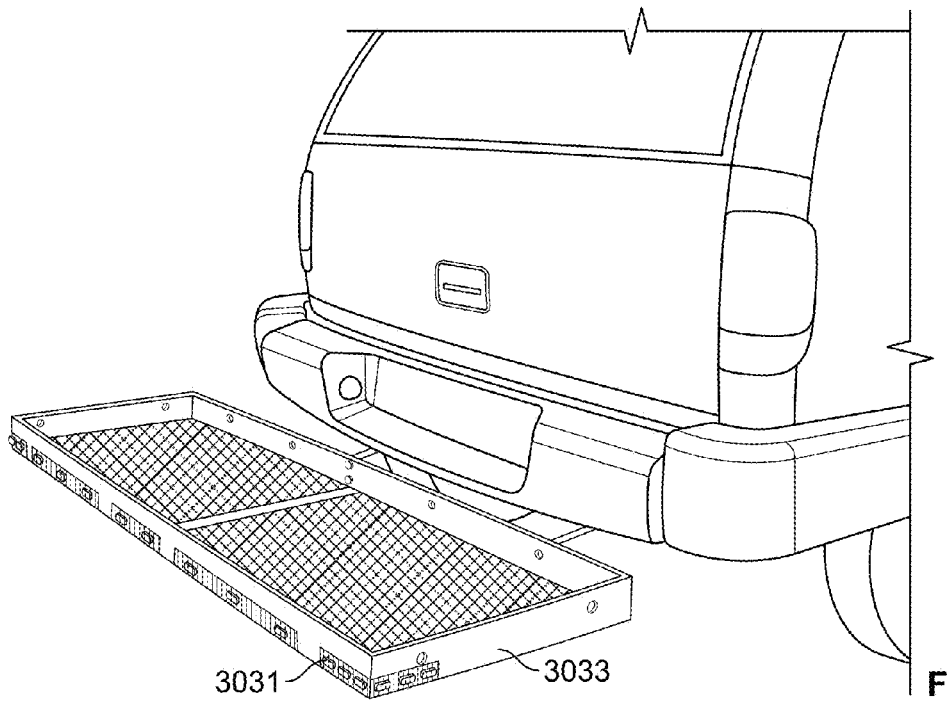
Figure 30E:
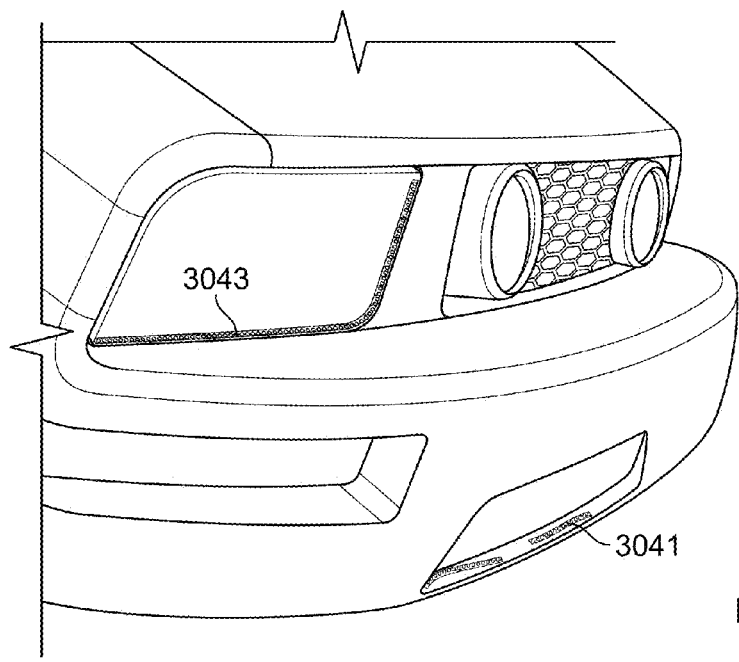
Figure 30F:
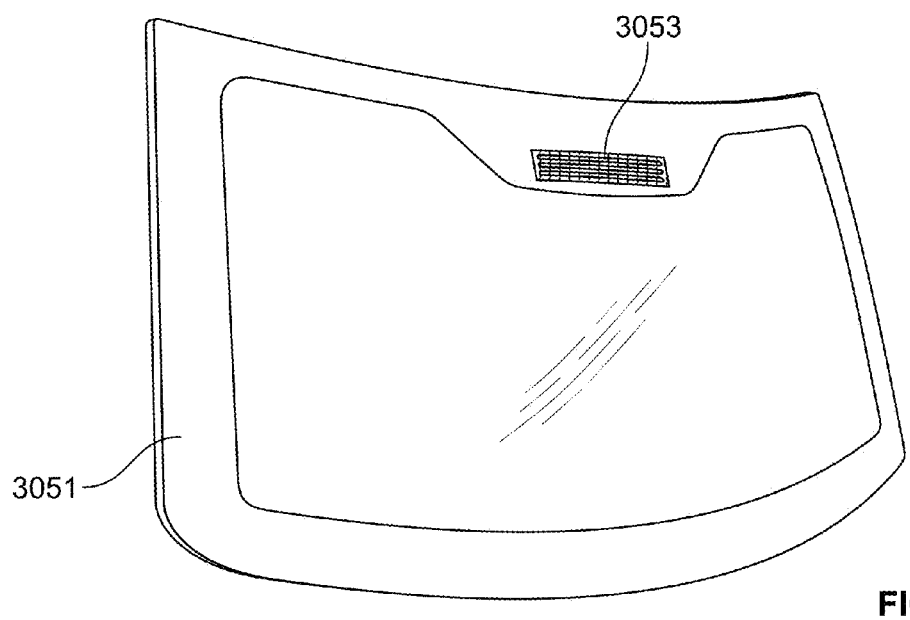

Referring now to FIG. 30A to FIG. 30F, examples of interior and exterior applications will be discussed and described. In FIG. 30A, interior switches are backlit with an edge lighting device 3001. In FIG. 30B, a door handle is provided with an edge lighting device 3011. In FIG. 30C, a perimeter of a window is provided with an edge lighting device 3021. In FIG. 30D, a hitch 3033 is provided with marker lights 3031. In FIG. 30E, a perimeter of a grill 3041 and a perimeter of a headlamp 3043 are provided with an edge lighting device. In FIG. 30F, a car window 3051 is provided with a homogenous lighting device 3053 as a CHMSL.

Figure 31A:
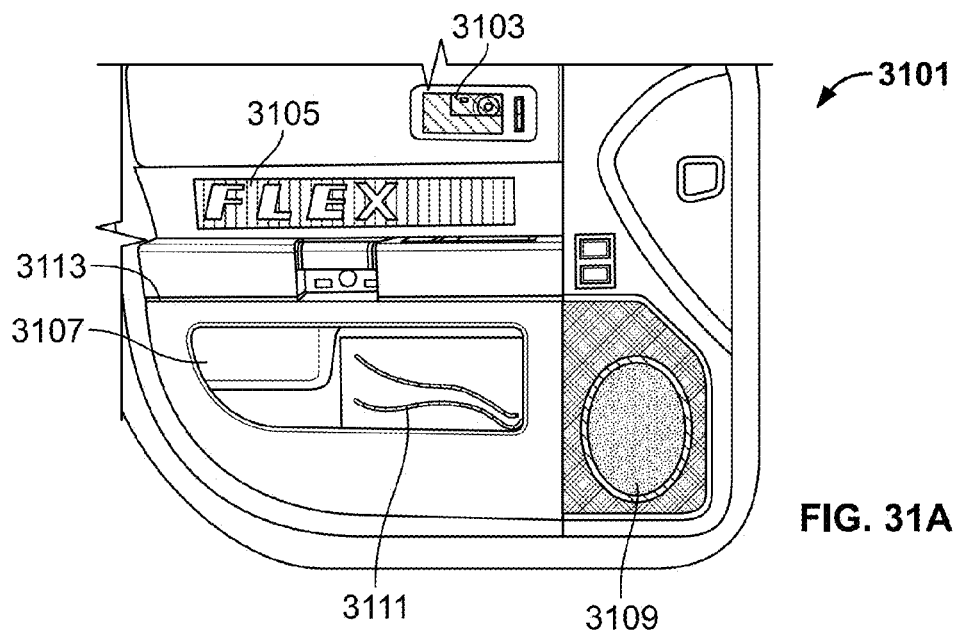
FIG. 31A and FIG. 31B illustrate interior applications using edge lighting devices and uniform lighting devices for a door panel at night time and day time, respectively.
Figure 31B:
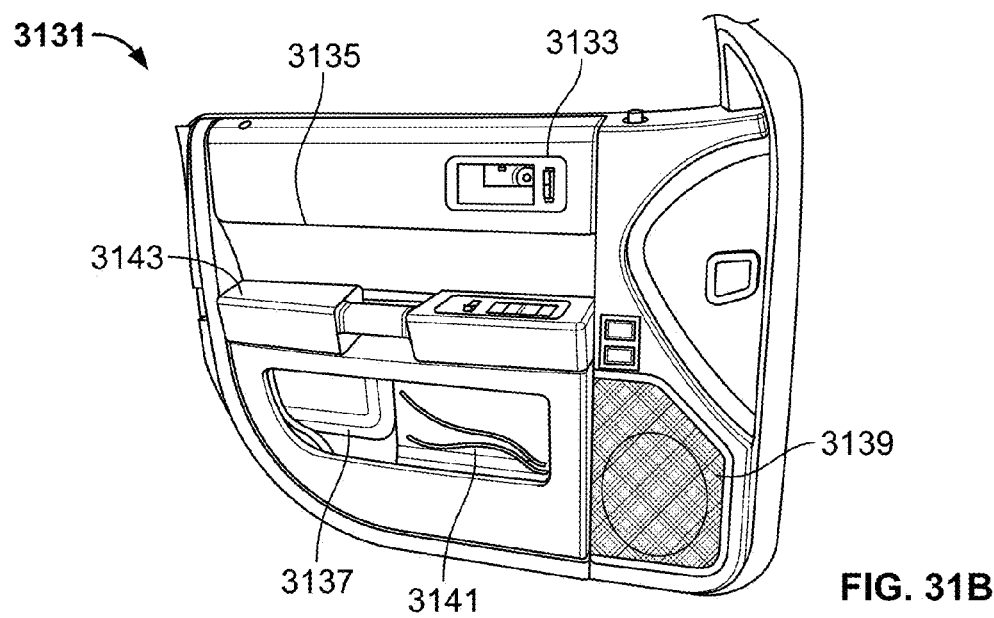

Referring now to FIG. 31A and FIG. 31B, an interior application for a door panel at night time and day time, respectively will be discussed and described. In the nighttime view of FIG. 31A when the lighting devices are illuminated, the lighting devices are visible. In comparison, in the daytime view of FIG. 31B, the lighting devices are not visible.

FIG. 31A illustrates a door panel 3101 for an automobile that includes a homogenous lighting device as an interior light 3103, as a decorative panel 3105, and as a speaker cover 3109; and an edge lighting device as an arm rest trim strip 3113, a door pocket light 3107, and a door pocket decorative insert 3111.

FIG. 31B illustrates a door panel 3131, which is the same door panel shown during daytime. The door panel 3131 illustrates an interior light powered off 3133, a speaker cover 3139, powered-off door pocket light 3137, powered-off decorative insert 3141, powered-off arm rest trim strip 3143, and powered-off decorative panel. During the daytime and/or when the edge lighting devices and homogenous lighting devices are powered off, the edge and homogenous lighting devices are not noticeable and may not be distinguishable from the trim panels into which they are inset.

Figure 32A:
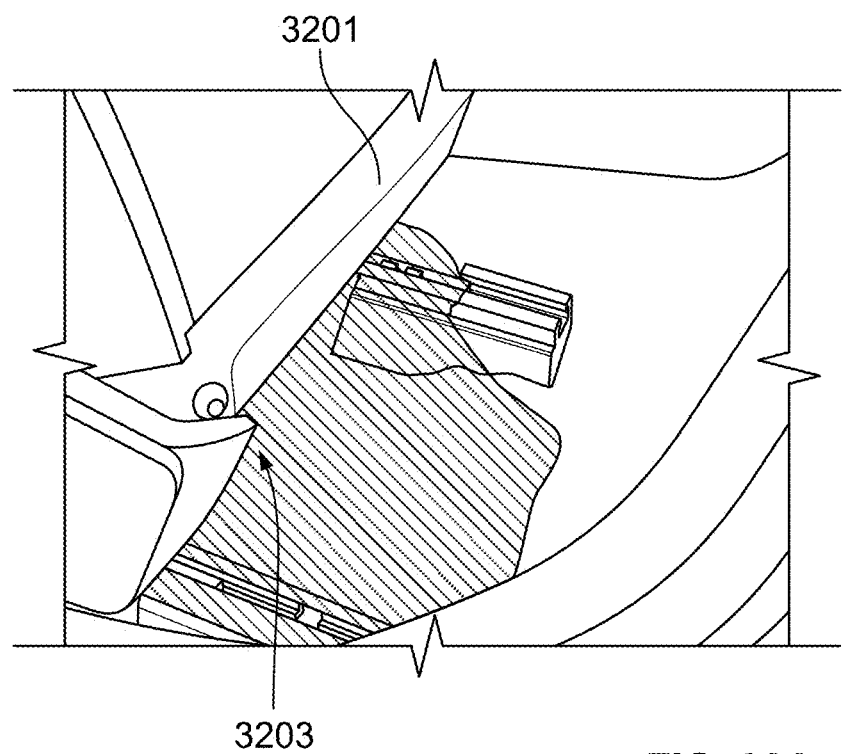
FIG. 32A illustrates an interior application under a seat.

Referring now to FIG. 32A, an interior application under seat will be discussed and described. Here, a homogenous or edge lighting device (not visible) is placed on the bottom of a seat 3201 to illuminate a floor area 3203 under the seat 3201.

Figure 32B:
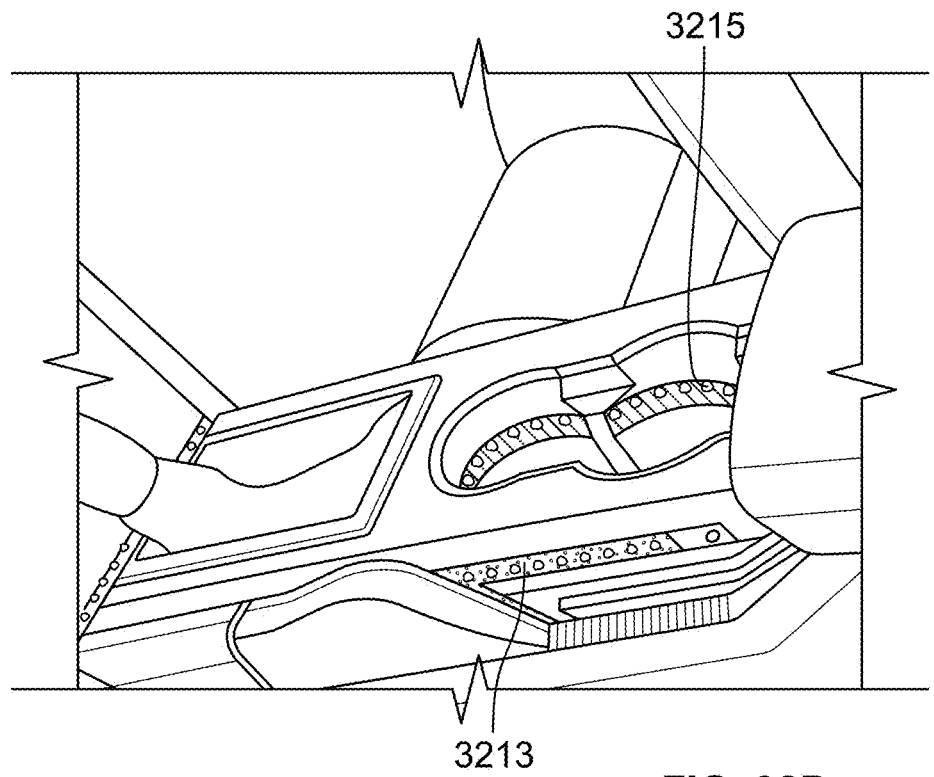
FIG. 32B illustrates an interior application in a cup holder.

Referring now to FIG. 32B, an interior application in a cup holder will be discussed and described. Here, an edge lighting device 3215 is placed inside a cup holder, and an edge lighting device 3213 is placed as trim along an outside of a console with the cupholder.

Figure 33:
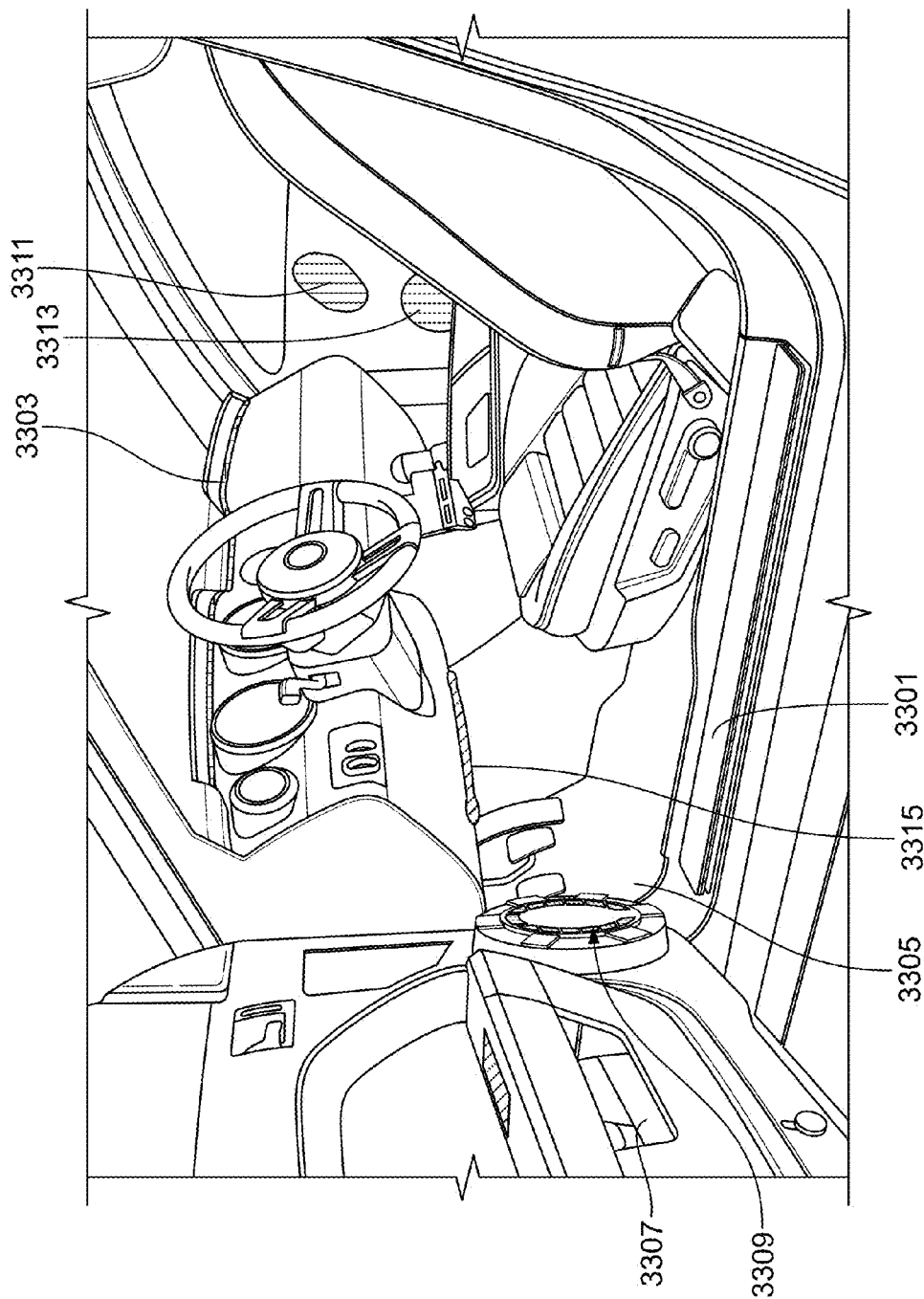
FIG. 33 illustrates interior applications in a front passenger compartment.

Referring now to FIG. 33, an interior application in a front passenger compartment will be discussed and described. An interior passenger compartment can include an edge lighting device as an instrument console trim 3303, ambient lighting inside door pocket 3307, embedded in door handle 3309, and lighted trim under the steering column 3315; and a homogenous lighting device as a strike plate trim 3301, driver foot compartment floor lighting 3305, and perimeter lights around speakers 3311, 3313. Other interior applications include, for example, back lit behind a translucent film, embedded between other trim pieces (edge light), under seat as ambient light, cup holder perimeter lights, logo backlighting, and edge lighting in seats.

Figure 34A:
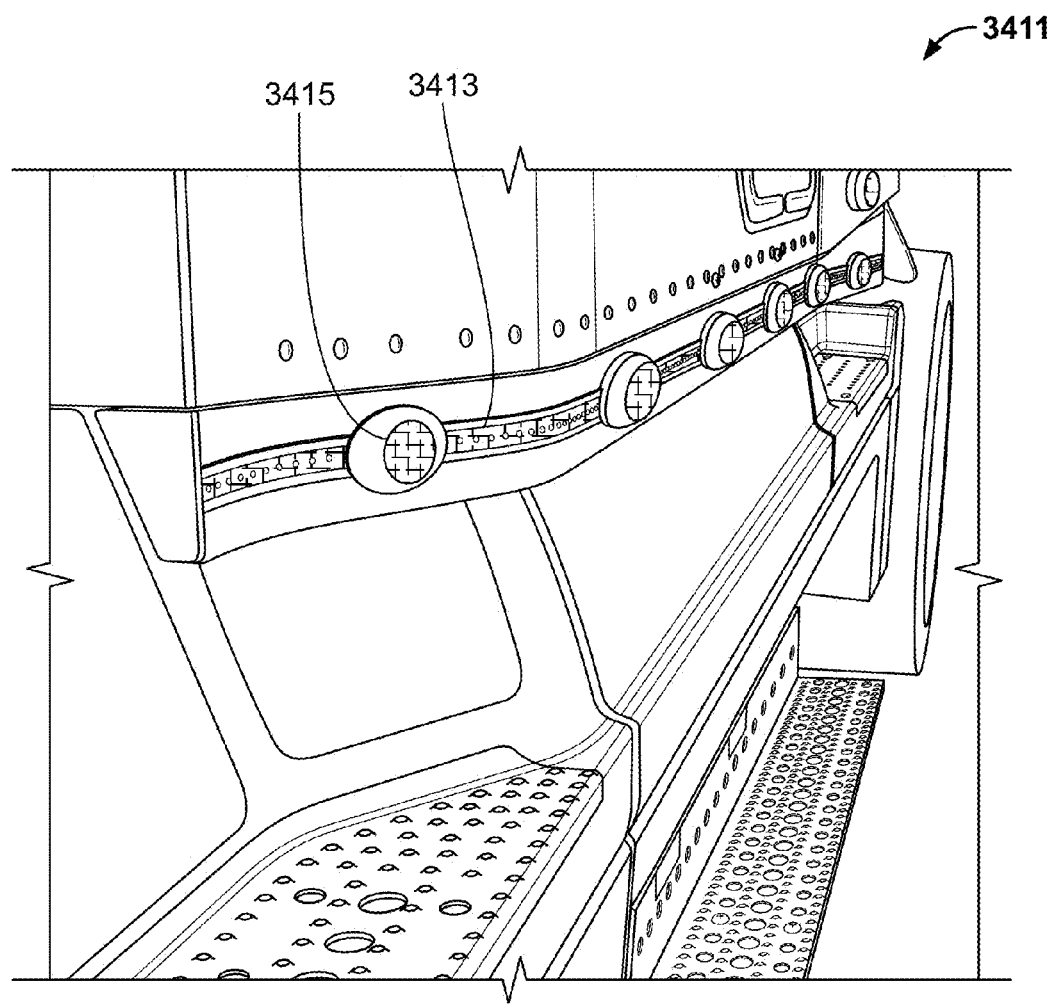
FIG. 34A illustrates exterior applications on a truck.
Figure 34B:
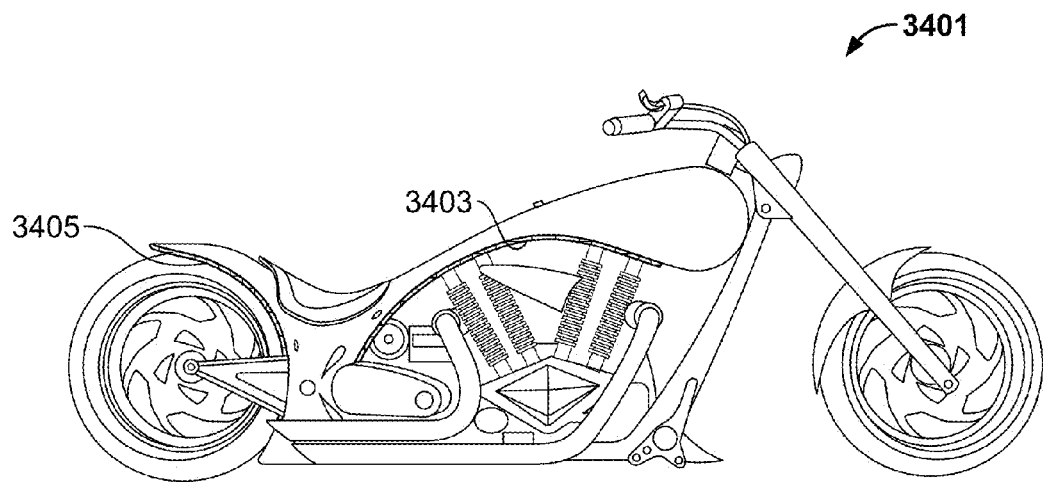
FIG. 34B illustrates exterior applications for a motorcycle.
Figure 34C:
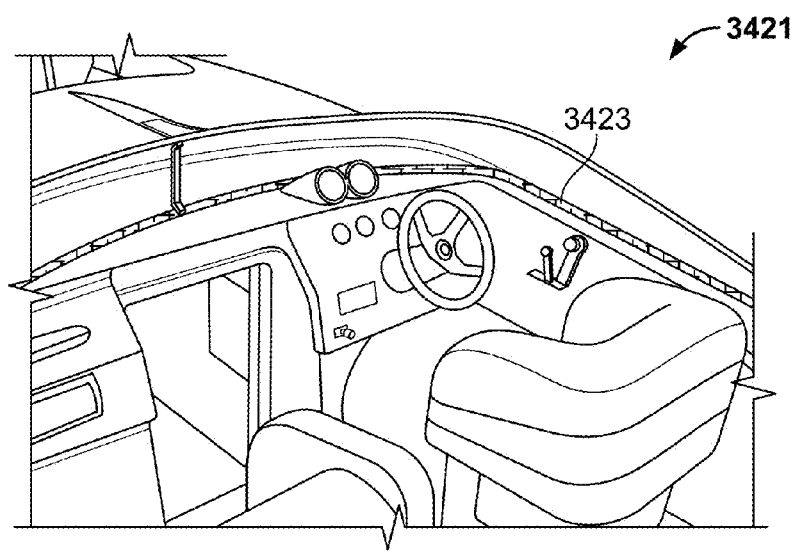
FIG. 34C illustrates an exterior application for a water craft.

FIG. 34A, 34B and 34C illustrate some exterior applications: motorcycle, automotive architectural lighting, marine, respectively. The exterior applications can be provided as, for example, an edge lighting device and/or homogenous lighting device integrated into a trim for automobile and/or other conveyances.

Referring now to FIG. 34A, an exterior application on a truck will be discussed and described. A cab of a truck 3411 can have disposed thereon an edge lighting device 3413 displayed linearly between conventional trim lighting 3415.

Referring now to FIG. 34B, an exterior application for a motorcycle will be discussed and described. A motorcycle 3401 can have disposed thereon a homogenous or edge lighting device under the engine cowl 3403, and/or an edge lighting device as trim on a mud guard 3405.

Referring now to FIG. 34C, an exterior application for a water craft will be discussed and described. A watercraft 3421 can have disposed thereon an edge lighting device 3423 incorporated into a pre-determined gap between window trim and an instrument panel, a pre-determined gap between the instrument panel and the passenger compartment, and a pre-determined gap between the window trim and the passenger compartment.

Figure 35:
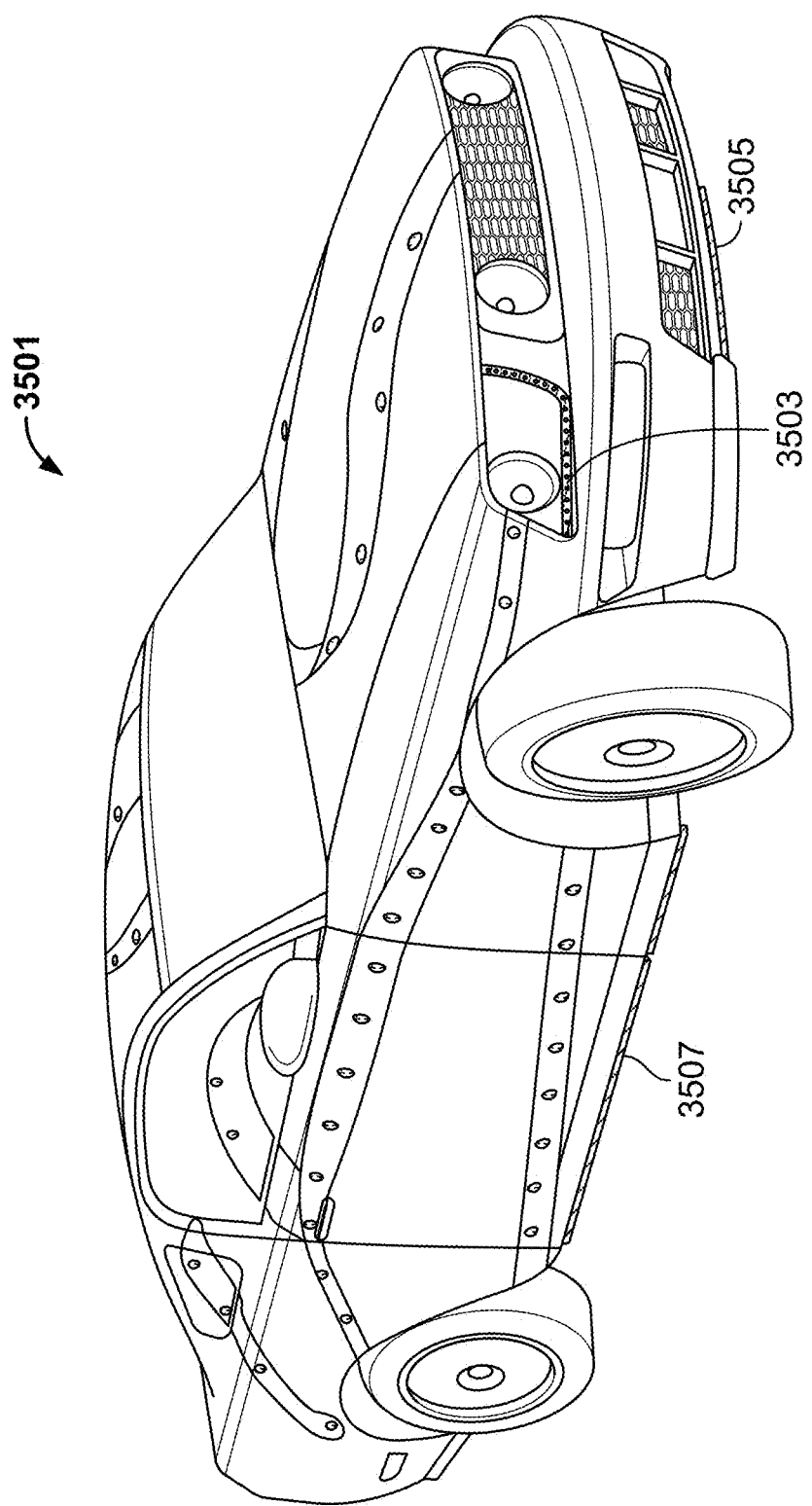
FIG. 35 illustrates exterior applications for a whole vehicle.

Referring now to FIG. 35, an exterior application for a whole vehicle will be discussed and described. In this illustration, an automobile 3501 is provided with an edge lighting device 3503 provided as interior to a perimeter of an integrated head lamp; a homogenous lighting device 3505 provided as a fog lamp; and a homogeneous lighting device 3507 provided on a running board.

Referring now to FIG. 36, an exterior application integrated in a headlamp will be discussed and described. A headlamp 3601 is typically provided as an integrated unit in accordance with known techniques. The headlamp 3601 can incorporate a conventional lamp 3607. The headlamp 3601 can include an edge lighting device 3603 around a perimeter, for example at a perimeter of the lens. The edge lighting device can be provided with a less diffused lighting according to techniques discussed herein, so that individual point lights 3605 are visible, if preferred.

Finding #7—Series/Parallel Combination

Reference is now made to FIG. 24A to FIG. 24D. R1, R2 and R3 are the conductive layer corresponding to bank 1, bank 2 and bank 3 on the substrate of the homogenous lighting device. A series/parallel combination, for example as illustrated, can allow the homogenous lighting device to be offered over a wider range of input voltages, thus making it suitable for a variety of products such as within the transportation industry.

Figure 24A:
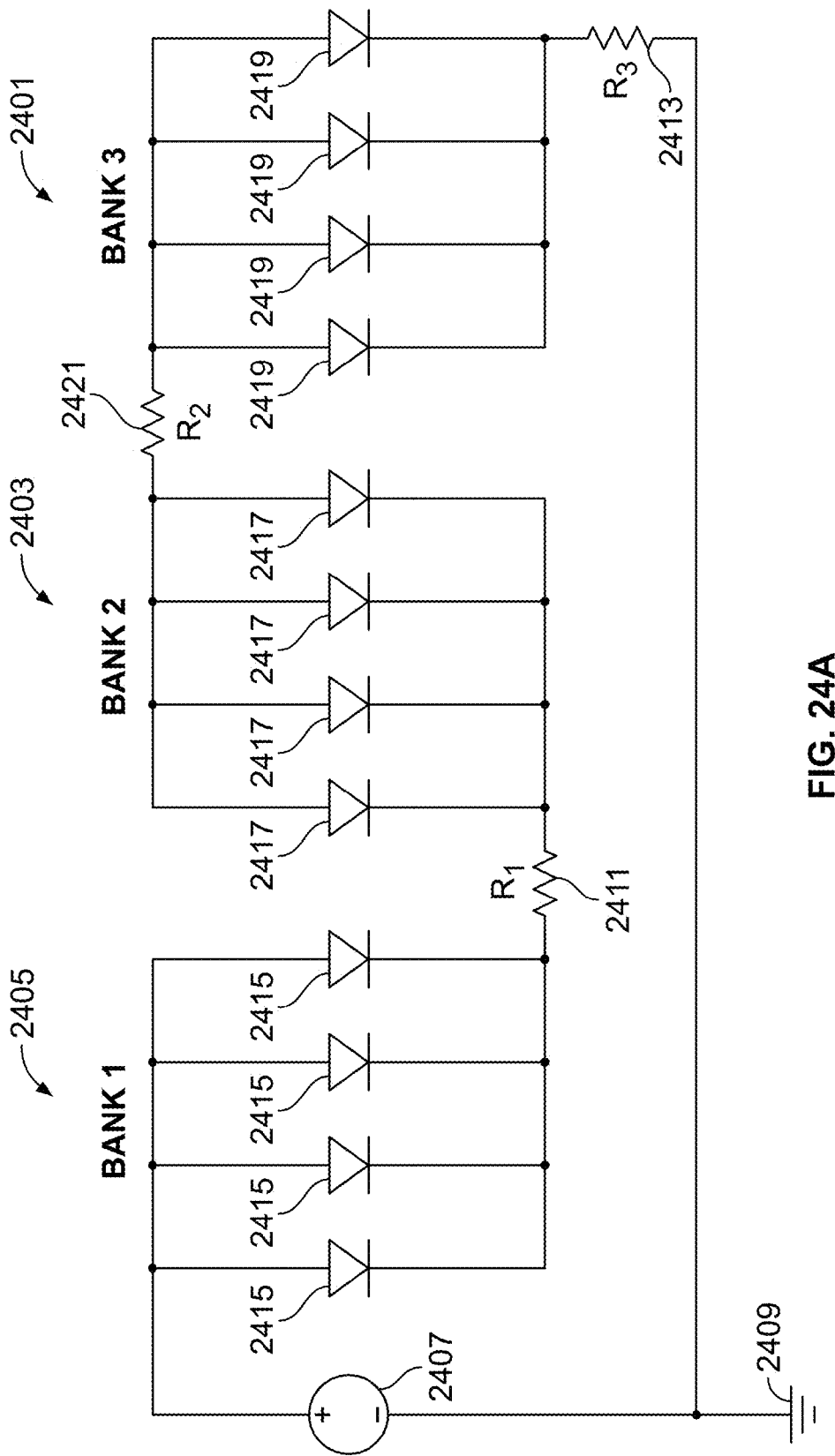
FIG. 24A is a schematic of a series/parallel combination.
Figure 24B:
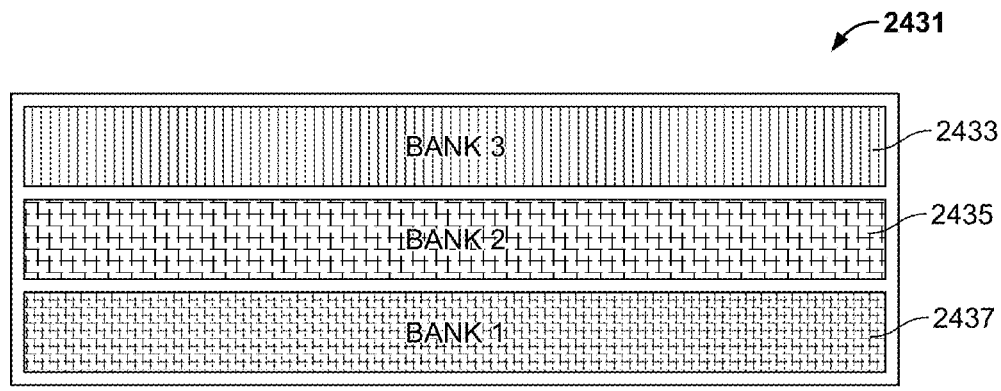
FIG. 24B is a plan view of a top substrate.

Hatching is used to indicate colors in FIG. 24B.

Referring now to FIG. 24A, a schematic of a series/parallel combination will be discussed and described. A schematic for the series/parallel combination circuit 2401 can include bank 1 2405, bank 2 2403 and bank 3 2401 can include bank 1 2405, bank 2 2403 and bank 3 2401 of LEDs 2415, 2417, 2419. Bank 1 2405 is electrically connected to bank 2 2403 through a resistor 2411, and bank 2 2403 is electrically connected to bank 3 2401 through a resistor 2421. Bank 3 2401 is electrically connected to a voltage source 2409 through a resistor 2413. Bank 1 2405 is electrically connected to the voltage source 2409 through a DC connection 2407.

Figure 24C:
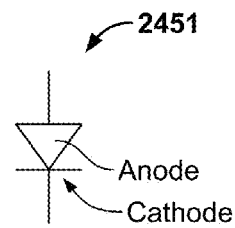
FIG. 24C is a view of a detail of FIG. 24A.
Figure 24D:
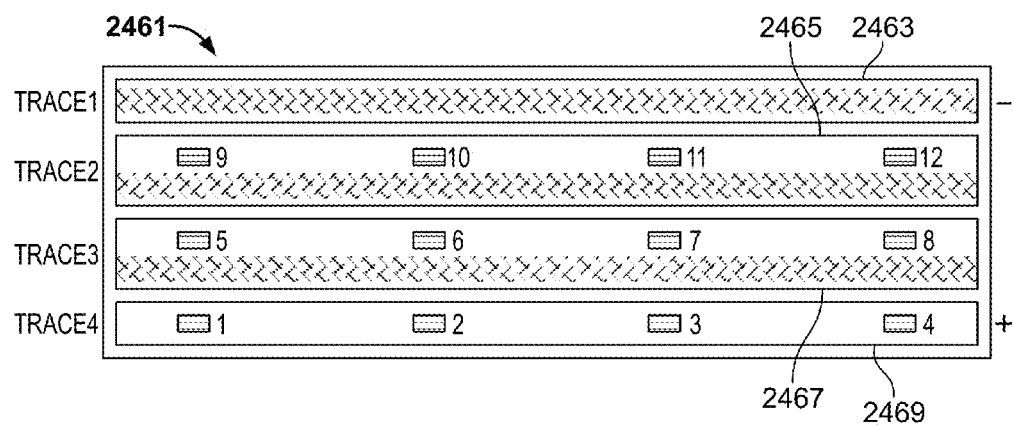
FIG. 24D is a plan view of a bottom substrate.

FIG. 24B to FIG. 24D illustrate other aspects of the series parallel combination.

Referring now to FIG. 24B, a plan view of a top substrate will be discussed and described. In FIG. 24B, the plan view of a top substrate 2431 with the conductive layer, each "Bank" 2433, 2435, 2437 of LEDs is isolated from each other. The first, second and third banks 2433, 2435, 2437 are then connected together in series, for example as in FIG. 24A. FIG. 24D is a plan view of the bottom substrate. In FIG. 24B, each bank 2433, 2435, 2437 can be separated from each other by etching away the conductive layer by means of a laser or other method. The top substrate 2431 can act as the anode, the bottom substrate (FIG. 24D, 2461) can act as the cathode of the LED (FIG. 24C, 2451). That is, the top substrate 2431 electrically performs as the anode of the LED 2451, and the bottom substrate (FIG. 24D, 2461) acts as the cathode of the LED 2451. A conductive bus can be attached to the bottom and top substrate; the bus can be copper tape, aluminum tape, silver ink, copper coil, or other suitable conductor.

Referring now to FIG. 24D, a plan view of a bottom substrate 2461 will be discussed and described. In the bottom substrate 2461, there is provided first, second, third and fourth traces 2463, 2465, 2467, 2469. A conductive bus (not illustrated) can be attached to bottom and top substrates 2431, 2461. The bus (not illustrated) can be, for example, a copper tape, aluminum tape, silver ink, copper coil, or other suitable conductor. In the fourth trace 2469, the first bank (FIG. 24B, 2433) anodes can be connected to power "+". In the third trace 2467, the first bank (FIG. 24B, 2433) cathodes can be connected to the second bank anodes. In the second trace 2465, the second bank cathodes can be connected to the third bank (FIG. 24B, 2433) anodes. In the first trace 2463, the third bank (FIG. 24B, 2433) cathodes can be connected to power "−". In FIG. 24D, hatching is used to indicate the conductive bus.

A cross section of this is, e.g., the light sheet, the edge lighting device or homogenous lighting device as previously discussed.

Finding #8 Use of Light Enhancement Films with a Spacer on a Second Substrate Improves Light Sheet's Appearance and/or Redirects Light The light-enhancing and diffusing films can include micro-optics. The micro-optics can be conventional materials.

Finding #9—Translucent Ink or Film

A translucent ink or film can allow for the light sheet to be used to backlight products, for example, an instrumentation cluster or concealed light. The translucent ink or film can be a conventional material.

Figure 25:
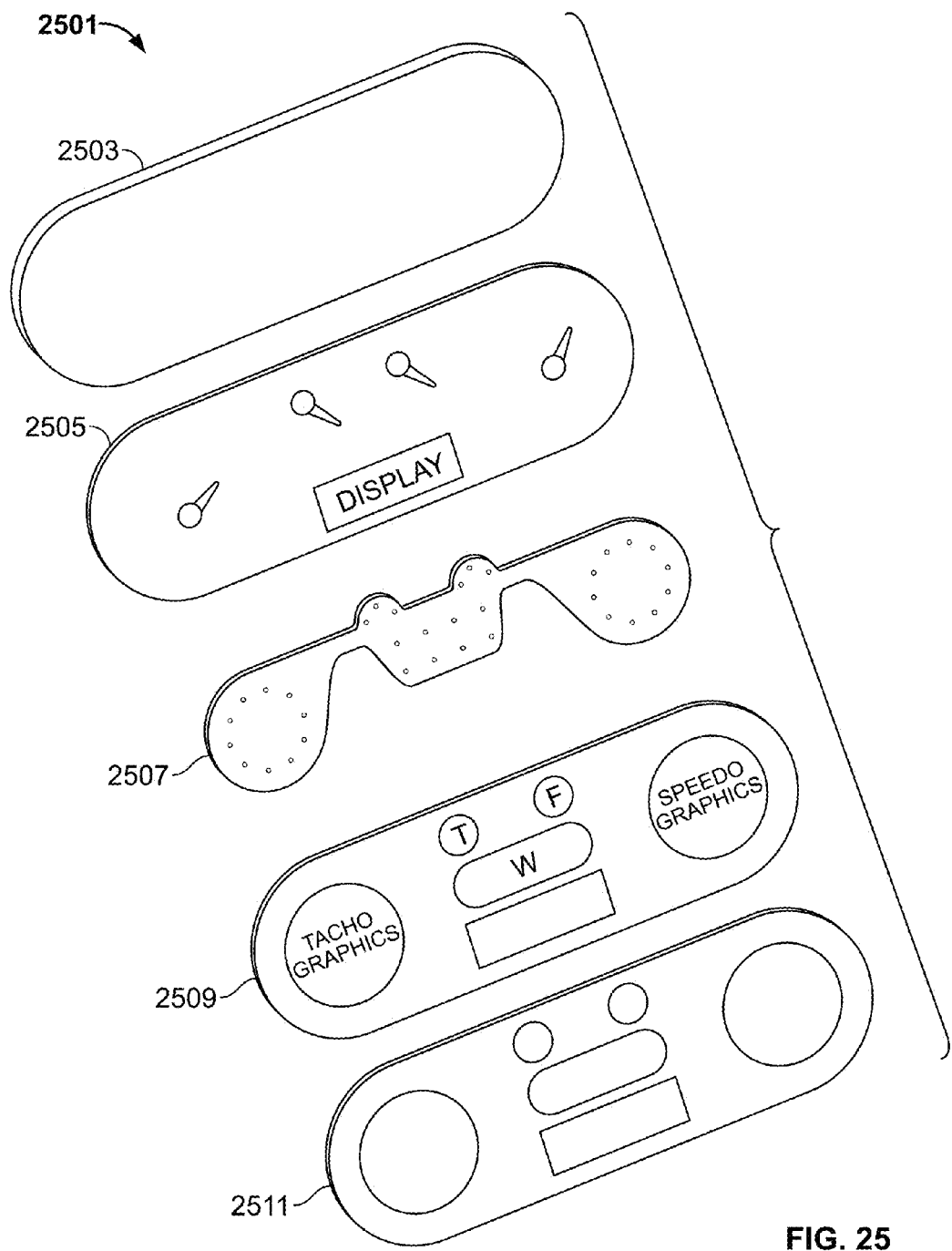
FIG. 25 is an exploded view of an instrument cluster.

Referring now to FIG. 25, an exploded view of an instrument cluster will be discussed and described. In FIG. 25, the exploded view of an instrument cluster 2501 includes a back housing layer 2503, a display layer 2505, a light sheet layer 2507, an appliqué layer 2509, and a lens/mask assembly 2511. The back housing layer 2503 and lens/mask assembly 2511 can be prepared in accordance with normal techniques. In the figure, T represents temperature graphics, F represents a fuel graphic, and W represents a standard warning graphic; these are representative of the usual instrument cluster information that can be provided on an instrument cluster 2501.

The appliqué layer 2509 can be prepared according to conventional techniques, for example screen printed with translucent ink for graphics. The translucent ink is applied to the appliqué. The instrument cluster includes hash marks, etc. A conventional instrument cluster cannot be seen without back-lighting at night. However, with the apparatus disclosed herein, the instrument cluster can be seen at night without backlighting and with conventionally available translucent ink.

The light sheet can be incorporated in the instrument cluster as the backlight source and thus be made to be much thinner than a conventional product. The light sheet can replace the packaged die that are typically assembled to the PCB layer. Also, reflectors that may conventionally be molded as dish shapes and assembled between the appliqué layer and the packaged LED layer in a conventional instrument cluster can be eliminated in the present embodiment of the instrument cluster. The PCB layer 2505 can include electronics to address and drive the die in the light sheet. The LEDs in the light sheet layer 2507 can be disposed to backlight, for example, the gauge and warning graphics in the appliqué layer 2509.

Finding #10—Opaque Unpowered Lighting

According to another variation, the lighting device can be opaque when not powered. As example, reference is now made to FIG. 26, a cross section of an opaque product, which was discussed above, FIG. 30-FIG. 36 for interior/exterior applications, and FIG. 31A to FIG. 31B for a daytime and night time illustration of a concealed light. Details were discussed above in connection with these figures. It should be appreciated that a device that appears to be opaque when not powered can seem to be, e.g., a trim piece instead of an unlit lamp.

Finding #11—Interior Edge Lighting Variations

Figure 38:
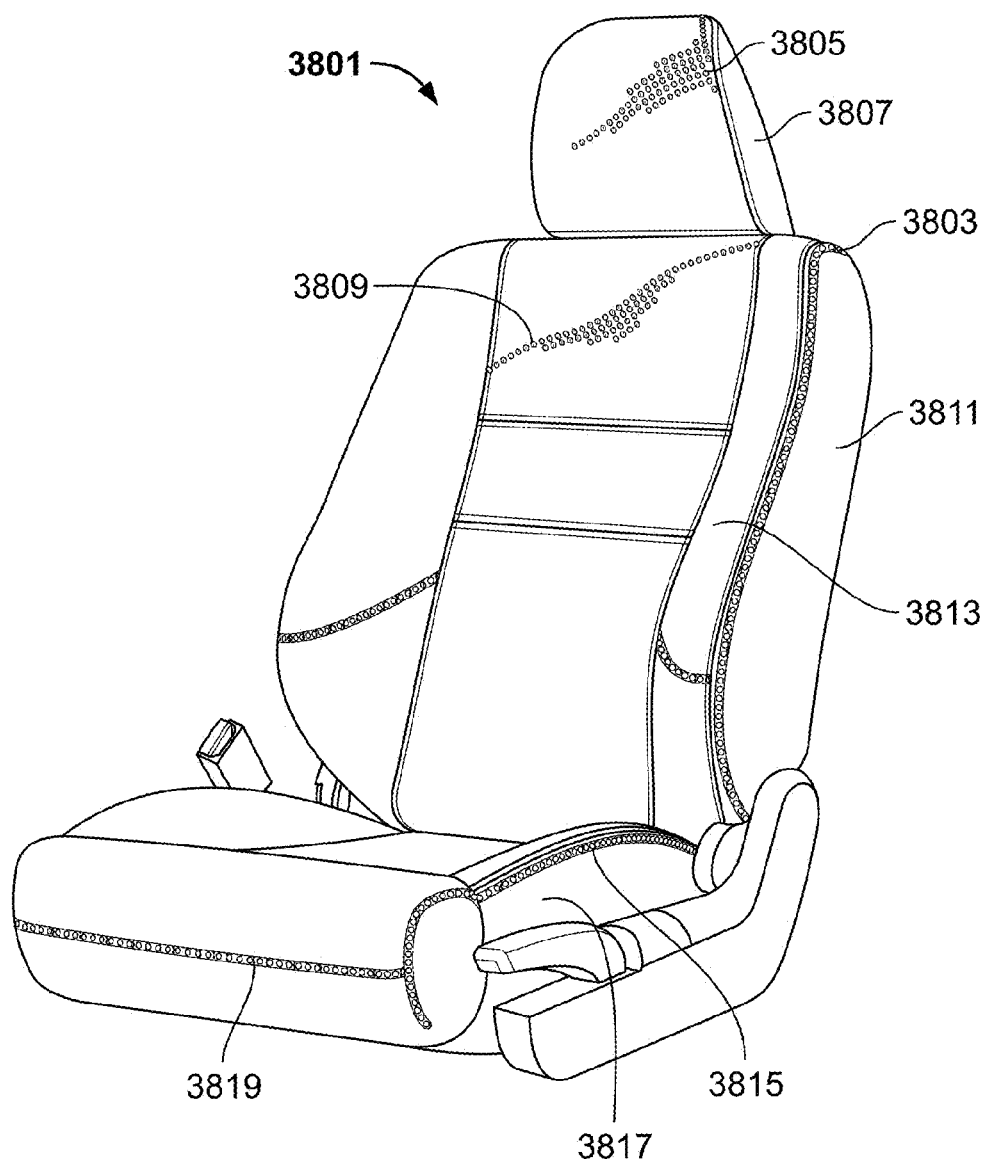
FIG. 38 illustrates an interior lighting application incorporated into a seat liner.
Figure 39:
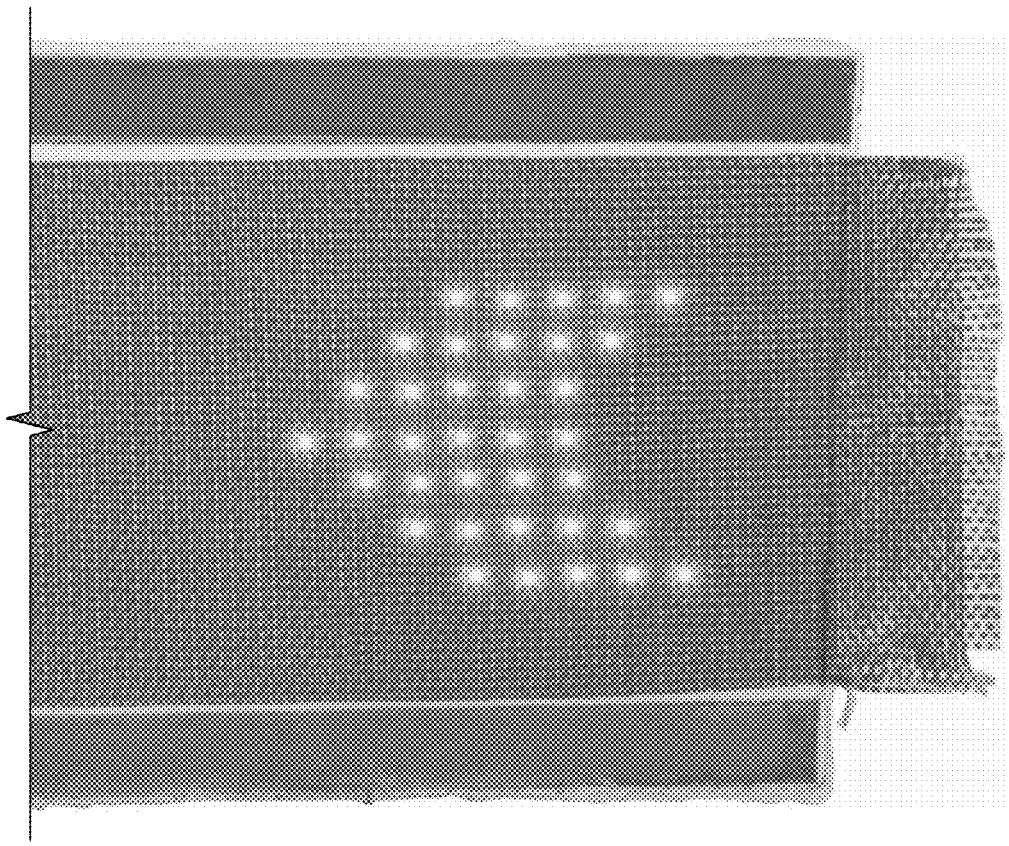
FIG. 39 illustrates a lighting application incorporated into fabric.
Figure 40:
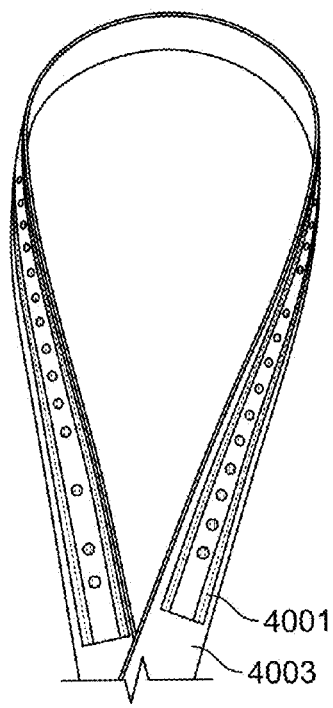
FIG. 40 illustrates a lighting application sewn into a fabric lanyard.

Reference is now made to FIG. 38-FIG. 40, in which FIG. 38 has a graphical representation of light sheet incorporated into seats. The light sheet is woven in (FIG. 39) or sewn into the fabric (FIG. 40) and/or included along a seam (FIG. 38). The edge lighting can be included in seats and headliners.

Referring now to FIG. 38, an interior lighting application incorporated into a seat liner will be discussed and described. In a seat liner 3801 for a seat, edge lighting 3803, 3815, 3819 can be sewn into a seam between plural pieces of fabric 3811, 3813, 3817, for example where piping might be placed in a conventional seat. In the seat liner 3801 for the seat, edge lighting 3805, 3809 can be woven as a design in fabric that is attached to the seat or to a headrest 3807. The edge lighting can be powered or unpowered as discussed above, and when powered can form an eliminated decoration.

Referring now to FIG. 39, a lighting application incorporated into fabric will be discussed and described. FIG. 39 is a black and white photograph illustrating a design woven into fabric. The fabric can be provided as a top substrate which is laminated to a uniform lighting device, and the LEDs can be positioned below the fabric to form the desired design.

Referring now to FIG. 40, a lighting application sewn into a fabric lanyard will be discussed and described. In FIG. 40, a uniform lighting device 4001 was sewn onto a fabric lanyard 4003 using conventional stitches in parallel lengthwise. The lanyard 4003 retained its characteristic flexibility. This demonstrates that fabric onto which a uniform lighting device 4001 is sewn can be used as conventional fabric, although the uniform lighting device sewn thereon provides illumination for functionality and/or decoration.

Finding #12

Light sheet contains fewer parts compared to a traditional light system, which eliminates squeak and rattle issues, either as a component by itself or as incorporated. Furthermore, it is expected that the product will have improved lifetime reliability in comparison to traditional systems due to having fewer parts.

Finding #13

An opaque conductor can be provided, such as copper foil or aluminum foil. Also, the product can be mounted on conductive cloth/fabric or even sewn in, as illustrated for example in FIG. 38-FIG. 40.

Finding #14

Graphene is an optically conductive transparent material which can be used, in addition or as an alternative to previously known conductive transparent materials.

Finding #15

The color range of LEDs included in the light sheet can be anywhere in the IR to UV range.

Finding #16—Cut-To-Fit

This is discussed in connection with FIG. 37.

Example Description—CHMSL and Materials

The following describes some example materials that can be used to create a CHMSL with a homogenous light (sometimes described as a uniform or neon light in appearance).

There can be several variations of the BOM and style using light sheet technology that can be shown to meet the CHMSL FMVSS Regulatory requirements (minimum of 25 cd for HV). Similar variations can be prepared to meet other regulatory requirements.

Note, without enhancement films, the light sheet appearance can be as a point light source. Enhancement films can be used to change this appearance. A variety of options can be offered that change the appearance from a point light source to a homogenous/uniform light source. Some films that can offer this type of appearance are described as follows.

With the proper focal length, elliptical film products have the ability to change point light source(s) to an elliptical shape with various horizontal and vertical light patterns. Based on recent HV measurements, the intensity degradation can be <10%. A uniform light source that can meet FMVSS requirements of >25 cd can be achieved with this type of film. Types of film include light shape diffuser (LSD) with different design angles in the horizontal and vertical directions.

As a general guideline regarding focal lengths, to diffuse the light needed for uniformity, the focal length can be 2 to 2.5 times the die pitch. With an enhancement type film, a focal length of 0.250" to 0.310" can be advisable with a die spacing of 0.125".

Films can be used to provide a unique look when unpowered. For instance, a lighting device can use black and red acrylic overlays. This translucent material can be used to hide the substrate material colors if desired.

Different hot melt colors such as black or red, clear, white can be used for different un-lighted appearance. When white hot melt is used, there is a 25% intensity gain over clear adhesive.

Connection methods: A crimp terminal suitable for flexible substrates can be used.

Connection Sealing: Commonly available over-mold material

The device can connect to buttons mounted on the glass for electrical and mechanical connection.

A transfer tape can be used to mount on, e.g., body panels, interior/exterior of window, plastic/lens housing, etc.

An integrated CHMSL can incorporate a white light for use as a courtesy light, or a back seat map light. This can be accomplished by adding the white light source to the backside of the CHMSL's bottom substrate either by die bonding the LED chips directly to the backside or laminating a separate white part to the backside of the CHMSL.

A CHMSL can be laminated in glass, for example as illustrated in FIG. 46 (discussed above). The light sheet product can be cut into the glass laminate adhesive prior to the autoclave process required to laminate the glass substrates. Alternatively, the LED can be die bonded directly on the conductive layer that is applied on to the inner layers of the two rigid glass substrates. Having the CHMSL embedded in the rear glazing of a vehicle can be a major labor cost savings for the vehicle assembler. Labor costs for CHMSL installation can be reduced as well as build of material costs savings since the rear glass becomes the housing.

In actual CHMSL samples using light sheet, various die types and patterns have been used.

Substrate Width and Homogenous/Point Light Appearance—Variation

The width of the top substrate can be wider than the bottom substrate. Referring now to FIG. 45, varying widths of lighting devices will be discussed and described. FIG. 45 shows a variation in appearance of the light pattern provided by the edge lighting device, from a point light source (least width) from the edge lighting 4531 at the bottom of the figure to a homogenous light pattern (most width) from the edge lighting 4501 at the top of the figure.

In FIG. 45, there are illustrated first to fourth edge lighting devices 4501, 4511, 4521, 4531. Each of the edge lighting devices includes LEDs 4503, 4513, 4523, 4533. Each of the edge lighting devices has a depth D1 to D4 from the first edge (illustrated at the top of the page) generally parallel to the linearly disposed LEDs to the second edge (illustrated at the bottom of the page) from which the edge light is emitted. In this example, D1 is 1.2 inches, D2 is 1.0 inches, D3 is 0.8 inches, and D4 is 0.6 inches. FIG. 45 relates to FIG. 18B, and illustrates that increasing the distance from the row of LEDs to the edge which is lit increases the homogeneous appearance. Here, the light is emitted from the second edge of the edge lighting device 4501, 4511, 4521, 4531 towards the bottom of the page. In the first edge lighting device 4501 (top of FIG. 45) which has the largest depth D1, the edge light will have a homogeneous appearance when the lighting device has a width of 1.2 inches. The homogeneity of the appearance of the edge light decreases as the substrate width D1, D2, D3, D4 decreases. In this example, the fourth edge lighting device 4531 has the least width of 0.6 inches and the edge light will have a point-light source appearance in which the areas in the edge light that are nearest to the position of the LEDs 4533 have a discernibly brighter appearance than the areas in the edge light that are not nearest to the position of the LEDs.

At the top of FIG. 45, there is a large distance D1 from the row of the LEDs to the edge of the first edge lighting device 4501 which will be lit in comparison to the short distance D4 of the fourth edge lighting device 4531. The first edge lighting device 4501 the largest width D1 has a more homogenous appearance, but is dimmer, in comparison to the second, third and fourth edge lighting devices 4511, 4521, 4531. The fourth edge lighting device 4531 will be brighter than the first, second and third edge lighting devices 4501, 4511, 4521 but will have a point light appearance in which individual points of light can be discerned by a viewer.

Etching To Redirect Light

A method or apparatus for redirecting or changing the path of light photons that is created from light sheet technology to the edge or other areas of the device.

Figure 7:
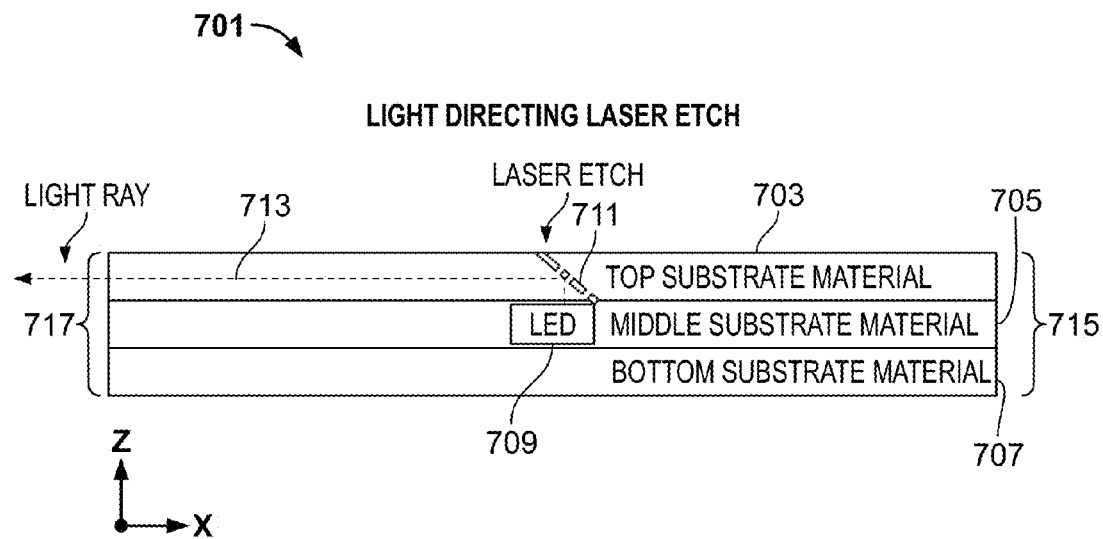
FIG. 7 is a cross sectional view illustrating an etching technique to achieve a light pattern.

Referring now to FIG. 7, a cross sectional view illustrating an etching technique to achieve a light pattern will be discussed and described. FIG. 7 illustrates an edge lighting device 701 that includes a top substrate material 703, a middle substrate material 705, a bottom substrate material 707, and an LED 709 embedded in the middle substrate material. Appropriate materials for the various substrates and the LED are discussed elsewhere herein. In FIG. 7, light photons 713 are emitted from the LED 709 through the top substrate material 703 and are redirected by a laser etch 711 to the edge. Etching and cutting techniques can achieve different light patterns on the edge of the edge lighting device (see FIG. 7) or onto the top surface of the part. FIG. 7 has an example of a diagonal etch 711 in which a laser etched a line obliquely into the top substrate material to provide an orthogonal angle for the photons from the LED 709 toward the second edge 713 from which the light photons are emitted. The diagonal etch 711 redirects the light from the LED 709 in the middle substrate material 705 perpendicularly to the second edge 713 of the edge lighting device 701 in which the substrate is disposed. The first edge 715 is opposite to the second edge and generally can be less emissive of light than the second edge 713.

Multiple axis flexibility without changing light appearance. For example, the part can be bendable so as to flex around, for example, a door panel or a door handle, illustrated for example in FIG. 1 and FIG. 2 respectively. This is illustrated, for example in the door panel and handle in FIG. 1 and FIG. 2 respectively.

Figure 8:
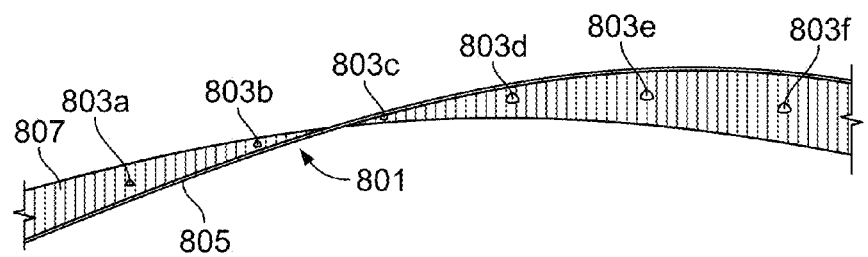
FIG. 8 is a view illustrating a device with a twist.

Thinness (<0.02")—see FIG. 8 illustrating a twisted substrate. Referring now to FIG. 8, a view illustrating a device with a twist will be discussed and described. In FIG. 8, a lighting device 801 shows light coming out of the edge 805. The lighting device can curve naturally. The light sheet in this illustration is twisted and is flexible. The light is emitted from the LEDs 803*a* to 803*f* (collectively, the "light source"), which are visible from the surface 807 of the lighting device 801, the surface 807 being parallel to a main emitting surface of each of the LEDs. The light is emitted from the edge 805 of the lighting device, the edge 805 being perpendicular to the surface 807 that is parallel to the main emitting surface of the LEDs.

Combination of Materials to Alter the Color Output of Light

Figure 42:
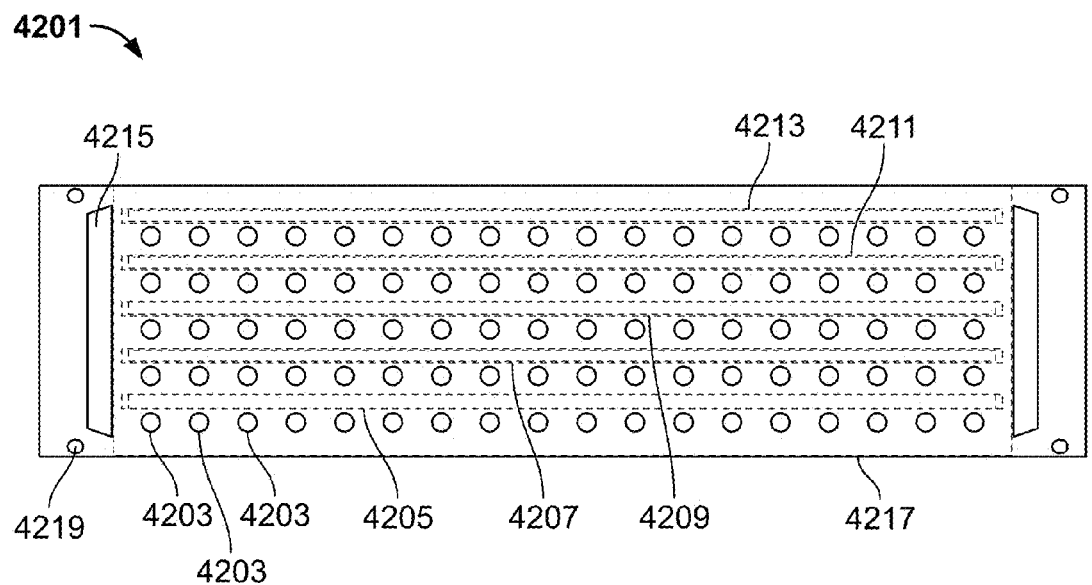
FIG. 42 is a front view of a phosphor subassembly.
Figure 43:
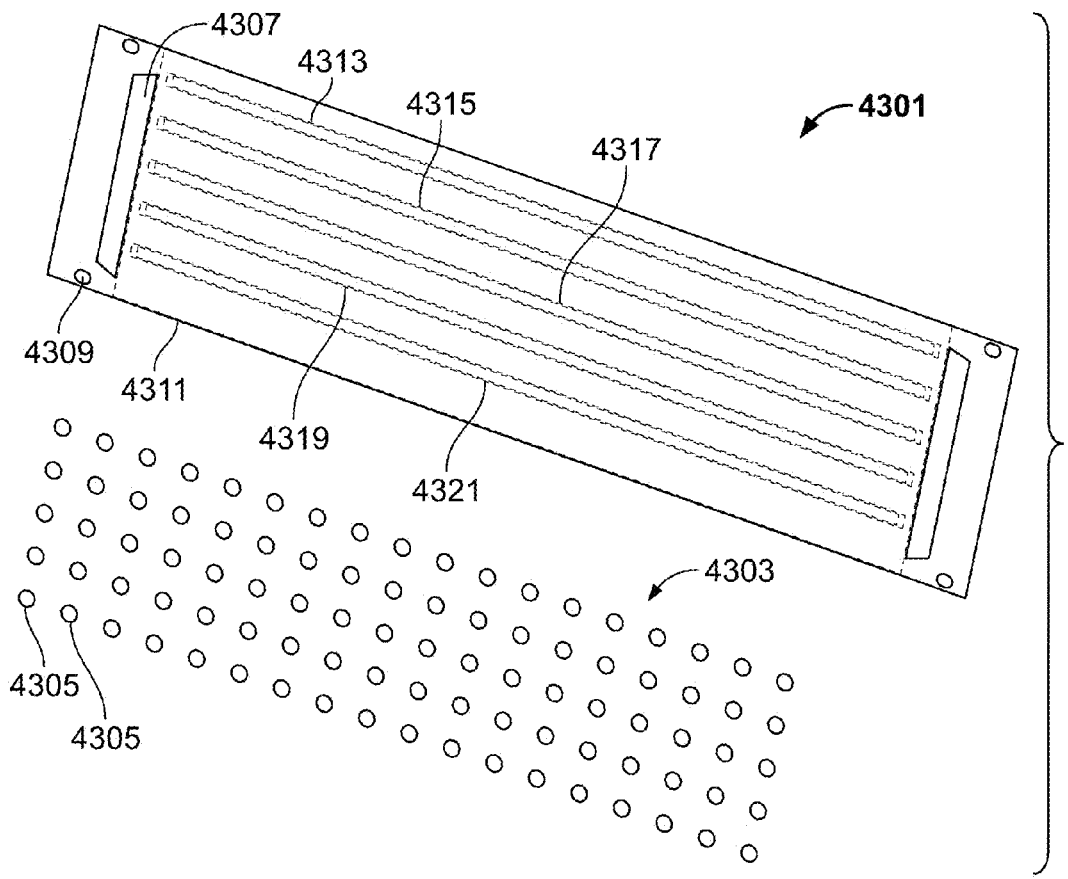
FIG. 43 is a perspective view of a phosphor subassembly.
Figure 44:
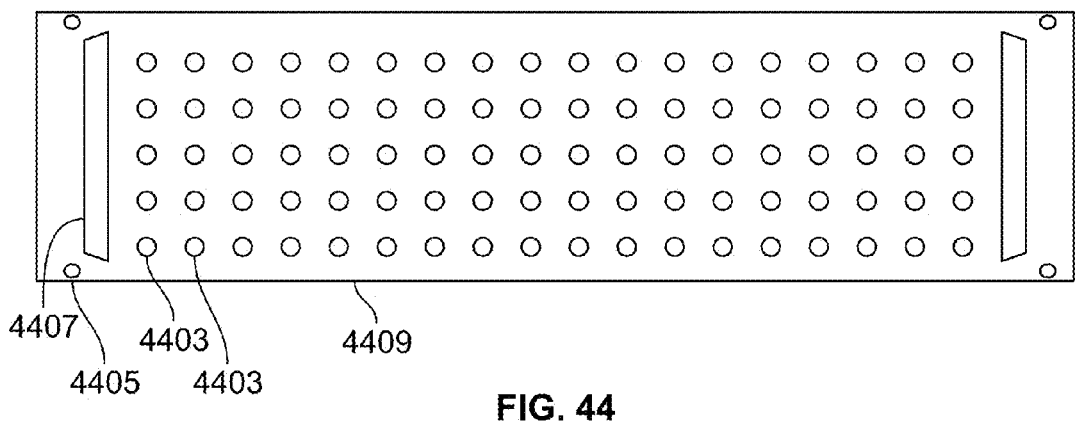
FIG. 44 is a front view illustrating phosphor dot placement of a phosphor subassembly.

FIG. 42 to FIG. 44 provide a front view, perspective view, and phosphor dot placement, collectively, for a phosphor subassembly.

Referring now to FIG. 42, a front view of a phosphor subassembly will be discussed and described. A phosphor top substrate subassembly 4201 can include placement areas in which LED die 4203 are positioned linearly, an electrical bus 4205, 4207, 4209, 4211, 4213, a terminal member 4215, a substrate 4217 on which the LED die are placed, and a connection aperture 4219. Each LED die can be a conventional pre-packaged LED die. The LED die can have a blue color, for example in the blue LED wavelength of 460 to 465 nm. In this illustration, there are provided 18 blue die linearly placed in each strip. Each line of LED die 4203 is associated with one adjacent electrical bus 4205, 4207, 4209, 4209, 4211, 4213, to form the strip. There can be five strips per subassembly, as illustrated. However, the number of LED die 4203 per strip can be increased or decreased, and/or the number of strips per module 4201 can be increased or decreased.

The substrate can be formed of a substrate material such as, for example, a crystal clear, high gloss, heat stabilized polyester film, e.g., 0.007" thick Melinex ST504; a crystal clear unfilled polyethylene naphthalate (PEN) film, such as 0.005" thick Teonex Q65; or the like.

Referring now to FIG. 43, a perspective view of a phosphor subassembly. A phosphor field 4303 will be deposited on a subassembly 4301 (as shown in FIG. 42) to cover some or all of the LED die (FIG. 42, 4203). The phosphor field can be an appropriate shape, such as a round shape, a square shape, a dot shape 4305 as illustrated, or similar, to correspond to and cover the LED die 4203. The phosphor field can have a thickness of 3 mm.

The subassembly 4301 can include a substrate 4311 having therein electrical buses 4313, 4315, 4317, 4319, 4321, a terminal 4307, an aperture 4309, and LED die (not illustrated), as discussed in connection with FIG. 42.

The phosphor field can be placed on the subassembly by deposition. Referring now to FIG. 44, a front view illustrating phosphor dot placement of a phosphor subassembly will be discussed and described. A phosphor field with phosphor dots 4403 can be placed on a non-conductive side of a subassembly 4409 by deposition of a remote phosphor source, to create a phosphor dot module 4401, which has LED die (not illustrated) within the substrate 4009, the LED die covered by phosphor dots 4403, terminals 4407, and apertures 4405. A phosphor dot module 4401 created in this way can be, for example, 10 inches long. Other lengths are possible using the same principals.

The phosphor dot module 4401 can be packaged for shipping by stacking bond paper layers between each phosphor dot module 4401.

Variation—Edge Lighting Device in Seam or Tolerance Space

Figure 9:
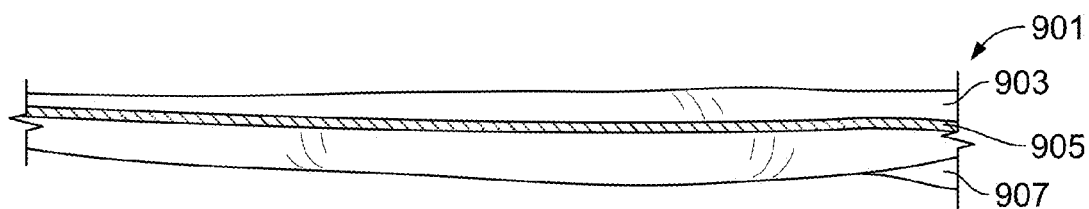
FIG. 9 is a view of an edge lighting device that is powered.
Figure 10:
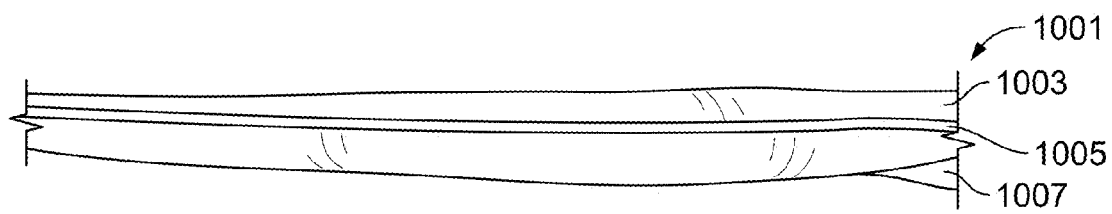
FIG. 10 is a view of the edge lighting device when unpowered.

Referring now to FIG. 9 and FIG. 10, a view of an edge lighting device that is powered and unpowered, respectively, will be discussed and described. Here, the edge lighting device 905, 1005 is sandwiched between two pieces of material 903, 907, 1003, 1007. For example, the edge lighting device 905, 1005 can be sewn into fabric or sandwiched in a tolerance space between two pieces of plastic such as in a door panel or pieces of an instrument panel. FIG. 9 and FIG. 10 are powered and unpowered, respectively, to show how thin the product is. In FIG. 9 and FIG. 10, the edge lighting device is sandwiched between two pieces of plastic as representative of, e.g., a door panel or pieces of an instrument panel. In FIG. 9, the edge lighting device is powered and has a green color (provided by the LEDs as discussed herein). The lighting being emitted from the powered edge lighting device is visually striking in FIG. 9, so that the edge lighting device appears to be a lighting device in FIG. 9 when powered but appears to be a part of the trim as in FIG. 10 when unpowered. As illustrated in FIG. 9, the edge lighting device 905 has a color (indicated by hatching) generated by the LEDs when powered, and does not have the color when the LEDs are unpowered.

Misc. Variations

In addition to one or more of the features and findings discussed above, variations can be directed to one or more of the following, and/or a combination thereof.

Variable Intensity—See Photograph of Samples in Various Figures Contained in this Document A method for preparing the apparatus.

Various Die Characteristics Including Visible and Non-Visible Light Spectrums

Various Die Patterns

Various Die Types

Reflective and Refractive materials. Different light patterns can be achieved using various off the shelf light scattering/enhancement films that cannot be accomplished with current LED technology. Reflective material surfaces can be used to redirect light or increase light intensity.

The light active sheet material can be formed as a lighting system for an automobile or a truck or other conveyance. Also, the LED chips can have red, white, amber, blue, or green colors, or a combination of two or more of the colors. The color of LED chips in the pattern can be disposed in a pattern for use as one or more lighting devices. Such the lighting devices can be, for example, a head light, a rear light, a rear window light, a side window light, a turn signal light, a high mount stop light, a side marker lamp, an under-mount lamp, or an emergency strobe light.

It should be noted that the term conveyance is used herein to indicate something which serves as a means of transportation. Examples of conveyances, as the term is used herein, include automobiles, trucks, buses, other motorized land vehicles such as ride-on lawn mowers, trains, air craft, water craft, heavy machinery used for regulated or non-regulated industries such as agricultural, lawn care, mining, snow blowing, trailers for use with the foregoing, and the like, and variants or evolutions thereof.

An LED chip utilized with the light active material can be organic (OLED) or inorganic (ILED), although testing shows that ILED chips are particularly preferable. Appropriate OLED and ILED chips are readily available from many manufacturers.

Figure 47:
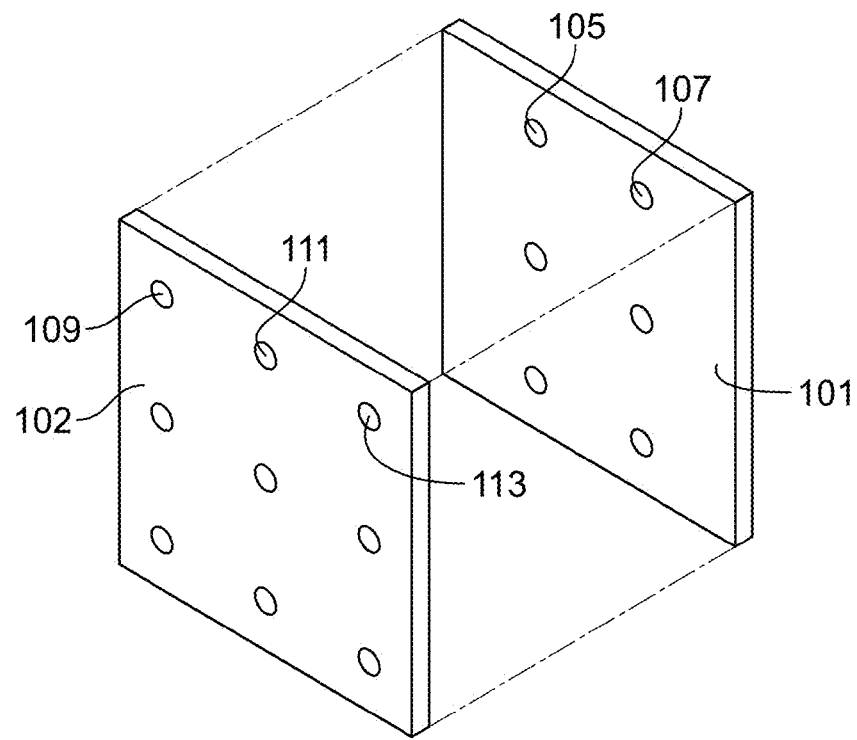
FIG. 47 is a perspective exploded view illustrating related transparent lighting.
Figure 48:
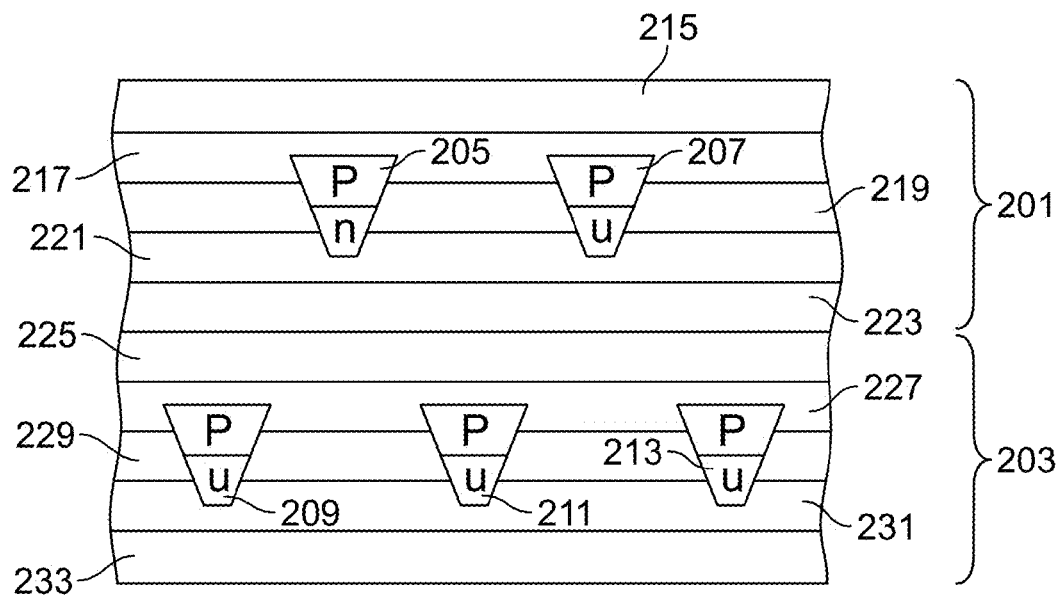
FIG. 48 is a cross sectional diagram corresponding to FIG. 47.

Portions of US 2008/0079012, Grote et al., are now discussed herein for convenience, although the entirety of US 2008/0079012 is incorporated herein by reference. FIGS. 47 and 48 illustrate two sheets of light active sheet material which are stacked. FIG. 47 is an exploded view of the two sheets, and FIG. 48 illustrates layers in the stack of light active sheet materials.

Referring now to FIG. 47, a perspective exploded view illustrating related transparent lighting will be discussed and described. In this figure are illustrated a first transparent light sheet 101, and a second transparent light sheet 103. The first transparent light sheet 101 includes LED chips 105, 107 embedded therein. The second transparent light sheet 103 also includes LED chips 109, 111, 113 embedded therein. The LED chips 105, 107, 109, 111, 113 are integrated in the electronics of the respective light sheets 101, 103 as further described below. The first transparent light sheet 101 can be stacked on top of the second transparent light sheet 103. In this illustration, the LED chips 105, 107 in the first transparent light sheet 101 are offset from the LED chips 109, 111, 113 in the second transparent light sheet 103. Consequently, light emitted from LED chips in one light sheet can travel through the other transparent light sheet, without the light from one light sheet being significantly blocked by LED chips in the other light sheet. This can provide a lighting system wherein the first and second patterns are the same and the first and second light active sheet materials are disposed so that the first and second patterns are offset. The transparency of the light active sheet material can allow several light sheets to be stacked on top of each other in order to provide multi=color displays. Because the light sheets are transparent, the colors show through the stacks of light sheet. The first and second transparent light sheets 101, 103 can be connected to a power source, such as an electrical harness of a conveyance on which the stacked light sheets are mounted, via an electrical connector (not illustrated) to the conductive substrates or conductors which are an integral part of the light active sheet material. The first and second transparent light sheets 101, 103 can be selectively activated together or separately. Accordingly, in the lighting system, the first and second patterns can be separately activated.

Referring now to FIG. 48, a cross sectional diagram corresponding to FIG. 47 will be discussed and described. A first light sheet 201 and a second light sheet 203 are illustrated. The first light sheet 201 includes LED chips 205, 207, a first transparent substrate 215, a first electrically conductive transparent layer 217, a first electrically conductive transparent layer 217, a first adhesive material 219, a second electrically conductive transparent layer 221, and a second transparent substrate 223. The second light sheet 201 includes LED chips 209, 211, 213, a third transparent substrate 225, a third electrically conductive transparent layer 227, a second adhesive material 229, a fourth electrically conductive transparent layer 231, and a fourth transparent substrate 233. In this illustration, the LED chips 205, 207 in the first light sheet 201 are spaced vertically from and offset between the LED chips 209, 211, 213 in the second light sheet 203. Thus, light emitted from the LED chips 209 211, 213 in the second light sheet 203 can pass through the first light sheet 201 with little obstruction by the LED chips 205, 207 in the first light sheet 201. In this illustration, two light sheets 201, 203 are stacked together, so that the transparent substrates 223, 225 face each other. One of the adjacent transparent substrates 223, 225 (referred to as an "intermediate" transparent substrate) can be omitted from the stacked light sheets. The first, second, third, and fourth substrates 215, 223, 225, 233 can be formed of a transparent or translucent material, which can be non-conductive. The material of the second substrate 223 advantageously can be flexible. Appropriate materials for use as the first, second, third and fourth substrates 215, 223, 225, 233 include transparent or translucent plastics, for example, polymers such as, for example, polyethylene terephthalate (PET) and polyethylene. The first, second, third and fourth electrically conductive transparent layers 217, 221, 227, 231 can be formed of an electrically conductive material which is also optically transparent or translucent. An appropriate material is a conducting metal oxide, for example, an indium tin oxide (ITO) film (as illustrated), a carbon nanotube conductive film, an aluminum-doped zinc oxide film, and/or a conductive polymer layer such as PEDOT:PSS (poly(3,4-ethylene-dioxythiophene) poly(styrene-sulfonate)) and/or PEDOT(poly(3, 4-ethylenedioxythiophene)) available from, for example, Afga or H. C. Starck. The electrically conductive transparent layer is not illustrated to scale, and is typically a very thin layer applied to the respective first, second, third or fourth substrate. Each of the LED chips 205, 207, 209, 211, 213 has a p-side and an n-side and/or light-to-energy semiconductor layer particles, wherein the n-side and the p-side correspond to charge donor and charge acceptor layers. The LED chips 205, 207, 209, 211, 213 are oriented to be driven with the same polarity electrical energy. Each of the LED chips 205, 207 in the first light sheet 201 is in electrical contact with both of the first and second electrically conductive transparent layers 217, 221. Similarly, each of the LED chips 209, 211, 213 in the second light sheet 203 is in electrical contact with both of the third and fourth electrically conductive transparent layers 227, 231. Appropriate LED chips are widely available commercially. The LED chips 205, 207, 209, 211, 213 are patterned on the conductors, in a pre-determined (non-random) pattern. For example, a density of the LED chips can be determined according to a desired brightness. As another example, a distribution of the LED chips and/or LED chips of specific colors can be determined according to a desired lighting pattern.

A first adhesive material 219 in the first light sheet 201 is disposed to fill gaps between the patterned LED chips 205, 207 and gaps between the first and second electrically conductive transparent layers 217, 221. The first adhesive material 219 also mechanically holds the LED chips 205, 207, substrates and electrically transparent conductive layers 215, 217, 221, 223 together. The first adhesive material 219 electrically isolates the first electrically conductive transparent layer 218 from the second electrically conductive transparent layer 221, and therefore the first adhesive material can be formed of a non-conductive adhesive material. The second adhesive material 229 in the second light sheet 203 is disposed in a similar manner, but within the second light sheet 203. The second adhesive material also is formed of a non-conductive adhesive material. The first and second adhesive materials 219, 229 further can be transparent or translucent. An appropriate material for use as the first and/or second adhesive materials 219, 229 is a hot melt adhesive, for example an EVA (ethylene vinyl acetate) adhesive, a polyurethane adhesive, a polyolefin adhesive, a polyamide adhesive, or similar material. Accordingly, a lighting system can include a first light active sheet material, a second light active sheet material in continuous contact with the first light active sheet material, and an intermediate transparent substrate disposed between the first and second light active sheet material. The first light active sheet material can include first and second electrically conductive transparent substrates, a first pattern of light emitting diode (LED) chips sandwiched between the first and second electrically conductive transparent substrates, and a first non-conductive transparent adhesive material disposed between the first and second electrically conductive transparent substrates and the LED chips in the first pattern. The second light active sheet material can include third and fourth electrically conductive transparent substrates, a second pattern of LED chips sandwiched between the third and fourth electrically conductive transparent substrates, and a second non-conductive transparent adhesive material disposed between the third and fourth electrically conductive transparent substrates and the LED chips in the second pattern. The LED chips can be preformed before being patterned in the light active sheet material as an unpackaged discrete semiconductor device having an anode p-junction side and a cathode n-junction side, wherein either of the anode and the cathode side is in electrical communication with one of the electrically conductive transparent substrates and the other of the anode and the cathode side is in electrical communication with the other of the electrically conductive transparent substrates.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A light source comprising:
   a first substrate arranged into at least two facing surfaces which form a seam therebetween; and
   a lighting device that includes a plurality of light emitting diode (LED) chips, and two second substrates that have planar first surfaces that face each other and that sandwich and are electrically connected to the plurality of LED chips, the LED chips are embedded in the lighting device in a linear arrangement by a material that mechanically adheres the LED chips to the second substrates at the planar first surfaces and electrically isolates the LED chips from each other, wherein the plurality of LED chips generates light photons;
   the lighting device has a first edge and a second edge opposite to the first edge, the first edge and the second edge have planar second surfaces that face each other, the light photons within the lighting device that are emitted by the plurality of LED chips from a top surface of said LED chips being output from the lighting device at the second edge of the lighting device, the planar second surfaces of the first edge and the second edge are perpendicular to the top surface of said LED chips,
   the lighting device is sandwiched in the seam between the two facing surfaces of the first substrate, the seam is in an opened position, and the second edge of the lighting device is exposed within the seam in the opened position.

2. The light source of claim 1, wherein at least one of the two second substrates is an electrically conductive substrate that sandwiches and electrically connects the plurality of LED chips, the light photons being emitted from the plurality of LED chips through the electrically conductive substrate.

3. The light source of claim 1, wherein the first substrate is a fabric material and the lighting device is exposed as piping in the seam in the opened position.

4. The light source of claim 2, further comprising stitches sewn through the electrically conductive substrate of the lighting device and the first substrate, the stitches attach the two facing surfaces of the first substrate to form the seam.

5. The light source of claim 1, wherein the first substrate is arranged to cover an interior surface of a passenger compartment of a conveyance, and the lighting device is disposed to be electrically connected to an electrical wiring harness of the conveyance.

6. The light source of claim 1, wherein the lighting device is a unitary structure of the two second substrates, the plurality of LED chips, and the material that mechanically adheres the LED chips.

7. The light source of claim 1, wherein the second edge of the lighting device has a width of 5 mm or less, wherein light which is output at the second edge provides an appearance of a substantially continuous ribbon of light having a width of 5 mm or less along the second edge.

8. The light source of claim 1, wherein a path of the light photons within the lighting device that are emitted by the plurality of LED chips from the top surface of said LED chips when the lighting device is electrically powered, is redirected from the first edge of the lighting device back through the lighting device to the second edge of the lighting device, the photons which were redirected from the first edge of the lighting device are transmitted in a path through the second edge of the lighting device and then are output from the lighting device at the second edge of the lighting device.

9. The light source of claim 1, wherein
the lighting device is a transparent light active sheet material,
the two second substrates of the transparent light active sheet material comprise top and bottom electrically conductive transparent substrates, a pattern of the plurality of the LED chips sandwiched between the electrically conductive transparent substrates, and the material that adheres the LED chips is a non-conductive transparent adhesive material disposed between the top and bottom electrically conductive transparent substrates and the plurality of LED chips,
the plurality of LED chips are preformed before being patterned in the light active sheet material as an unpackaged discrete semiconductor device having an anode p-junction side and a cathode n-junction side,
wherein either of the anode and the cathode side is in electrical communication with one of the electrically conductive transparent substrates and the other of the anode and the cathode side is in electrical communication with the other of the electrically conductive transparent substrates.

10. The light source of claim 1, wherein
the plurality of LED chips in the lighting device and the second edge is disposed to be separated by a predetermined distance, to provide a predetermined brightness and diffused appearance on the second edge.

11. The light source of claim 1, wherein
the second edge of the lighting device is disposed linearly along and linearly parallel to the seam.

12. A method of making a light source, comprising:
providing a first substrate arranged into at least two facing surfaces which form a seam therebetween;
providing a lighting device that includes a plurality of light emitting diode (LED) chips, and two second substrates that have planar first surfaces that face each other and that sandwich and are electrically connected to the plurality of LED chips, the LED chips are embedded in the lighting device in a linear arrangement by a material that mechanically adheres the LED chips to the second substrates at the planar first surfaces and electrically isolates the LED chips from each other, wherein the plurality of LED chips generates light photons, wherein the lighting device has a first edge and a second edge opposite to the first edge, the first edge and the second edge have planar second surfaces that face each other, the light photons within the lighting device that are emitted by the plurality of the LED chips from a top surface of said LED chips being output from the lighting device at the second edge of the lighting device, the planar second surfaces of the first edge and the second edge are perpendicular to the top surface of said LED chips;
sandwiching the lighting device in the seam between the two facing surfaces of the first substrate;
arranging the seam into an opened position; and
exposing the second edge of the lighting device within the seam, from between the two facing surfaces of the first substrate that form the seam which is in the opened position.

13. The method of claim 12, wherein at least one of the two second substrates is an electrically conductive substrate that sandwiches and electrically connects the plurality of LED chips,
further comprising electrically powering the lighting device; and
emitting the light photons from the plurality of LED chips through the electrically conductive substrate.

14. The method of claim 12, wherein the first substrate is a fabric material and the lighting device s exposed as piping in the seam in the opened position.

15. The method of claim 13, further comprising, before arranging the seam into the opened position, sewing stitches through the electrically conductive substrate of the lighting device and the first substrate, the stitches attach the two facing surfaces of the first substrate to form the seam.

16. The method of claim 12, further comprising arranging the first substrate to cover an interior surface of a passenger compartment of a conveyance, and disposing the lighting device to be electrically connected to an electrical wiring harness of the conveyance.

17. The method of claim 12, wherein the lighting device is a unitary structure of the two second substrates, the plurality of LED chips, and the material that mechanically adheres the LED chips.

18. The method of claim 12, wherein the second edge of the lighting device has a width of 5 mm or less, wherein light which is output at the second edge provides an appearance of a substantially continuous ribbon of light having a width of 5 mm or less along the second edge.

19. The method of claim 12, wherein a path of the light photons within the lighting device that are emitted by the plurality of LED chips from the top surface of said LED chips when the lighting device is electrically powered, is redirected from the first edge of the lighting device back through the lighting device to the second edge of the lighting device, the photons which were redirected from the first edge of the lighting device being transmitted in a path through the second edge of the lighting device and then being output from the lighting device at the second edge of the lighting device.

20. The method of claim 12, wherein
the lighting device is a transparent light active sheet material,
the two second substrates of the transparent light active sheet material comprise top and bottom electrically conductive transparent substrates, a pattern of the plurality of LED chips sandwiched between the electrically conductive transparent substrates, and the materail that adheres the LED chips is a non-conductive transparent adhesive material disposed between the top and bottom electrically conductive transparent substrates and the plurality of LED chips,
the plurality of LED chips are preformed before being patterned in the light active sheet material as an unpackaged discrete semiconductor device having an anode p-junction side and a cathode n-junction side,
wherein either of the anode and the cathode side is in electrical communication with one of the electrically conductive transparent substrates and the other of the anode and the cathode side is in electrical communication with the other of the electrically conductive transparent substrates.

21. The method of claim 12, wherein
the second edge of the lighting device is disposed linearly along and linearly parallel to the seam.

22. A light source for use in an interior surface of a passenger compartment of a conveyance, comprising:
a lighting device, the lighting device has a plurality of light emitting diode (LED) chips embedded therein, the lighting device further includes an integrated flexible electronic circuit integrated into the lighting device, the lighting device is configured to be mounted on the interior surface of the conveyance, a profile of the lighting device is less than 1 inch, the lighting device comprises a unitary structure of at least first and second substrates sandwiching the plurality of LED chips, a third substrate, the third substrate is arranged to cover the lighting device on the interior surface of the passenger compartment of the conveyance, the third substrate which covers the lighting device is a fabric material comprising interwoven conductors electrically connected to the lighting device, wherein the lighting device is disposed to be electrically connected to an electrical wiring harness of the conveyance.

23. The light source of claim 22, wherein the lighting device is a transparent light active sheet material, the first and second substrates in the transparent light active sheet material comprise top and bottom electrically conductive transparent substrates, a pattern of the plurality of LED chips sandwiched between the electrically conductive transparent substrates, and a non-conductive transparent adhesive material disposed between the top and bottom electrically conductive transparent substrates and the plurality of LED chips, the plurality of LED chips are preformed before being patterned in the light active sheet material as an unpackaged discrete semiconductor device having an anode p-junction side and a cathode n-junction side, wherein either of the anode and the cathode side is in electrical communication with one of the electrically conductive transparent substrates and the other of the anode and the cathode side is in electrical communication with the other of the electrically conductive transparent substrates.

* * * * *